(12) United States Patent
Lieber et al.

(10) Patent No.: US 8,154,002 B2
(45) Date of Patent: Apr. 10, 2012

(54) NANOSCALE WIRE-BASED DATA STORAGE

(75) Inventors: Charles M. Lieber, Lexington, MA (US); Yue Wu, Renens, MA (US); Hao Yan, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 817 days.

(21) Appl. No.: 11/792,444

(22) PCT Filed: Dec. 6, 2005

(86) PCT No.: PCT/US2005/044212
§ 371 (c)(1),
(2), (4) Date: Sep. 19, 2008

(87) PCT Pub. No.: WO2007/044034
PCT Pub. Date: Apr. 19, 2007

(65) Prior Publication Data
US 2009/0095950 A1    Apr. 16, 2009

Related U.S. Application Data

(60) Provisional application No. 60/633,733, filed on Dec. 6, 2004.

(51) Int. Cl.
*H01L 47/00* (2006.01)
(52) U.S. Cl. .............. 257/4; 257/E45.002; 257/E45.003
(58) Field of Classification Search ....... 257/4, E45.002, 257/E45.003
See application file for complete search history.

(56) References Cited

U.S. PATENT DOCUMENTS

| | | |
|---|---|---|
| 3,873,359 A | 3/1975 | Lando |
| 3,873,360 A | 3/1975 | Lando |
| 3,900,614 A | 8/1975 | Lando |
| 4,673,474 A | 6/1987 | Ogawa |

(Continued)

FOREIGN PATENT DOCUMENTS

CN    1110786    10/1995
(Continued)

OTHER PUBLICATIONS

Office Action from U.S. Appl. No. 11/543,352 dated Sep. 12, 2008.
(Continued)

*Primary Examiner* — Matthew Landau
*Assistant Examiner* — Colleen E Snow
(74) *Attorney, Agent, or Firm* — Wolf, Greenfield & Sacks, P.C.

(57) ABSTRACT

The present invention generally relates to nanotechnology and submicroelectronic devices that can be used in circuitry and, in some cases, to nanoscale wires and other nanostructures able to encode data. One aspect of the invention provides a nanoscale wire or other nanostructure having a region that is electrically-polarizable, for example, a nanoscale wire may comprise a core and an electrically-polarizable shell. In some cases, the electrically-polarizable region is able to retain its polarization state in the absence of an external electric field. All, or only a portion, of the electricallypolarizable region may be polarized, for example, to encode one or more bits of data. In one set of embodiments, the electrically-polarizable region comprises a functional oxide or a ferroelectric oxide material, for example, $BaTiO_3$, lead zirconium titanate, or the like. In some embodiments, the nanoscale wire (or other nanostructure) may further comprise other materials, for example, a separation region separating the electrically polarizable region from other regions of the nanoscale wire. For example, in a nanoscale wire, one or more intermediate shells may separate the core from the electrically polarizable shell.

70 Claims, 25 Drawing Sheets

U.S. PATENT DOCUMENTS

| | | |
|---|---|---|
| 4,939,556 A | 7/1990 | Eguchi et al. |
| 5,023,139 A | 6/1991 | Birnboim et al. |
| 5,089,545 A | 2/1992 | Pol |
| 5,252,835 A | 10/1993 | Lieber et al. |
| 5,274,602 A | 12/1993 | Glenn |
| 5,453,970 A | 9/1995 | Rust et al. |
| 5,475,341 A | 12/1995 | Reed |
| 5,512,131 A | 4/1996 | Kumar et al. |
| 5,524,092 A | 6/1996 | Park |
| 5,537,075 A | 7/1996 | Miyazaki |
| 5,539,214 A | 7/1996 | Lynch et al. |
| 5,581,091 A | 12/1996 | Moskovits et al. |
| 5,589,692 A | 12/1996 | Reed |
| 5,607,876 A | 3/1997 | Biegelsen et al. |
| 5,620,850 A | 4/1997 | Bamdad et al. |
| 5,640,343 A | 6/1997 | Gallagher et al. |
| 5,726,524 A | 3/1998 | Debe |
| 5,739,057 A | 4/1998 | Tiwari et al. |
| 5,747,180 A | 5/1998 | Miller et al. |
| 5,751,156 A | 5/1998 | Muller et al. |
| 5,776,748 A | 7/1998 | Singhvi et al. |
| 5,824,470 A | 10/1998 | Baldeschwieler et al. |
| 5,830,538 A | 11/1998 | Gates et al. |
| 5,840,435 A | 11/1998 | Lieber et al. |
| 5,847,565 A | 12/1998 | Narayanan |
| 5,858,862 A | 1/1999 | Westwater et al. |
| 5,864,823 A | 1/1999 | Levitan |
| 5,866,434 A | 2/1999 | Massey et al. |
| 5,897,945 A | 4/1999 | Lieber et al. |
| 5,900,160 A | 5/1999 | Whitesides et al. |
| 5,903,010 A | 5/1999 | Flory et al. |
| 5,908,692 A | 6/1999 | Hamers et al. |
| 5,916,642 A | 6/1999 | Chang |
| 5,932,903 A * | 8/1999 | Miyamoto .................... 257/295 |
| 5,942,443 A | 8/1999 | Parce et al. |
| 5,997,832 A | 12/1999 | Lieber et al. |
| 6,004,444 A | 12/1999 | Aksay et al. |
| 6,036,774 A | 3/2000 | Lieber et al. |
| 6,038,060 A | 3/2000 | Crowley |
| 6,060,121 A | 5/2000 | Hidber et al. |
| 6,060,724 A | 5/2000 | Flory et al. |
| 6,069,380 A | 5/2000 | Chou et al. |
| 6,123,819 A | 9/2000 | Peeters |
| 6,128,214 A | 10/2000 | Kuekes et al. |
| 6,143,184 A | 11/2000 | Martin et al. |
| 6,149,819 A | 11/2000 | Martin et al. |
| 6,159,742 A | 12/2000 | Lieber et al. |
| 6,180,239 B1 | 1/2001 | Whitesides et al. |
| 6,187,165 B1 | 2/2001 | Chien et al. |
| 6,190,634 B1 | 2/2001 | Lieber et al. |
| 6,203,864 B1 | 3/2001 | Zhang et al. |
| 6,207,392 B1 | 3/2001 | Weiss et al. |
| 6,211,464 B1 | 4/2001 | Mochizuki et al. |
| 6,231,744 B1 | 5/2001 | Ying et al. |
| 6,256,767 B1 | 7/2001 | Kuekes et al. |
| 6,270,074 B1 | 8/2001 | Rasmussen et al. |
| 6,278,231 B1 | 8/2001 | Iwasaki et al. |
| 6,286,226 B1 | 9/2001 | Jin |
| 6,287,765 B1 | 9/2001 | Cubicciotti |
| 6,314,019 B1 | 11/2001 | Kuekes et al. |
| 6,325,904 B1 | 12/2001 | Peeters |
| 6,340,822 B1 | 1/2002 | Brown et al. |
| 6,346,189 B1 | 2/2002 | Dai et al. |
| 6,355,198 B1 | 3/2002 | Kim et al. |
| 6,359,288 B1 | 3/2002 | Ying et al. |
| 6,437,329 B1 | 8/2002 | Yedur et al. |
| 6,440,637 B1 | 8/2002 | Choi et al. |
| 6,451,113 B1 | 9/2002 | Givargizov |
| 6,459,095 B1 | 10/2002 | Heath et al. |
| 6,465,132 B1 | 10/2002 | Jin |
| 6,468,657 B1 | 10/2002 | Hou et al. |
| 6,468,677 B1 | 10/2002 | Benton et al. |
| 6,503,375 B1 | 1/2003 | Maydan et al. |
| 6,528,020 B1 | 3/2003 | Dai et al. |
| 6,538,367 B1 | 3/2003 | Choi et al. |
| 6,559,468 B1 | 5/2003 | Kuekes et al. |
| 6,586,095 B2 | 7/2003 | Wang et al. |
| 6,628,053 B1 | 9/2003 | Den et al. |
| 6,716,409 B2 | 4/2004 | Hafner et al. |
| 6,741,019 B1 | 5/2004 | Filas et al. |
| 6,743,408 B2 | 6/2004 | Lieber et al. |
| 6,756,025 B2 | 6/2004 | Colbert et al. |
| 6,756,795 B2 | 6/2004 | Hunt et al. |
| 6,762,056 B1 | 7/2004 | Peeters |
| 6,781,166 B2 | 8/2004 | Lieber et al. |
| 6,803,840 B2 | 10/2004 | Hunt et al. |
| 6,808,746 B1 | 10/2004 | Dai et al. |
| 6,815,706 B2 | 11/2004 | Li et al. |
| 6,846,565 B2 | 1/2005 | Korgel et al. |
| 6,872,645 B2 | 3/2005 | Duan et al. |
| 6,882,051 B2 | 4/2005 | Majumdar et al. |
| 6,882,767 B2 | 4/2005 | Yang et al. |
| 6,902,720 B2 | 6/2005 | McGimpsey |
| 6,946,197 B2 | 9/2005 | Yadav et al. |
| 6,958,216 B2 | 10/2005 | Kelley et al. |
| 6,962,823 B2 | 11/2005 | Empedocles et al. |
| 6,974,706 B1 | 12/2005 | Melker et al. |
| 6,996,147 B2 | 2/2006 | Majumdar et al. |
| 7,048,903 B2 | 5/2006 | Colbert et al. |
| 7,129,554 B2 | 10/2006 | Lieber et al. |
| 7,172,953 B2 | 2/2007 | Lieber et al. |
| 7,211,464 B2 | 5/2007 | Lieber et |
| 7,335,908 B2 | 2/2008 | Samuelson et al. |
| 7,385,267 B2 | 6/2008 | Lieber et al. |
| 7,399,691 B2 | 7/2008 | Lieber et al. |
| 2001/0054709 A1 | 12/2001 | Heath et al. |
| 2002/0013031 A1 | 1/2002 | Chen et al. |
| 2002/0040805 A1 | 4/2002 | Swager |
| 2002/0055239 A1 | 5/2002 | Tuominen et al. |
| 2002/0084502 A1 | 7/2002 | Jang et al. |
| 2002/0086335 A1 | 7/2002 | Massey et al. |
| 2002/0112814 A1 | 8/2002 | Hafner et al. |
| 2002/0117659 A1 | 8/2002 | Lieber et al. |
| 2002/0122766 A1 | 9/2002 | Lieber et al. |
| 2002/0130311 A1 | 9/2002 | Lieber et al. |
| 2002/0130353 A1 | 9/2002 | Lieber et al. |
| 2002/0146714 A1 | 10/2002 | Lieber et al. |
| 2002/0158342 A1 | 10/2002 | Tuominen et al. |
| 2002/0172820 A1 | 11/2002 | Majumdar et al. |
| 2002/0175408 A1 | 11/2002 | Majumdar et al. |
| 2002/0179434 A1 | 12/2002 | Dai et al. |
| 2002/0187504 A1 | 12/2002 | Reich et al. |
| 2003/0001091 A1 | 1/2003 | Nakayama et al. |
| 2003/0003300 A1 | 1/2003 | Korgel et al. |
| 2003/0032892 A1 | 2/2003 | Erlach et al. |
| 2003/0048619 A1 | 3/2003 | Kaler et al. |
| 2003/0073071 A1 | 4/2003 | Fritz et al. |
| 2003/0089899 A1 | 5/2003 | Lieber et al. |
| 2003/0098488 A1 | 5/2003 | O'Keeffe et al. |
| 2003/0113713 A1 | 6/2003 | Glezer et al. |
| 2003/0113940 A1 | 6/2003 | Erlanger et al. |
| 2003/0121764 A1 | 7/2003 | Yang et al. |
| 2003/0124509 A1 | 7/2003 | Kenis et al. |
| 2003/0124717 A1 | 7/2003 | Awano et al. |
| 2003/0134267 A1 | 7/2003 | Kang et al. |
| 2003/0134433 A1 | 7/2003 | Gabriel et al. |
| 2003/0135971 A1 | 7/2003 | Liberman et al. |
| 2003/0156992 A1 | 8/2003 | Anderson et al. |
| 2003/0186522 A1 | 10/2003 | Duan |
| 2003/0186544 A1 | 10/2003 | Matsui et al. |
| 2003/0189202 A1 | 10/2003 | Li et al. |
| 2003/0197456 A1 | 10/2003 | Den et al. |
| 2003/0200521 A1 | 10/2003 | DeHon et al. |
| 2004/0005723 A1 | 1/2004 | Empedocles et al. |
| 2004/0026684 A1 | 2/2004 | Empedocles |
| 2004/0067530 A1 | 4/2004 | Gruner |
| 2004/0075464 A1 | 4/2004 | Samuelson et al. |
| 2004/0095658 A1 | 5/2004 | Buretea et al. |
| 2004/0106203 A1 | 6/2004 | Stasiak et al. |
| 2004/0112964 A1 | 6/2004 | Empedocles et al. |
| 2004/0113138 A1 | 6/2004 | DeHon et al. |
| 2004/0113139 A1 | 6/2004 | DeHon et al. |
| 2004/0118448 A1 | 6/2004 | Scher et al. |
| 2004/0136866 A1 | 7/2004 | Pontis et al. |
| 2004/0146560 A1 | 7/2004 | Whiteford et al. |
| 2004/0157414 A1 | 8/2004 | Gole et al. |

| | | | |
|---|---|---|---|
| 2004/0188721 A1 | 9/2004 | Lieber et al. | |
| 2004/0213307 A1 | 10/2004 | Lieber et al. | |
| 2005/0037374 A1 | 2/2005 | Melker et al. | |
| 2005/0064185 A1 | 3/2005 | Buretea et al. | |
| 2005/0064731 A1 | 3/2005 | Park et al. | |
| 2005/0066883 A1 | 3/2005 | Dubrow et al. | |
| 2005/0072213 A1 | 4/2005 | Besnard et al. | |
| 2005/0079533 A1 | 4/2005 | Samuelson et al. | |
| 2005/0079659 A1 | 4/2005 | Duan et al. | |
| 2005/0100960 A1 | 5/2005 | Dai et al. | |
| 2005/0101026 A1 | 5/2005 | Sailor et al. | |
| 2005/0109989 A1 | 5/2005 | Whiteford et al. | |
| 2005/0110064 A1 | 5/2005 | Duan et al. | |
| 2005/0117441 A1 | 6/2005 | Lieber et al. | |
| 2005/0161662 A1 | 7/2005 | Majumdar et al. | |
| 2005/0181587 A1 | 8/2005 | Duan et al. | |
| 2005/0201149 A1 | 9/2005 | Duan et al. | |
| 2005/0202615 A1 | 9/2005 | Duan et al. | |
| 2005/0212079 A1 | 9/2005 | Stumbo et al. | |
| 2005/0214967 A1 | 9/2005 | Scher et al. | |
| 2005/0219788 A1 | 10/2005 | Chow et al. | |
| 2005/0230356 A1 | 10/2005 | Empedocles et al. | |
| 2005/0253137 A1 | 11/2005 | Whang et al. | |
| 2005/0266662 A1 | 12/2005 | Yi | |
| 2005/0287717 A1 | 12/2005 | Heald et al. | |
| 2006/0008942 A1 | 1/2006 | Romano et al. | |
| 2006/0009003 A1 | 1/2006 | Romano et al. | |
| 2006/0019472 A1 | 1/2006 | Pan et al. | |
| 2006/0054936 A1 | 3/2006 | Lieber et al. | |
| 2006/0057360 A1 | 3/2006 | Samuelson et al. | |
| 2006/0175601 A1 | 8/2006 | Lieber et al. | |
| 2006/0237749 A1 | 10/2006 | Lieber et al. | |
| 2006/0269927 A1 | 11/2006 | Lieber et al. | |
| 2007/0026645 A1 | 2/2007 | Lieber et al. | |
| 2007/0032023 A1 | 2/2007 | Lieber et al. | |
| 2007/0032051 A1 | 2/2007 | Lieber et al. | |
| 2007/0032052 A1 | 2/2007 | Lieber et al. | |
| 2007/0048492 A1 | 3/2007 | Lieber et al. | |
| 2007/0158766 A1 | 7/2007 | Lieber et al. | |
| 2007/0252136 A1 | 11/2007 | Lieber et al. | |
| 2007/0281156 A1 | 12/2007 | Lieber et al. | |
| 2008/0106846 A1* | 5/2008 | Drab et al. ............ 361/305 | |
| 2008/0191196 A1 | 8/2008 | Lu et al. | |
| 2009/0004852 A1 | 1/2009 | Lieber et al. | |

FOREIGN PATENT DOCUMENTS

| | | |
|---|---|---|
| EP | 1 087 413 A2 | 3/2001 |
| EP | 1170799 | 1/2002 |
| JP | 09-191104 | 7/1997 |
| JP | 11-11917 A2 | 1/1999 |
| JP | 2000-31462 A | 1/2000 |
| JP | 2001/281965 | 10/2001 |
| WO | WO 91/06036 A1 | 5/1991 |
| WO | WO 95/02709 A2 | 1/1995 |
| WO | WO 96/29629 A2 | 9/1996 |
| WO | WO 97/32571 | 9/1997 |
| WO | WO 97/33737 A1 | 9/1997 |
| WO | WO 97/34025 A1 | 9/1997 |
| WO | WO 97/34140 | 9/1997 |
| WO | WO 98/39250 A1 | 9/1998 |
| WO | WO 98/42620 A1 | 10/1998 |
| WO | WO 98/48456 A1 | 10/1998 |
| WO | WO 99/24823 | 5/1999 |
| WO | WO 99/63347 A2 | 12/1999 |
| WO | WO 00/09443 A1 | 2/2000 |
| WO | WO 00/17101 A1 | 3/2000 |
| WO | WO 00/19494 A1 | 4/2000 |
| WO | WO 00/29617 A3 | 5/2000 |
| WO | WO 00/51186 A2 | 8/2000 |
| WO | WO 01/03208 A1 | 1/2001 |
| WO | WO 01/44796 | 6/2001 |
| WO | WO 02/17362 A2 | 2/2002 |
| WO | WO 02/31183 A1 | 4/2002 |
| WO | WO 02/48701 A2 | 6/2002 |
| WO | WO 02/080280 A1 | 10/2002 |
| WO | WO 02/086480 A1 | 10/2002 |
| WO | WO 03/005450 A2 | 1/2003 |
| WO | WO 03/016901 A1 | 2/2003 |
| WO | WO 03/053851 A2 | 7/2003 |
| WO | WO 03/054931 A1 | 7/2003 |
| WO | WO 03/063208 A2 | 7/2003 |
| WO | WO 2004/003535 A1 | 1/2004 |
| WO | WO 2004/010552 A1 | 1/2004 |
| WO | WO 2004/032190 A2 | 4/2004 |
| WO | WO 2004/032193 A2 | 4/2004 |
| WO | WO 2004/034025 A2 | 4/2004 |
| WO | WO 2004/038767 A2 | 5/2004 |
| WO | WO 2005/114282 A2 | 2/2005 |
| WO | WO 2005/089165 A2 | 9/2005 |
| WO | WO 2005/093831 A1 | 10/2005 |
| WO | WO 2005/094440 A2 | 10/2005 |
| WO | WO 2005/119753 A2 | 12/2005 |
| WO | WO 2006/107312 | 10/2006 |
| WO | WO 2006/132659 | 12/2006 |
| WO | WO 2007/044034 | 4/2007 |
| WO | WO 2007/145701 A2 | 12/2007 |
| WO | WO 2008/027078 A2 | 3/2008 |
| WO | WO 2008/033303 A2 | 3/2008 |
| WO | WO 2008/123869 A2 | 10/2008 |
| WO | WO 2008/127314 A2 | 10/2008 |

OTHER PUBLICATIONS

Office Action from U.S. Appl. No. 11/543,746 dated Sep. 8, 2008.
Office Action from U.S. Appl. No. 11/543,336 dated Jun. 18, 2008.
Office Action from U.S. Appl. No. 11/543,353 dated Oct. 6, 2008.
Office Action from U.S. Appl. No. 11/543,326 dated Oct. 14, 2008.
International Search Report and Written Opinion from PCT Application PCT/US2007/013700 dated May 29, 2008.
International Search Report and Written Opinion from PCT Application PCT/US2007/019669 dated Jan. 24, 2008.
International Search Report and Written Opinion from PCT Application PCT/US2007/024222 dated Oct. 10, 2008.
International Search Report and Written Opinion from PCT Application PCT/US2007/024126 dated Sep. 26, 2008.
Patolsky, Fernando et al. "Nanowire-Based Biosensors" Analytical Chemistry, Jul. 1, 2006, pp. 4261-4269.
Shi, Y. et al. "Long Si Nanowires With Millimeter-Scale Length by Modified Thermal Evaporation From Si Powder" Appl. Phys. A 80, 1733-1736 (2005).
Wang, D. et al. "Rational Growth of Branched and Hyperbranched Nanowire Structures" Nano Letters, 2004, vol. 4, No. 5, pp. 871-874.
Wu, et al., "Germanium/carbon core-sheath nanostructures," Applied Physics Letters, vol. 77, No. 1, pp. 43-45 (2000).
Yu, J. et al. "One-Dimensional Silicon Nanostructures Fabricated by Thermal Evaporation" Materials Science & Engineering C26 (2006), pp. 800-804.
Zhang, Y.F. et al. "Bulk-Quantity Si Nanowires Synthesized by SiO Sublimation" Journal of Crystal Growth, 212 (2000) pp. 115-118.
Agarwal, et al., "Lasing in Single Cadmium Sulfide Nanowire Optical Cavities," Nano-Lett, 5(5):917-920 (2005).
Chen, "Noncovalent functionalization of carbon nanotubes for highly specific electronic biosensors," PNAS, 100(9):4984-4989 (2003).
Chen, J., et al., "Large On-Off Ratios and Negative Differential Resistance in a Molecular Electronic Device," Science, 286: 1550-51 (1999).
Cheung, C.L., et al., "Diameter Controlled Synthesis of Carbon Nanotubes," J. Phys. Chem B, 106, (2002), pp. 2429-2433.
Choi, "Enhancement of Ferroelectricity in Strained $BaTiO_3$ Thin Films," Science, 306: 1005-1009 (2004).
Chung, et al., "Silicon nanowire devices", Appl Phys Lett, 76(15): 2068-2070 (2000).
Collier, C.P., et al., "Electronically Configurable Molecular-Based Logic Gates", Science, vol. 285, Jul. 16, 1999, pp. 391-394.
Cui et al., "Nanowire nanosensors for highly sensitive and selective detection of biological and chemical species", Science, Aug. 17, 2001, vol. 293, pp. 1289-1292.
Cui, Yi, et al. "Doping and Electrical Transport in Silicon Nanowires", The Journal of Physical Chemistry, vol. 104, No. 22, Jun. 8, 2000, pp. 5213-5216.
Cui, Yi, et al., "Diameter-controlled synthesis of single-crystal silicon nanowires", Applied Physics Letters, vol. 78, No. 15, Apr. 9, 2001, pp. 2214-2216.

Cui, Yu, et al., "Functional Nanoscale Electronic Devices Assembled Using Silicon Nanowire Building Blocks", *Science*, vol. 291, Feb. 2, 2001, pp. 851-853.

Duan, "Synthesis and optical properties of gallium arsenide nanowires," *Apl Phys Lett*, 76(9):1116-1118 (2000).

Duan, X., et al., "High-performance thin-film transistors using semiconductor nanowires and nanoribbons", *Nature*, 425: 274-278 (2003).

Duan, X., et al., "Nonvolatile Memory and Programmable Logic from Molecule-Gated Nanowires," *Nano Letters*, 2(5), (2002), pp. 487-490.

Duan, X., et al., "Single-nanowire electrically driven lasers," *Nature*, 421, (2003), pp. 241-245.

Duan, Xiangfeng, et al., "General Synthesis of Compound Semiconductor Nanowires", *Adv. Materials. 2000*, 12, No. 4, pp. 298-302, published on Web Feb. 17, 2000.

Duan, Xiangfeng, et al., "Indium phosphide nanowires as building blocks for nanoscale electronic and optoelectronic devices", *Nature*, vol. 409, Jan. 4, 2001, pp. 66-69.

Duan, Xiangfeng, et al., "Laser-Assisted Catalytic Growth of Single Crystal GaN Nanowires", *J. Am. Chem. Soc. 2000*, 122, Oct. 18, 1999, pp. 188-189; published on Web Dec. 18, 1999.

Esfarjani, K., et al., "Electronic and transport properties of N-P doped nanotubes", *Appl Phy Lett*, 74(1): 79-81 (1999).

Friedman, "High-speed integrated nanowire circuits," *Nature*, 434: 1085 (2005).

Givargizov, E.I., et al., "Fundamental Aspects of VLS Growth," *J. Crystal Growth*, 31, (1975), pp. 20-30.

Gradecak, "GaN nanowire lasers with low lasing thresholds," *Apl Phys Lett*, (87): 173111-173111-3 (2005).

Gudiksen et al., "Growth of nanowire superlattice structures for nanoscale photonics and electronics", *Nature*, 2002, vol. 415, pp. 617-620.

Gudiksen, M.S., et al., "Size-Dependent Photoluminescence from Single Indium Phosphide Nanowires," *J. Phys. Chem. B*, 106, (2002), pp. 4036-4039.

Gudiksen, M.S., et al., "Synthetic Control of the Diameter and Length of Single Crystal Semiconductor Nanowires," *J. Phys. Chem. B*, 105, (2001), pp. 4062-4064.

Gudiksen, Mark S., et al. "Diameter-Selective Synthesis of Semiconductor Nanowires", *J. Am. Chem. Soc. 2000*, 122, Jun. 6, 2000, pp. 8801-8802.

Guo, et al., "Nanoscale Silicon Field Effect Transistors Fabricated Using Imprint Lithography," *Appl Phys Lett*, 71(13):1881-1883; (1997).

Guo, L., et al., "A Silicon Single-Electron Transistor Memory Operating at Room Temperature," *Science*, 275: 649-651 (1997).

Hahm, "Direct Ultrasensitive Electrical Detection of DNA and DNA Sequence Variations Using nanowire Nano sensors," *Nano-Lett*, 4(1): 51-54 (2003).

Haraguchi et al, "Polarization dependence of light emitted from GaAs p-n junctions in quantum wire crystals", *Journal of Applied Physics*, Apr. 1994, vol. 75, No. 8, pp. 4220-4225.

Haraguchi, et al., "GaAs *p-n* junction formed in quantum wire crystals", *Appl Phys Lett*, 60: 745-747 (1992).

Heath, "A liquid solution synthesis of single crystal germanium quantum wires," *Chem Phys Lett*, 208(3,4):263-265 (1993).

Hiruma, "GaAs free-standing quantum-size wires," *J Apl Phys*, 74(5):3162-3171 (1993).

Hiruma, K., et al., "Self-organized growth of GaAs/InAs heterostructure nanocylinders by organometallic vapor phase epitaxy," *J. Crystal Growth*, 163, (1996), pp. 226-231.

Holmes, et al., Control of Thickness and Orientation of Solution-Grown Silicon Nanowires, Science, 287, (2000), pp. 1471-1473.

Hsu, S.T., et al. "Mfmox Ferroelectric Memory Transistor," Non-Volatile Memory Technology Symposium, Orlando, Fl, Nov. 15-17, 2004, p. 24-27.

Hu, J "Serpentine Superlattice nanowire-Array Lasers," *Quant Elec*, 31(8): 1380-1388 (1995).

Hu, J., et al., "Chemistry and Physics in One Dimension: Synthesis and Properties of Nanowires and Nanotubes,"*Acc. Chem. Res.*, 32, (1999), pp. 435-445.

Hu, J., et al., "Controlled growth and electrical properties of heterojunctions of carbon nanotubes and silicon nanowires," *Nature*, 399, (1999), pp. 48-51.

Hu, S.-Y., "Serpentine Superlattice Nanowire-Array Lasers,"*J. Quant. Electron*., 31(8), (1995), pp. 1380-1388.

Huang, et al., "Logic Gates and Computation from Assembled Nanowire Building Blocks", *Science*, 294: 1313-1317 (2001).

Huang, M., et al., "Room-Temperature Ultraviolet Nanowire Nanolasers," *Science*, 292, (2001), pp. 1897-1898.

Huang, Y., et al., "Gallium Nitride Nanowire Nanodevices," *Nano Letters*, 2(2), (2002), pp. 101-104.

Huang, Yu, et al., "Directed Assembly of One-dimensional Nanostructures into Functional Networks", *Science*, vol. 291, Jan. 26, 2001, pp. 630-633.

"IBM creates highest performing nanotube transistors", IBM News, 2002.

Javey, A., Ballistic Carbon Nanotube Field-Effect Transistors, *Nature*, 424:654-657 (2003).

Jin, "Scalable Interconnection and Integration of Nanowire Devices without Registration," *Nano-Lett*, 4(5):915-919 (2004).

Johnson, J.C., et al., "Single gallium nitride nanowire lasers," *Nature Materials*, 1, (2002), pp. 106-110.

Johnson, J.C., et al., "Single Nanowire Lasers," *J. Phys. Chem*., 105(46), (2001), pp. 11387-11390.

Joselevich, E., et al., "Vectorial Growth of Metallic and Semiconducting Single-Wall Carbon Nanotubes," *Nano Letters*, 2(10), (2002), pp. 1137-1141.

Kanjanachuchai et al., "Coulomb blockade in strained-Si nanowires on leaky virtual substrates", *Semiconductor Science and Technology*, 2001, vol. 16, pp. 72-76.

Kong et al. "Nanotube molecular wires as chemical sensors", *Science*, Jan. 28, 2000, vol. 287, pp. 622-625.

Kong, J., et al., "Chemical vapor deposition of methane for single-walled carbon nanotubes," *Chem. Physics Letters*, 292, (1998), pp. 567-574.

Kong, J., et al., "Synthesis of individual single-walled carbon natubes on patterned silicon wafers," *Nature*, 395, (1998), pp: 878-881.

Lahoun et al., "Epitaxial core-shell and core-multishell nanowire heterostructures", *Nature*, 2002, vol. 420, pp. 57-61.

Lahoun, L.J. et al., "Semiconductor nanowire heterostructures," 2004, *Phil. Trans. R. Soc. Lond*., 362: 1247-1260 (2004).

Law, "Nanoribbon Waveguides for Subwavelength Photonics Integration," *Science*, 305 (27):1269-1273 (2004).

Leff, "Thermodynamic Control of Gold Nanocrystal Size: Experiment and Theory,"*J Phys Chem*, 99:7036-7041 (1995).

Lei, "Nanowire transistors with ferroelectric gate dielectrics: Enhanced performance and memory effects," *Apl Phys Lett*, 84(22):4553-4555 (2004).

Lieber, "Nanoscale Science and Technology: Building a Big Future from Small Things," *MRS Bull*, www.mrs.org/publications/bulletin (2003).

Lieber, "Nanowire Superlattices," *Nanoletters*, 2(2):81-82 (2002).

Lu, W. et al., "One-dimensional hole gas in germanium/silicon nanowire heterostructures," PNAS, 102:10046-10051 (2005).

Martel, R., et al., "Single- and multi-wall carbon nanotube field-effect transistors," *Apl Phys Lett*, 73(17), (1998), pp. 2447-2449.

McAlpine, "High-Performance Nanowire Electronics and Photonics and Nanoscale Patterning on Flexible Plastic Substrates," *Proc IEEE*, 93(7):1357-1363 (2005).

McAlpine, M. "High-Performance Nanowire Electronics and Photonics on Glass and Plastic Substrates", *Nano Letters*, 3(11):1531-1535 (2003).

McAlpine, M., "Nanoimprint Lithography for Hybrid Plastic Electronics", *Nano-Letters*, 3(4): 443-445 (2003).

Menon, "Fabrication and Evaluation of Nanoelectrode Ensembles," *Anal Chem*, 67(13):1920-1928 (1995).

Mizutani, T., "Fabrication and Characterization of Carbon Nanotube FETs," Quantum Sensing and Nanophotonic Devices II, M. Flazeghi, G.J. Brown, Ed., Proc SPIE, vol. 5732, p. 28-36.

Morales, et al., "A Laser Ablation Method for the Synthesis of Crystalline Semiconductor Nanowires", Science, 279: 208-211 (1998).

Musin, R. N., "Structural and Electronic Properties of Epitaxial Core-Shell Nanowire Heterostructures," *Phys. Rev. B*, 71:155318.

Nosho, Y., "n-type Carbon Nanotube Field-Effect Transistors Fabricated by Using Ca Contact Electrodes," Appl. Phys. Lett., 86:73105.
Padeste, et al., "Modular amperometric immunosensor devices", 1995, *8th International Conference on Solid-State Sensors an Actuators and Eurosensors IX*, 357(C7): 487-490 (1995).
Patolsky, "Electrical detection of single viruses," *PNAS*, 101(39): 14017-14022 (2004).
Patolsky, "Nanowire nanosensors," *Mat Today*, 1369(7021): 20-28 (2005).
Pavesi, "Optical gain in silicon nanocrystals," *Nature*, 408:440-444 (2000).
Qi, "Toward Large Arrays of Multiplex Functionalized Carbon Nanotube Sensors for Highly Sensitive and Selective Molecular Detection," *Nano-Lett*, 3(3):347-351 (2003).
Rueckes, T., et al., "Carbon Nanotube-Based Nonvolatile Random Access Memory for Molecular Computing," *Science*, 298, (2000), pp. 94-97.
Star et al., "Preparation and properties of polymer-wrapped single-walled carbon nanotubes", *Angew. Chem. Int.*, 2001, vol. 40, No. 9, pp. 1721-1725.
Takayama, S., et al., "Patterning cells and their environments using multiple laminar fluid flows in capillary networks", *Proc. Natl. Acad. Sci.*, 96: 5545-5548 (1999).
Tans, et al., "Room-temperature transistor based on a single carbon nanotube", *Nature*, 393: 49-52 (1998).
Thess, A., et al., "Cyrstalline Ropes of Metallic Carbon Nanotubes," *Science*, 273, (1996), pp. 483-487.
Tiefenauer, et al., "Towards Amperometric Immunosensor Devices" *Biosensors and Bioelectronics*, 12(3): 213-223 (1997).
Tong, "Subwavelength-diameter silica wires for low-loss optical wave guiding," *Nature*, 426(18):816-819 (2003).
Urban, "Single-Crystalling Barium Titanate Nanowires," *Adv Mat*, 15(5):423-426 (2003).
Vossmeyer, T. et al., "Combinatorial approaches toward patterning nanocrystals," Journal of Applied Physics, 1998, 84(7):3664-3670.
Wang et al., "Highly polarized photoluminescence and photodetection from single indium phosphide nanowires", *Science*, 2001, vol. 293, pp. 1455-1457.
Wang, "Label-free detection of small-molecule-protein interactions by using nanowire nanosensors," *PNAS*, 102(9):3208-3212 (2005).
Wang, N., et al., "$SiO_2$-enhanced synthesis of Si nanowires by laser ablation," *App. Physics Letters*, 73(26), (1998), pp. 3902-3904.
Wei, Q., et al., "Synthesis of Single Crystal Bismuth-Telluride and Lead-Telluride Nanowires for New Thermoelectric Materials," *Mat. Res. Soc. Symp. Proc.*, 581, (2000), pp. 219-223.
Whang, "Large-Scale Hierarchical Organization of Nanowire Arrays for Integrated Nanosystems," *Nano-Lett*, 3(9):1255-1259 (2003).
Whang, "Nanolithographys Using Hierarchically Assembled Nanowire Masks," *Nano-Lett*, 3(7):951-954 (2003).
Wolf, et al., "Silicon Processing for the VLSI ERA", *Lattice Press*, 1:12-13 (2000).
Wong, S., et al., "Covalently funtionalized nanotubes as nanometre-sized probes in chemistry and biology," *Nature*, 394, (1998), pp. 52-55.
Wu et al., "Block-by-block growth of single-crystalline Si/SiGe superlattice nanowires", web release date, Jan. 19, 2002, http://pubs.acs.org/hotartcl/nalefd/2002/n10156888_rev.html.
Wu, "Controlled Growth and Structures of Molecular-Scale Silicon Nanowires," *Nano-Lett*, 4(3):433-436 (2004).
Wu, "Single-crystal metallic nanowires and metal/semiconductor nanowire heterostructures," *Nature*, 430:61-65 (2004).
Xiang, "Ge/Si nanowire heterostructures as high-performance field-effect transistors," *Nature*, 441:489-493 (2006).
Yamada, Y., "Analysis of submicron carbon nanotube field-effect transistors", *Appl Phys Lett*, 76:(5): 628-630 (2000).
Yang, "Wires on water," *Nature*, 425:243-244 (2003).
Yang, P. et al., "Controlled Growth of ZnO Nanowires and Their Optical Properties," *Adv. Funct. Matter*, 12(5), (2002), pp. 323-331.
Yu, et al., "Nanoscale silicon wires synthesized using simple physical evaporation", *Appl Phys Lett*, 72 (26): 3458-3460 (1998).
Yun, W.S., et al., "Ferroelectric Properties of Individual Barium Titanate Nanowires Investigated by Scanned Probe microscopy," *Nano Letters*, vol. 2, No. 5, p. 447-450 (2002).
Zheng, "Multiplexed electrical detection of cancer markers with nanowire sensor arrays," *Nature Biotech*, 23(10):1294-1301 (2005).
Zheng, "Synthesis and Fabrication of High-Performance n-Type Silicon Nanowire Transistors," *Adv Matt*, 16(21):1890-1893 (2004).
Zhong, "Coherent Single Charge Transport in Molecular-Scale Silicon Nanowires," *Nano-Lett*, 5(6):1143-1146 (2005).
Zhong, "Nanowire Crossbar Arrays as Address Decoders for Integrated Nanosystems," *Science*, 302:1377-1379 (2003).
Zhong, "Synthesis of p-Type Gallium Nitride Nanowires for Electronic and Photonic Nanodevices," *Nano-Lett*, 3(3):343-346 (2003).
Zhou, G., et al., "Growth morphology and micro-structural aspects of Si nanowires synthesized by laser ablation," *J. of Crystal Growth*, 197, (1999), pp. 129-135.
International Preliminary Exam. Report from Int. Apl. No. PCT/US01/48230, filed Dec. 11, 2001.
International Preliminary Exam. Report from Int. Apl. No. PCT/US2005/020974, filed Jun. 15, 2005.
International Search Report from Int. Apl. No. PCT/US01/48230, filed Dec. 11, 2001.
International Search Report from Int. Apl. No. PCT/US02/16133, field May 20, 20021.
International Search Report from Int. Apl. No. PCT/US03/22061, filed Jul. 16, 2003.
International Search Report from Int. Apl. No. PCT/US03/22753, filed Jul. 21, 2003.
International Search Report from Int. Apl. No. PCT/US2005/004459, filed Feb. 14, 2005.
International Search Report from Int. Apl. No. PCT/US2005/020974, filed Jun. 15, 2005.
International Search Report from Int. Apl. No. PCT/US2005/026759, filed Jul. 28, 2005.
International Search Report from Int. Apl. No. PCT/US2005/034345, filed Nov. 21, 2005.
Invitation to Pay Addition Fees from Int. Apl. No. PCT/US2005/044212, filed Dec. 6, 2005.
Office Action mailed Jan. 3, 2005 in U.S. Appl. No. 10/196,337, filed Jul. 16, 2002.
Office Action mailed Jan. 15, 2003 in U.S. Appl. No. 10/020,004, filed Dec. 11, 2001.
Office Action mailed Feb. 23, 2006 in U.S. Appl. No. 10/196,337, filed Jul. 16, 2002.
Office Action mailed Mar. 11, 2005 in U.S. Appl. No. 09/935,776, filed Aug. 22, 2001.
Office Action mailed Mar. 14, 2005 in U.S. Appl. No. 10/020,004, filed Dec. 11, 2001.
Office Action mailed Apr. 7, 2006 in U.S. Appl. No. 10/734,086, filed Dec. 11, 2003.
Office Action mailed Apr. 23, 2007 in U.S. Appl. No. 11/582,167, filed Oct. 17, 2006.
Office Action mailed May 16, 2006 in U.S. Appl. No. 09/935,776, filed Aug. 22, 2001.
Office Action mailed May 25, 2005 in U.S. Appl. No. 10/196,337, filed Jul. 16, 2002.
Office Action mailed Jun. 25, 2004 in U.S. Appl. No. 10/020,004, filed Dec. 11, 2001.
Office Action mailed Jun. 30, 2004 in U.S. Appl. No. 10/196,337, filed Jul. 16, 2002.
Office Action mailed Aug. 30, 2005 in U.S. Appl. No. 09/935,776, filed Aug. 22, 2001.
Office Action mailed Aug. 30, 2005 in U.S. Appl. No. 10/020,004, filed Dec. 11, 2001.
Office Action mailed Sep. 2, 2003 in U.S. Appl. No. 09/935,776, filed Aug. 22, 2001.
Office Action mailed Sep. 15, 2004 in U.S. Appl. No. 09/935,776, filed Aug. 22, 2001.
Office Action mailed Oct. 27, 2006 in U.S. Appl. No. 10/734,086, filed Dec. 11, 2003.
Office Action mailed Nov. 2, 2006 in U.S. Appl. No. 10/196,337, filed Jul. 16, 2002.
Office Action mailed Nov. 29, 2005 in U.S. Appl. No. 10/995,075, filed Nov. 22, 2004.
Office Action mailed Dec. 20, 2006 in U.S. Appl. No. 11/012,549, filed Dec. 15, 2004.

Written Opinion from Int. Apl. No. PCT/US01/48230, filed Dec. 11, 2001.

Written Opinion from Int. Apl. No. PCT/US2005/004459, filed Feb. 14, 2005.

Written Opinion from Int. Apl. No. PCT/US2005/020974, filed Jun. 15, 2005.

Written Opinion from Int. Apl. No. PCT/US2005/026759, filed Jul. 28, 2005.

Written Opinion from Int. Apl. No. PCT/US2005/034345, filed Nov. 21, 2005.

Balavoine, F. et al., "Helical Crystallization of Proteins on Carbon Nanotubes: A First Step towards the Development of New Biosensors," *Angew. Chem. Int. Ed.*, vol. 38, No. 13/14, pp. 1912-1915 (1999).

Fagan, S. et al., "*Ab initio* calculations for a hypothetical material: Silicon nanotubes," *Physical Review B*, vol. 61, No. 15, pp. 9994-9996 (2000).

Jensen, K. et al. "Kinetics for Hybridization of Peptide Nucleic Acids (PNA) with DNA and RNA Studied with the BIAcore Technique," *Biochemistry*, vol. 36, No. 16, pp. 5072-5077 (1997).

Li, C.Z. et al., "Fabrication of stable metallic nanowires with quantized conductance," *Nanotechnology*, vol. 10, pp. 221-223 (1999).

Li, Z. et al., "Sequence-Specific Label-Free DNA Sensors Based on Silicon Nanowires," *Nano Letters*, vol. 4, No. 2, pp. 245-247 (2004).

Patolsky, F. et al., "Nanowire sensors for medicine and the life sciences," *Nanomedicine*, vol. 1, No. 1, pp. 51-65 (2006).

Soh, H. et al., "Integrated nanotube circuits: Controlled growth and ohmic contacting of single-walled carbon nanotubes," *Applied Physics Letters*, vol. 75, No. 5, pp. 627-629 (1999).

Tang, Y.H. et al., "Si nanowires synthesized by laser ablation of mixed SiC and SiO2 powders," *Chemical Physics Letters*, vol. 314, pp. 16-20 (1999).

Office Action mailed Aug. 7, 2006 in U.S. Appl. No. 11/082,372, filed Mar. 17, 2005.

Office Action mailed Mar. 18, 2008 in U.S. Appl. No. 11/543,337, filed Oct. 4, 2006.

International Search Report and Written Opinion from Int. Apl. No. PCT/US2007/008540, filed Jun. 4, 2007.

International Search Report dated Apr. 24, 2007 in PCT/US2005/044212.

\* cited by examiner

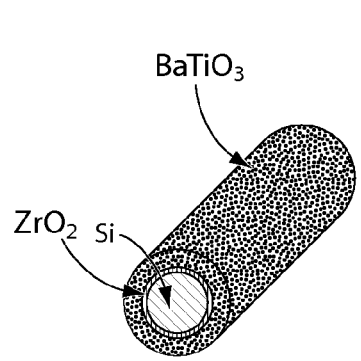
Fig. 1a
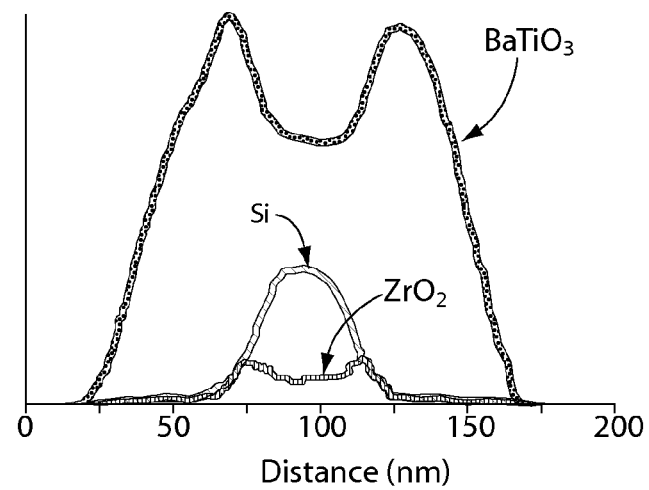
Fig. 1b
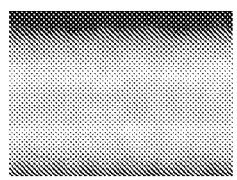 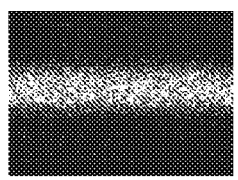 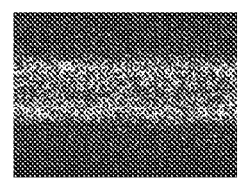 
Fig. 1c    Fig. 1d    Fig. 1e    Fig. 1f
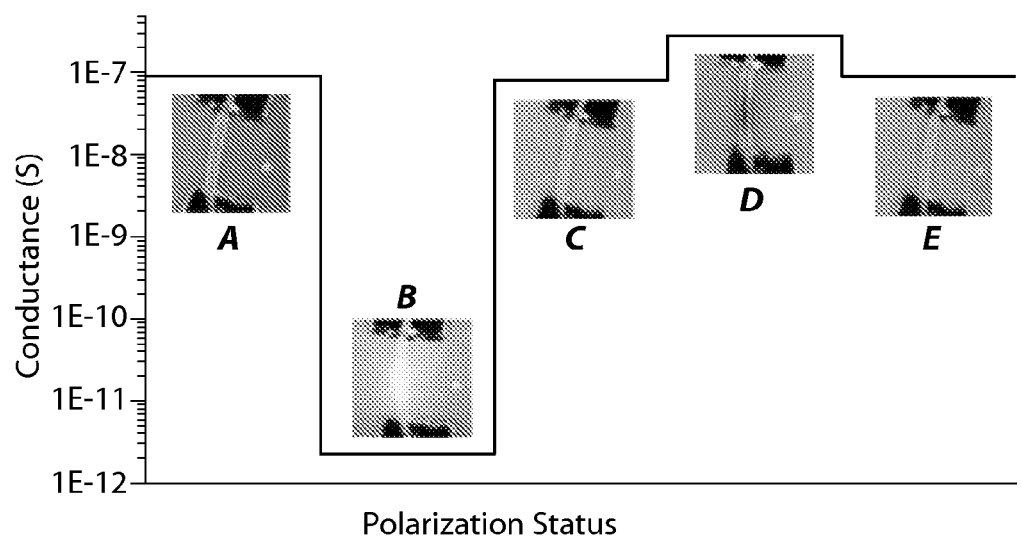
Fig. 2

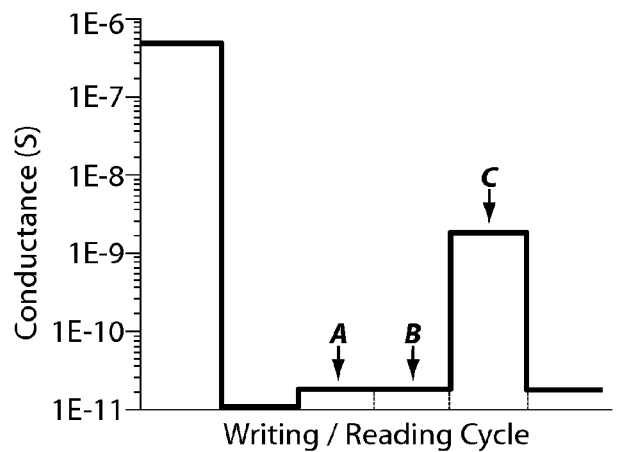
Fig. 3d
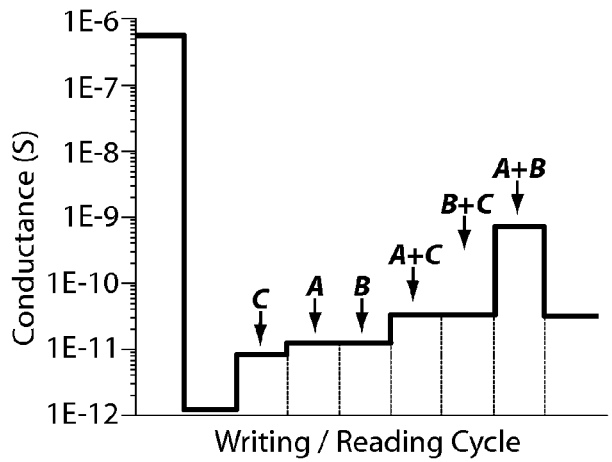
Fig. 3e
| | A | B | C | Conductance |
|---|---|---|---|---|
| Write | 0 | 0 | 1 | Low |
| Read | 1 | 0 | 0 | Low |
| Read | 0 | 1 | 0 | Low |
| Read | 0 | 0 | 1 | High |
| Write | 1 | 1 | 0 | Low |
| Read | 0 | 0 | 1 | Low |
| Read | 1 | 0 | 0 | Low |
| Read | 0 | 1 | 0 | Low |
| Read | 1 | 0 | 1 | Low |
| Read | 0 | 1 | 1 | Low |
| Read | 1 | 1 | 0 | High |
Fig. 3f
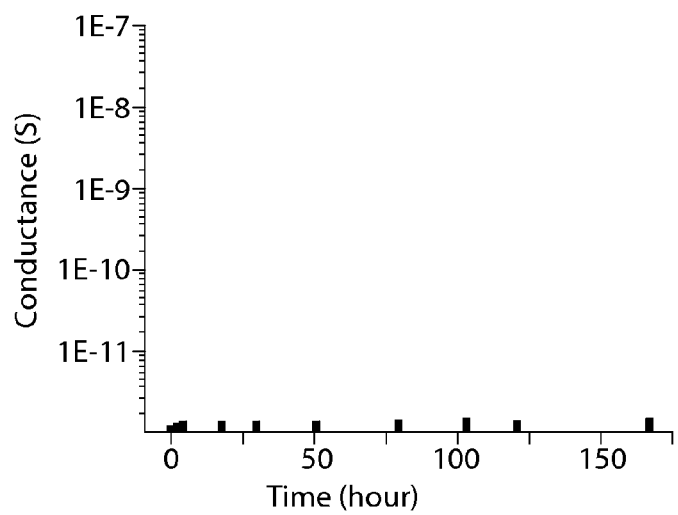
Fig. 3g

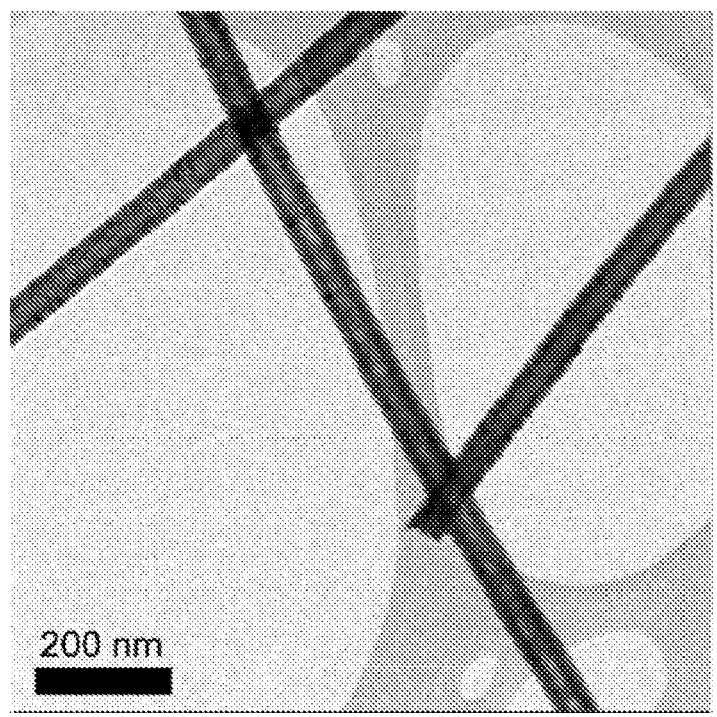
Fig. 9a
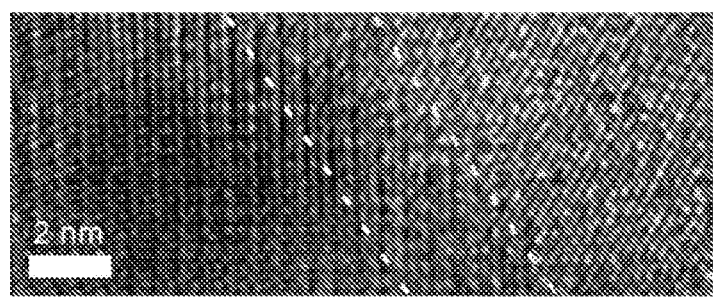
Fig. 9b
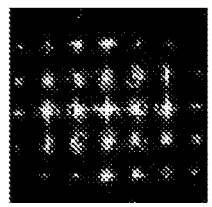 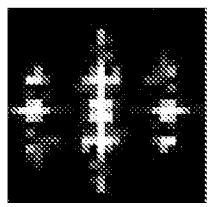 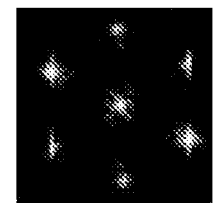
Fig. 9c  Fig. 9d  Fig. 9e

NANOSCALE WIRE-BASED DATA STORAGE

RELATED APPLICATIONS

This application is a U.S. National Stage Application of PCT/US2005/044212, filed Dec. 6, 2005, entitled "Nanoscale Wire-Based Data Storage," by Lieber, et al. which claims the benefit of U.S. Provisional Patent Application Ser. No. 60/633,733, filed Dec. 6, 2004, entitled "Nanoscale Wire Based Data Storage," by Lieber, et al., which is incorporated herein by reference.

FEDERALLY SPONSORED RESEARCH

Various aspects of the present invention were sponsored by the Office of Naval Research, Grant Nos. N-00014-01-1-0651 and N00014-04-1-0591. The U.S. Government has certain rights in the invention.

FIELD OF INVENTION

The present invention generally relates to nanotechnology and sub-microelectronic devices that can be used in circuitry and, in particular, to nanoscale wires and other nanostructures able to encode data.

BACKGROUND

Interest in nanotechnology, in particular sub-microelectronic technologies such as semiconductor quantum dots and nanowires, has been motivated by the challenges of chemistry and physics at the nanoscale, and by the prospect of utilizing these structures in electronic, optical, and related devices. While nanoscopic articles might be well-suited for transport of charge carriers and excitons (e.g. electrons, electron-hole pairs, electron pairs, etc.) and thus may be useful as building blocks in nanoscale electronics, optics, and other applications, much of nanotechnology and nanoelectronics is not well-developed. Thus there is a need in the art for new and improved articles and techniques involving nanoscale devices.

SUMMARY OF THE INVENTION

The present invention generally relates to nanoscale wires and other nanostructures, including those able to encode data. The subject matter of the present invention involves, in some cases, interrelated products, alternative solutions to a particular problem, and/or a plurality of different uses of one or more systems and/or articles.

In one aspect, the invention provides an electronic data storage device. According to one set of embodiments, the device includes a first electrode, a second electrode, a semiconductive material defining an electrical pathway between the first and second electrodes, and a material proximate the semiconductive material, switchable between at least a first polarization state and a second polarization state. In one embodiment, the semiconductive material is switchable between a first conductive state and a second conductive state in response to the first or second polarization states of the ferroelectric material, respectively, providing conductivity between the first and second electrodes, respectively, of a first conductivity and a second conductivity at least 1000 times the first conductivity.

The electronic data storage device, in another set of embodiments, includes a first electrode, a second electrode, and a semiconductive material defining an electrical pathway between the first and second electrodes. In one embodiment, the semiconductive material includes at least a first switch region and a second switch region along the electrical pathway, each of the first and second switch regions separately and independently switchable between a first conductive state and a second conductive state, which second state provides conductivity along the electrical pathway in the respective region at least 1000 times that of first state in the respective region.

In yet another set of embodiments, the electronic data storage device includes a semiconductive data storage element having an off state, and an on state providing electrical conductivity at least 1000 times that of the off state. The data storage element may have a write voltage able to switch the element from the on state to the off state and/or vice versa, and a read voltage through which the state of the element can be determined. In certain embodiments, the read and write voltages differ by no more than 1 or 2 V.

The invention, according to another aspect, is an article. In one set of embodiments, the article includes a first electrode, a second electrode, a semiconductive material defining an electrical pathway between the first and second electrodes, and at least two control terminals, each in electrical communication with the semiconductive material along the electrical pathway between the first and second electrodes.

The article, in another set of embodiments, includes a nanoscale wire comprising an electrically-polarizable region. The electrically-polarizable region, in one embodiment, is able to retain its polarization state in the absence of an electric field. The article, according to still another set of embodiments, includes a nanoscale wire comprising a core and a shell at least partially surrounding the core. In one embodiment, the core is semiconductive or conductive. In some cases, the shell includes a ferroelectric oxide material.

In yet another set of embodiments, the article includes a device comprising an array of nonvolatile memory elements. The article, in one embodiment, includes a plurality of memory elements each comprising a nanoscale wire comprising a transistor architecture. In still another set of embodiments, the article includes a nanoscale wire comprising a core and at least two shells, where each shell surrounding at least a portion of the core. The nanoscale wire comprises a ferroelectric oxide material in one embodiment. In another set of embodiments, the article includes a nanoscale wire comprising a transistor architecture. The nanoscale wire comprises a ferroelectric oxide material, in at least one embodiment. In yet another set of embodiments, the article includes a nanoscale wire comprising a core and a shell, where the nanoscale wire comprises Ba. The article, in still another set of embodiments, includes a nanoscale wire comprising a core and at least two shells, where at least one of the shells has a dielectric constant of at least about 15.

In one set of embodiments, the article comprises a nanoscale wire encoding more than one bit of data. According to another set of embodiments, the article includes a nanoscale wire comprising a region encoding a bit of data, where the region is not defined by the position of a second, movable nanoscale wire.

The article includes a device comprising an array of memory elements in one set of embodiments, each having an area of less than about 20 $nm^2$/bit. According to yet another set of embodiments, the article includes a memory element having a reading voltage of less than about 1 $V_{absolute}$ at an on/off current differential ratio of at least 1000. The article, in still another set of embodiments, includes a memory element having a writing voltage of less than about 1 $V_{absolute}$ at an on/off current differential ratio of at least 1000. In yet another set of embodiments, the article includes a memory element having a read/write voltage ratio of less than about 1:1.5 at an on/off current differential ratio of at least 1000. The article includes a memory element having a first stable state having a first conductivity and a second stable state having a second conductivity, in still another set of embodiments, where the first conductivity is at least 1000 times greater than the second conductivity.

In yet another aspect, the invention provides a method. The method, in one set of embodiments, includes an act of polarizing, in a nanoscale wire comprising a core and a shell, at least a portion of the shell.

One set of embodiments provides a method comprising acts of encoding a first bit of data on a nanoscale wire, and encoding a second bit of data on the nanoscale wire without substantially altering the first bit of data. In another set of embodiments, the method includes acts of reading a first bit of data from a nanoscale wire, and reading a second bit of data, independent of the first bit, from the nanoscale wire. The method, in yet another sets of embodiments, includes an act of encoding at least one bit of data in an immobile nanoscale wire.

In another set of embodiments, the method includes acts of providing a source electrode, a drain electrode, and a semiconductive material in electrical communication with both the source and drain electrodes, and independently writing and reading at least two separate bits of data in the semiconductive material.

Yet another set of embodiments provides a method including an act of depositing a ferroelectric oxide material on at least a portion of a nanoscale wire comprising a core and a first shell to form a second shell different from the first shell. In another set of embodiments, the method includes an act of depositing a ferroelectric oxide material on at least a portion of a nanoscale wire not immobilized to a substrate. Still another set of embodiments provides a method including an act of depositing a material having a dielectric constant of at least about 15 on at least a portion of a nanoscale wire not immobilized to a substrate.

In another aspect, the present invention is directed to a method of making one or more of the embodiments described herein. In yet another aspect, the present invention is directed to a method of using one or more of the embodiments described herein.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures:

FIGS. 1A-1F illustrate various physical properties of certain nanoscale wires of an embodiment of the invention;

FIG. 2 illustrates the polarization of a nanoscale wire, in accordance with another embodiment of the invention;

FIGS. 3A-3G illustrate a nanoscale wire able to encode more than one bit of data, according to yet another embodiment of the invention;

FIG. 9A-9E illustrate certain nanoscale wires of an embodiment of the invention;

DETAILED DESCRIPTION

The present invention generally relates to nanotechnology and sub-microelectronic devices that can be used in circuitry and, in some cases, to nanoscale wires and other nanostructures able to encode data. One aspect of the invention provides a nanoscale wire or other nanostructure having a region that is electrically-polarizable, for example, a nanoscale wire may comprise a core and an electrically-polarizable shell. In some cases, the electrically-polarizable region is able to retain its polarization state in the absence of an external electric field. All, or only a portion, of the electrically-polarizable region may be polarized, for example, to encode one or more bits of data. In one set of embodiments, the electrically-polarizable region comprises a functional oxide or a ferroelectric oxide material, for example, $BaTiO_3$, lead zirconium titanate, or the like. In some embodiments, the nanoscale wire (or other nanostructure) may further comprise other materials, for example, a separation region separating the electrically-polarizable region from other regions of the nanoscale wire. For example, in a nanoscale wire, one or more intermediate shells may separate the core from the electrically-polarizable shell.

Figure 4A:
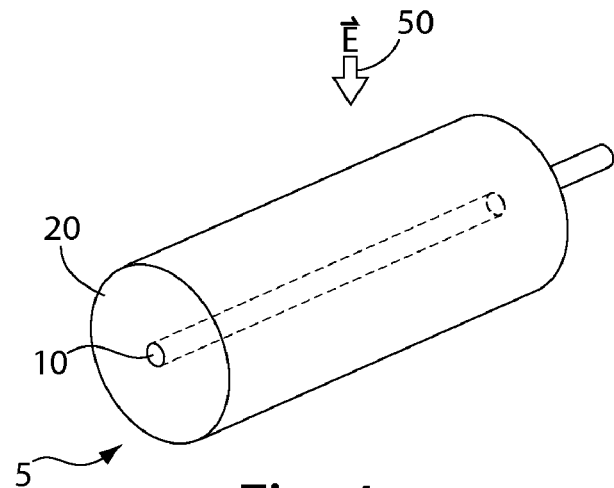
FIGS. 4A-4C are schematic diagrams illustrating various embodiments of the invention.

One aspect of the invention provides a nanoscale wire having a core and a shell, where the shell comprises a functional oxide, and/or a ferroelectric oxide material such as a barium titanate (e.g., $BaTiO_3$), for example, as shown in FIG. 4A with nanoscale wire 5 having a core 10 and shell 20. One or more portions of shell 20 at least partially surrounding at least a portion of the core may be independently polarized by applying an electric field 50 to that portion, and such portion(s), after polarization, may be able to retain the polarization state, even in the absence of an external electric field. The core may be electrically conductive (i.e., able to pass an electric current therethrough), and can be used to apply the electric field to the shell. For example, the core may comprise a semiconductor such as silicon, or a conductor. Other examples of semiconductors include elemental semiconductors, Group IV semiconductors, Group III-Group V semiconductors, Group II-Group IV semiconductors, or the like, as well as semiconductors having different levels of doping. Additional examples are further described below. Thus, it should be noted that the present invention is not confined to p-type doped silicon, but is applicable to other types of semiconductive materials with different types and/or levels of doping as well.

In certain embodiments, such nanoscale wires are useful in devices such as nonvolatile memory devices. More than one bit of data may be encoded within the nanoscale wire in some cases, for example, within different portions of a shell that have been independently polarized. Data (i.e., bits) can be encoded within a portion of the shell by applying an electric field to that portion (e.g., using a "writing voltage"). For example, the wire may be polarized by creating a first voltage gradient between the portion of the shell and the core (e.g., representing a "1"), and depolarized by creating a second voltage gradient, which may be smaller or negative with respect to the first voltage gradient, between the portion of the shell and the core (e.g., representing a "0"). Upon removal of the voltage gradient, the portion of the shell is able to retain its polarization state, in some cases, for at least hours, days, weeks, or longer. Without wishing to be bound by any theory, in some cases, due to the "binary" nature of the electrically-polarizable region at the quantum scale (e.g., an "up" electric dipole moment and a "down" electric dipole moment), the portion of the shell is able to retain its polarization state for very long periods of time without any appreciable decay or "leakage," as the quantum state of the portion of the electrically-polarizable region (e.g., an "up" electric dipole moment and a "down" electric dipole moment) prevents substantial leakage or intermediate values, and the nanoscale dimensions of the nanoscale wire allow the electrically-polarizable region to control the conductivity and/or other electrical properties of the nanoscale wire, as discussed herein. It should be noted that the designations of "1" for a polarized state and "0" for a depolarized or an oppositely polarized state are arbitrarily chosen, and that, in another embodiment of the invention, "0" may be chosen for a polarized state and "1" for a depolarized or an oppositely polarized state. With the benefit of the present disclosure, those of ordinary skill in the art will know of suitable techniques to read/write data to a nanoscale wire using any polarization encoding scheme.

In one embodiment, a polarized shell may change the conductance of the core proximate (i.e., in contact, or at least near) the polarized region with respect to an unpolarized shell, and higher amounts of polarization can have correspondingly greater effects on the conductivity in some cases (other embodiments are discussed in more detail, below). Thus, the polarization state of the shell may be determined by measuring the conductance of the core. For example, if the core comprises p-type doped silicon, a polarization state in a portion of the shell that is pointing towards the core (i.e., a "down" dipole moment) may decrease the conductance of the core, while a polarization state in the portion of the shell that is pointing away from the shell (i.e., an "up" dipole moment) will increase the conductance of the core. Additionally, the conductance of the core may be determined without changing the polarization state of the portion of the shell, e.g., by applying a voltage to the portion of the shell that is negative with respect to the voltage with which the polarization is written but smaller in value. One or more electrodes may be applied to the one or more portions of the shell in order to apply such voltages. Thus, by determining the conductance of the core proximate to each portion of the shell, the polarization state of that portion of the shell can be individually determined. For instance, higher conductance (e.g., with respect to the nanoscale wire before a reading voltage is applied) may indicate a lack of polarization in that portion of the shell (since a depolarized shell portion is typically not substantially altered by further depolarization), while a lower conductance may indicate polarization in that portion of the shell. Thus, the nanoscale wire may be treated as a transistor or a switch in some cases, where the core acts as a source and a drain, and each of the shell portions acts as a gate. By applying a reading voltage to each portion of the shell of a nanoscale wire in turn, the state of each portion of the nanoscale wire encoding data can be determined.

It should be understood that the invention is not limited only to barium titanate, but also includes other materials, such as ferroelectric oxide materials and/or other electrically-polarizable materials or functional oxide materials. For example, in one aspect, the invention includes a material able to retain its polarization state in the absence of an external electric field.

As used herein, a "functional oxide" material is a material, comprising an oxide, forming a coating or a shell on at least a portion of a nanoscale wire. A functional oxide typically will functionally affect the nanowire with which it is associated, either by affecting an electronic and/or emissive and/or other property of the nanowire, or by serving as a platform at which to attach molecules materials that affect the nanowire or its function, or the like. Examples of functional oxide materials include, but are not limited to, a high-K dielectric material, a ferroelectric oxide material, a ferromagnetic oxide material, or the like, e.g. as described herein. Combinations of these and/or other materials are also contemplated in certain embodiments of the invention. In some cases, the functional oxide material may be deposited on a nanoscale wire using techniques such as atomic layer deposition or other techniques described herein.

As used herein, a "ferroelectric oxide material" is a material that can be reversibly and stably polarized by an external stimulus, for example, an electric field and/or mechanical stress, such that the material retains its polarization state even when the external stimulus is removed. (As is understood by those of ordinary skill in the art, it should also be noted that a "ferroelectric oxide" material, despite its name, is not restricted to iron-containing materials and/or materials containing oxygen.) Typically, the ferroelectric oxide material has two states, which may be referred to, variously, as a "polarized" state and a "depolarized" state (or an "oppositely polarized" state), an "up" electric dipole moment and a "down" electric dipole moment, a relatively high conductivity state and a relatively low conductivity state, a first state having a dipole moment and a second state not having a dipole moment, etc. It should be understood, in the descriptions herein, references to two states of a ferroelectric oxide material, such as a "polarized" and a "depolarized" state, are by way of example only, and that in that in other embodiments, the states of a ferroelectric oxide material may be referred to as an "up" electric dipole moment and a "down" electric dipole moment, a relatively high conductivity state and a relatively low conductivity state, etc. Non-limiting examples of ferroelectric oxide material include barium titanate (BaTiO$_3$), lead titanate (PbTiO$_3$), lead zirconium titanate (Pb(Zr$_{1-x}$Ti$_x$)O$_3$), strontium bismuth tantalate (SrBi$_2$Ta$_2$O$_6$), bismuth lanthanum titanate (Bi(La$_x$Ti$_{1-x}$)$_4$O$_{12}$), strontium barium titanate (Ba$_x$Sr$_{1-x}$TiO$_3$), germanium telluride (GeTe), or the like.

In one set of embodiments, the ferroelectric oxide material includes a material having a perovskite crystal structure, or an ilmenite crystal structure. Such crystal structures may have two or more one stable atomic states, for example, a first stable state where the atoms within the unit cell of the crystal structure are in a first position, and a second stable state where the atoms within the unit cell of the crystal structure are in a second position that is different from the first position. The perovskite crystal structure can thus be an electrically polarizable material that can be polarized in the first state or in the second state using different applied electric fields. Those of ordinary skill in the art will be able to identify materials having perovskite or ilmenite crystal structures. Examples of atoms which may be present within certain perovskite materials include, but are not limited to, barium, zirconium, titanium, lead, germanium, strontium, etc., as well as certain oxides thereof. In certain cases, the ferroelectric oxide material may comprise more than one type of unit cell. For example, the ferroelectric oxide material may comprise barium titanate and lead titanate, barium titanate and lead zirconium titanate, lead titanate and lead zirconium titanate, etc.

As used herein, a material or region that is "electrically polarizable" is a material whose polarization state may be changed upon the application of an electric field. In some embodiments, of the invention, the material or region that is electrically polarizable may be able to retain its polarization state when the electric field is removed, for example, in embodiments where the electrically-polarizable region comprises a ferroelectric oxide material and/or a functional oxide material. Thus, for example, a first electric field applied to a ferroelectric oxide material may cause the material (or at least a portion thereof) to enter a "polarized" state, and a second electric field may cause the material (or at least a portion thereof) to enter a "depolarized" or an "oppositely polarized" state. In some cases, the first electric field and the second electric field may have opposite signs (i.e., positive and negative electric fields). The electric field applied to the material or region may have an intensity and/or a duration at least sufficient to change the polarization state of the material or region. As discussed in more detail below, in some cases, the electrically-polarizable region may include two or more portions that can be independently polarized, i.e., a first portion of the electrically-polarizable region can be polarized or depolarized without substantially altering the state of polarization of a second portion of the electrically-polarizable region, a first portion of the electrically-polarizable region in which the conductivity can be enhanced without substantially altering the conductivity of a second portion of the electrically-polarizable region, etc.

Figure 6A:
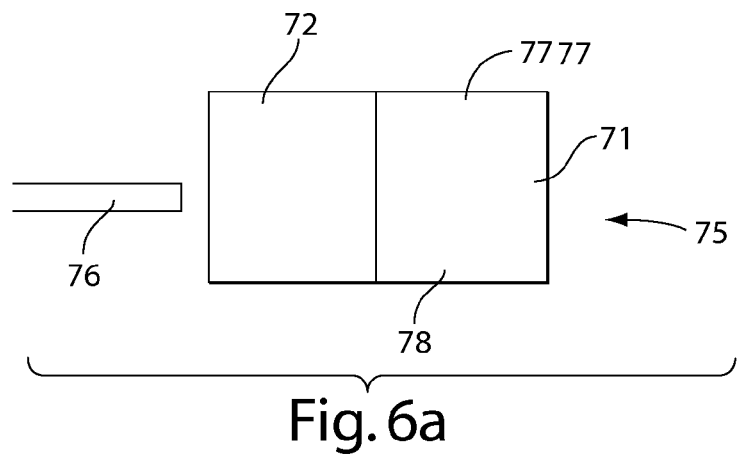
FIGS. 6A-6B are schematic diagrams illustrating various properties of certain nanoscale wire devices, according to an embodiment of the invention.

It should also be understood that the invention is not limited to nanoscale wires having a core and a shell, but also includes other arrangements of nanoscale wires and other nanostructures as well. For example, in one embodiment, a nanostructure may comprise a first layer or region that is electrically-polarizable, and a second layer or region that is semiconductive or conductive, e.g., as is illustrated in FIG. 6A with a semiconductive or conductive region 71 and an electrically-polarizable region 72. As another non-limiting example, the nanostructure may comprise two electrically-polarizable regions sandwiching a semiconductive or conductive region. Thus, in the descriptions below, it should be understood that references to nanoscale wires are by way of convenience only, and that other nanostructures may also be used in certain cases.

Figure 4B:
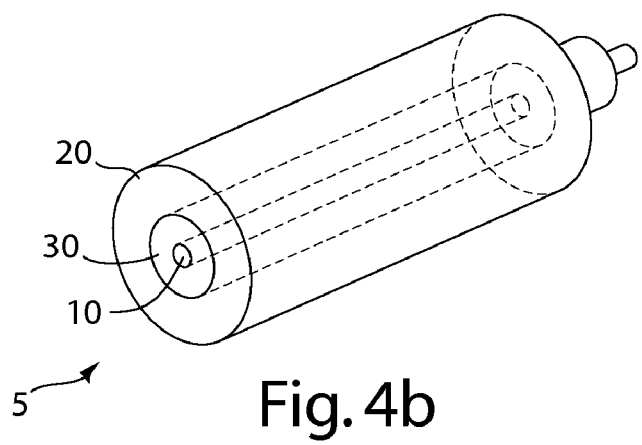
Figure 4C:
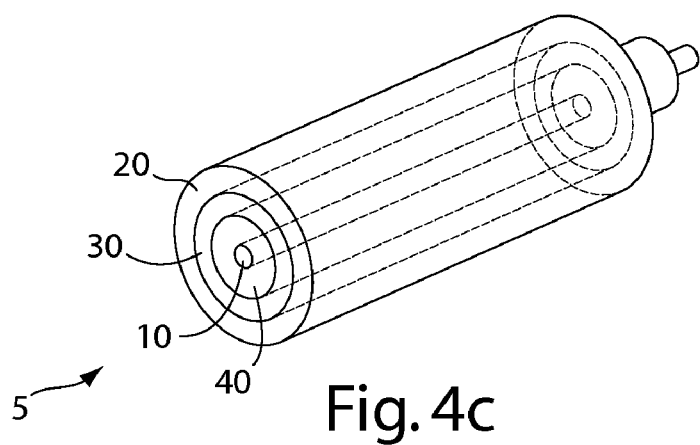

One set of embodiments provides a nanoscale wire having a first region comprising a ferroelectric oxide material (e.g., as previously discussed), and a second region, which may be free of a ferroelectric oxide material. For example, the second region may comprise a semiconductor such as silicon, a conductor, a high-K dielectric material, a metal, etc. Another set of embodiments provides a nanoscale wire having a first region that comprise a perovskite crystal structure and/or an ilmenite crystal structure, and a second region that is free of a perovskite crystal structure and/or an ilmenite crystal structure. Yet another set of embodiments provides a nanoscale wire having a first region that is electrically-polarizable, and a second region that is not electrically-polarizable. Still another set of embodiments provides a nanoscale wire having a first region that has a dielectric constant of at least about 15, and a second region having a dielectric constant less than the first region. Yet another set of embodiments of the invention provides a nanoscale wire having a first region comprising a functional oxide material, and a second region which may be free of a functional oxide material. Combinations of these embodiments are also possible in some cases. More than two regions within a nanoscale wire are also possible (for example, the nanoscale wire may have two, three, four, five, or more such regions), and these regions may have unique compositions and/or some of these regions may comprise the same compositions, e.g., as is shown in FIGS. 4B and 4C.

The regions may be positioned in any arrangement with respect to each other, for example, radially (e.g., as in a core/shell structure, as shells of a core/shell structure, etc.) or longitudinally (e.g., the regions may be adjacently positioned along a longitudinal axis of the nanoscale wire). Combinations of these arrangements are also possible. For example, a nanoscale wire may have a first region and a second region adjacently positioned to the first region along a longitudinal axis of the nanoscale wire, surrounded by at least one shell; the nanoscale wire may have two, three, or more shells at least partially surrounding a core, etc. Each region may have any shape or dimension. For instance, a region may have a smallest dimension of less than 1 micrometer, less than 100 nm, less than 10 nm, or less than 1 nm. In some cases, one or more regions may comprise a single monolayer of atoms. In certain arrangements, the region may be less than a single monolayer thick (for example, if some of the atoms within the monolayer are absent). The regions of the nanoscale wire may be distinct from each other with minimal cross-contamination (for example, the junction between two differing regions may be "atomically-abrupt," where there is a sharp transition at the atomic scale between two adjacent regions that differ in composition), or the composition of the nanoscale wire may vary gradually from one region to the next. As an example, an "overlap region" between adjacent regions may be a few nanometers wide, for example, less than about 10 nm, less than about 20 nm, less than about 40 nm, less than about 50 nm, less than about 100 nm, or less than about 500 nm. In some cases, an additional, separation region may be added to the nanoscale wire to separate these regions. For instance, the separation region may prevent or at least reduce atomic diffusion between other regions of the nanoscale wire.

A nanoscale wire may have two, three, or more shells at least partially surrounding a core (e.g., a "core/shell arrangement"), according to some embodiments of the invention. For example, in FIG. 4B, nanoscale wire 5 comprises core 10 and shells 20 and 30 (concentrically arranged), while in FIG. 4C, nanoscale wire 5 comprises core 10 and shells 20, 30, and 40 (concentrically arranged). The shells may be radially (i.e., concentrically) positioned around at least a portion of the core, and/or longitudinally positioned relative to each other (e.g., contacting each other, defining a change in composition or concentration of a unitary shell structure longitudinally, separated from each other by, e.g., air, an insulator, a fluid, or an auxiliary, non-nanowire component, etc.). The shell portions can be positioned directly on the core, or can be separated from the core by one or more intermediate shells portions that can themselves be consistent in composition longitudinally, or varying in composition longitudinally. The shells do not necessarily have to be concentrically arranged; for example, one or more of the shells may be positioned off-center with respect to the core.

One set of embodiments of the invention additionally includes a high-K dielectric material, for example, positioned as a shell or other region of a nanoscale wire or other nanostructure. The high-K dielectric material may be positioned anywhere within the nanoscale wire. As used herein, a "high-K dielectric material" is a material that is generally a poor conductor of electricity, but is a relatively efficient supporter of an electric field, i.e., the material permits an electric field to be transmitted therethrough, but does not readily permit an electric current to pass. Such properties may be determined, for instance, by determining the dielectric constant ("K") of the material, using techniques known to those of ordinary skill in the art. A high-K dielectric material may have a relatively high dielectric constant, for example, a dielectric constant of at least about 10, and in some cases, the dielectric constant may be at least about 15, at least about 20, at least about 25, at least about 30, at least about 40, or at least about 50. Non-limiting examples of materials having relatively high dielectric constants include certain ceramic materials, mica, glass, or certain polymers. In some embodiments, the high-K dielectric material may include materials that comprise compounds of zirconium, hafnium, aluminum, etc. having relatively high dielectric constants. In one embodiment, the high-K dielectric material includes one or more oxides (i.e., inorganic materials comprising one or more oxygen atoms). Those of ordinary skill in the art will know of oxides having suitable dielectric constants. Non-limiting examples include metal oxides, for example, comprising zirconium or hafnium; specific examples include $ZrO_2$, $ZrSiO_4$, $HfO_2$, $HfSiO_4$, $Al_2O_3$, or the like. In some cases, more than one material having a high dielectric constant may be used.

In some embodiments, the high-K dielectric material may be positioned between a semiconductive or conductive region of a nanoscale wire, and an electrically polarizable region in a nanoscale wire. The high-K dielectric material may be chosen to have a dielectric constant, according to some embodiments, such that the material is able to enhance the ability of the electrically polarizable region to retain its polarization state, for example, by preventing or at least limiting current flow between the semiconductive or conductive region and the electrically polarizable region. In some cases, e.g., if the nanoscale wire has a core/shell arrangement where the semiconductive or conductive region is the core and the electrically polarizable region is a shell of the nanoscale wire, the high-K dielectric material may be positioned as another shell of the nanoscale wire, for instance, positioned between at least a portion of the electrically polarizable shell and at least a portion of the core of the nanoscale wire. As an example, in FIG. 4B, nanoscale wire 5 may comprise a semiconductive or conductive core 5, an inner shell 30 comprising a high-K dielectric material, and an outer shell 20 comprising an electrically polarizable material.

The high-K dielectric material may be positioned directly adjacent to the semiconductive or conductive region, and/or to the electrically polarizable region, or indirectly positioned such that an electric field created between the semiconductive or conductive region and the electrically polarizable region substantially contacts at least a portion of the high-K dielectric material (e.g., to an extent that can be measured). For example, another region of material (for example, comprising a metal, as discussed below) may be positioned between the high-K dielectric material and the electrically polarizable region.

As other examples, in some embodiments, the high-K dielectric material may be positioned, directly or indirectly, between two or more regions of a nanoscale wire, for example, between two or more regions as previously described. For instance, the high-K dielectric material may be positioned between a first region comprising a ferroelectric oxide material and a second region free of a ferroelectric oxide material, between a first region comprising a perovskite crystal structure and/or an ilmenite crystal structure and a second region free of a perovskite crystal structure and/or an ilmenite crystal structure, between a first region having a dielectric constant of at least about 15 and a second region having a dielectric constant less than the first region, between a first region comprising a functional oxide material and a second region free of a functional oxide material, etc.

Another set of embodiments of the invention additionally includes a separation region separating two or more other regions within a nanoscale wire or other nanostructure, for example, a semiconductive or conductive region, and/or an electrically polarizable region, or any of the other regions described above. The separation region may prevent (or at least reduce) atomic diffusion to other regions of the nanoscale wire. In some embodiments, the separation region can be defined by a material having an intraatomic diffusion coefficient that is less than the regions adjacent the separation region. In another embodiment, the separation region may include a metal (e.g., a noble metal, such as gold or platinum), or an oxide (e.g., $SiO_2$). In yet another embodiment, the separation region includes, or is defined by, a high-K dielectric material. Thus, with reference to FIG. 4B, a nanoscale wire 5 may comprise a semiconductive or conductive core 5, an outer shell 20 comprising an electrically polarizable material, and a separation region 30 separating the semiconductive or conductive core and the electrically polarizable material.

In still another set of embodiments, the nanoscale wire or other nanostructure includes a region comprising a metal, for example, separating two or more other regions within a nanoscale wire, for instance, a semiconductive or conductive region, and/or an electrically polarizable region, or any of the other regions described above. The region comprising the metal may allow a better connection to be made between regions of the nanoscale wire, for example, due to a reduction in strain due to differences in atomic spacing between the different regions. In some cases, the metal region may also be used to prevent or at least reduce atomic diffusion to other regions of the nanoscale wire. Examples include, but are not limited to, noble metals such as gold, platinum, palladium, rhodium, silver, or iridium.

It should be understood that any combination of the regions described above are contemplated in certain embodiments of the invention. Thus, for example, a nanoscale wire or another nanostructure may comprise a semiconductive or conductive region, a high-K dielectric material, a region comprising a metal, and an electrically polarizable region, and in some cases, these regions may be distributed in a core/shell arrangement. Thus, as is illustrated in FIG. 4C as an example, a nanoscale wire 5 may comprise a semiconductive or conductive core 5, a first shell 30 surrounding at least a portion of the core comprising a high-K dielectric material, a second shell 40 surrounding at least a portion of the first shell comprising a metal, and an outer shell 20 surrounding at least a portion of the second shell comprising an electrically polarizable material. In some cases, the shells may be concentrically arranged around the core.

In one set of embodiments, the nanoscale wire or other nanostructure comprises an electrically-polarizable region that includes two or more portions that can be independently polarized. For instance, a first portion of an electrically-polarizable region can be polarized or depolarized without substantially altering the polarization state of an adjacent portion of the nanoscale wire. Thus, upon electrically polarizing or depolarizing the first portion of the electrically-polarizable region, the polarization state of the second portion of the electrically-polarizable region is not substantially altered (e.g., the second portion is not simultaneously polarized or depolarized), and when read (as discussed below), results in the same data as prior to polarization or depolarization of the first portion.

In one embodiment, the portions of the electrically-polarizable region that can be independently polarized or depolarized are separated by a distance (center-to-center) of at least 3 unit cells, and in some cases, the portions may be separated by a distance of at least 4 unit cells, at least 5 unit cells, at least 7 unit cells, at least 10 unit cells, at least 15 unit cells, at least 20 unit cells, at least 25 unit cells, at least 50 unit cells, etc. As used herein, a "unit cell" is the simplest repeating unit in the crystal structure of the electrically-polarizable region. Those of ordinary skill in the art will know of suitable techniques for determining the unit cell size of a material. As a specific example, if the electrically-polarizable region comprises a $BaTiO_3$ perovskite crystal structure, the unit cell size may be about 0.4 nm.

In another embodiment, the portions of the electrically-polarizable region that can be independently polarized or depolarized are defined by one or more electrodes, each independently positioned in contact or proximate to the electrically-polarizable region (i.e., at a distance such that, when an electric field of suitable intensity and duration is applied using the electrode, the portion of the electrically-polarizable region proximate the electrode is polarized of depolarized without adjacent regions of the nanoscale wire being substantially altered). In some cases, at least one electrode is in contact or is proximate to the electrically-polarizable region, and in some cases, at least 2, 3, 5, 10, 20, 50, 75, or 100 electrodes each are in contact and/or are proximate to the electrically-polarizable region, for example, in contact or proximate to different portions of the electrically-polarizable region. In certain, but not all, instances, for example, due to practical considerations, no more than 100, 50, 20, or 10 electrodes each are in contact or are proximate to the electrically-polarizable region. As further discussed below, in some cases, a nanoscale wire may be used to encode more than one bit of data, and in certain embodiments of the invention, each electrode may be used to encode and/or read bits of data in the nanoscale wire.

In some embodiments, the electrodes may be positioned such that they are separated by a distance of at least a 3 unit-cell spacing of the electrically-polarizable region. In other embodiments, however, the electrodes may be positioned such that they are separated by greater distances. For example, in some cases, the electrodes are positioned such that they are separated by a distance of at least 4 unit cells, at least 5 unit cells, at least 7 unit cells, at least 10 unit cells, at least 15 unit cells, at least 20 unit cells, at least 25 unit cells, at least 50 unit cells, etc. with respect to the electrically-polarizable region. In other cases, the electrodes may be separated by a distance of at least about 1 nm, at least about 2 nm, at least about 3 nm, at least about 5 nm, at least about 10 nm, at least about 15 nm, at least about 20 nm, at least about 25 nm, at least about 30 nm, at least about 40 nm, at least about 50 mm, at least about 75 nm, at least about 100 nm, at least about 150 nm, at least about 200 nm, at least about 250 nm, at least about 300 nm, at least about 500 nm, or at least about 1 micron.

Figure 5A:
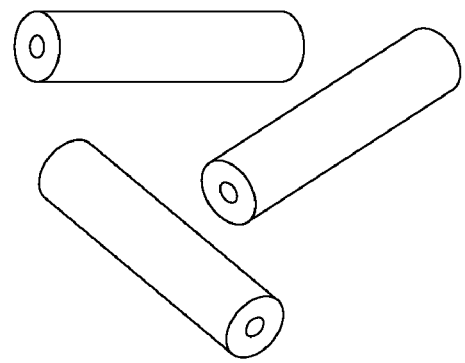
FIGS. 5A-5C are schematic diagrams illustrating the fabrication of electrodes suitable for use with certain embodiments of the invention.
Figure 5B:
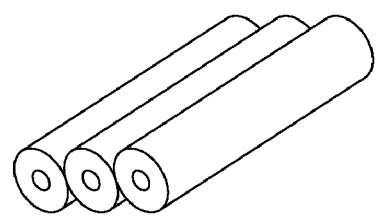
Figure 5C:
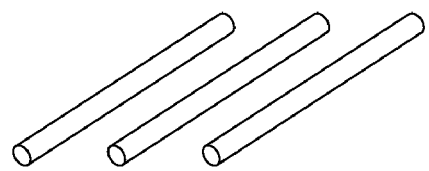

In one embodiment, as schematically illustrated in FIG. 5, the spacing between the electrodes is determined by fabricating core-shell nanoscale wires (FIG. 5A), aligning the nanoscale wires and spacing them to a certain pitch and/or such that the nanoscale wires are in contact (for example, using Langmuir-Blodgett techniques such as those disclosed in Ser. No. 60/524,301, entitled "Nanoscale Arrays and Related Devices," filed Nov. 20, 2003, incorporated herein by reference) (FIG. 5B), then etching away at least a portion of the shells of the nanoscale wires using suitable etching techniques, such that the cores define the electrodes (FIG. 5C). The electrode array may be positioned in contact or at least proximate to the nanoscale wire using transfer techniques known to those of ordinary skill in the art, for example, using stamping or imprinting techniques as disclosed in Ser. No. 60/524,301, entitled "Nanoscale Arrays and Related Devices," filed Nov. 20, 2003, or Ser. No. 10/995,075, entitled "Nanoscale Array and Related Devices," filed Nov. 22, 2004, each incorporated herein by reference, and the electrode array may be positioned at any suitable point during the fabrication process, for instance, before or after the shells have been etched. As used herein, the "pitch" of an array of nanoscale wires is the spacing between the centers of adjacent nanoscale wires. The pitch may be, for example, less than about 500 nm, less than about 200 nm, less than about 100 nm, less than about 50 nm, or less than about 20 nm in some cases. In other embodiments, the pitch of the nanoscale wires may be at least about 100 nm, at least about 200 nm, at least about 300 nm, at least about 400 nm, at least about 500 nm, at least about 600 nm, at least about 750 nm, at least about 1 micron, at least about 2 microns, at least about 3 microns, at least about 5 microns, at least about 10 microns, at least about 15 microns, at least about 20 microns, or at least about 25 microns or greater. In certain embodiments, the aligned nanoscopic wires are arranged such that they are in contact with each other; in other embodiments, however, the aligned nanoscopic wires may be at a pitch such that they are not in substantial physical contact.

The electrodes can be fabricated from any material able to transmit a voltage to the nanoscale wire, e.g., to the electrically-polarizable region. The electrodes may each independently be fabricated from the same or different materials. For example, the electrodes can comprise a metal (e.g., nickel, copper, a noble metal, such as gold or platinum, etc.), or a semiconductor material (e.g., silicon, gallium, germanium, etc.). In one embodiment, one or more or electrodes may comprise another nanoscale wire.

The electrodes can be positioned in contact or at least proximate to the electrically-polarizable region of the nanoscale wire using any suitable technique known to those of ordinary skill in the art, for example, using electron beam lithography or photolithography techniques, for instance, followed by metal deposition (e.g. thermal evaporation, electron beam evaporation, etc. of a metal such as nickel, titanium, noble metals such as palladium, etc.). Typically, the electrodes are immobilized with respect to the nanoscale wire (i.e., the electrode does not move with respect to the nanoscale wire). Thus, the immobilized electrode can be used to define, in some embodiments, a portion of the electrically-polarizable region of the nanoscale wire that can be used to encode a bit of data.

It should be noted, however; that electrodes are not necessarily required in all embodiments. For instance, in some cases, an electric field may be applied to the nanoscale using a device external to the nanoscale wire. For example, a probe such as an atomic force microscope ("AFM") probe may be positioned proximate to or in contact with the nanoscale wire, and used to apply an electric field to the portion of the electrically-polarizable region of the nanoscale wire.

In some aspects of the invention, one or more bits of data may be encoded into a nanoscale wire or other nanostructure of the invention, for instance, by using a nanoscale wire comprising an electrically-polarizable region that includes two or more portions that can be independently polarized, as described above. For example, a first polarization state can be assigned "0" (for example, a depolarized state, a relatively high conductivity state, etc.) and a second polarization state can be assigned "1" (for example, a polarized state, a relatively low conductivity state, etc.). It should be noted that, as used herein, the term "bit" or "bits" is used relative to data and typically has two states, often referred to as "0" and "1"; while the term "bit" or "bits," as used to measure information content in an information theory sense (for example, when a computer file is mathematically "compressed" to reduce the file size, such that each "bit" is thereby used to encode multiple pieces of information) is not used herein.

Thus, a nanoscale wire of the invention may include an electrically-polarizable region comprising any number of portions that can each be independently polarized or depolarized, and such a nanoscale wire may be used to encode a similar number of bits of data. For example, at least 1, 2, 3, 5, 10, 20, 50, 75, or 100 bits of data may be encoded within a nanoscale wire of the invention. The actual number of a nanoscale wire may depend on factors such as the size or length of the nanoscale wire, the number of electrodes positioned adjacent or proximate the nanoscale wire, etc. In certain instances, for example, due to practical considerations, no more than 100, 50, 20, or 10 bits of data may be encoded within the nanoscale wire.

As previously discussed, in certain embodiments of the invention, one or more electrodes positioned in contact or at least proximate to the electrically-polarizable region may be used to define one or more portions of the electrically-polarizable region, each independently capable of encoding a bit of data. The electrodes may be used to encode (write) and/or read bits of data to/from the nanoscale wire.

In one set of embodiments, a portion of an electrically-polarizable region may be polarized (e.g., to encode a bit of data, for example, a "1") by applying an electric field to that portion that has an intensity and/or a duration at least sufficient to cause that portion to be polarized (e.g., using a "writing" voltage to create the electric field). Thus, according to this embodiment, if the portion was previously depolarized, the region is now polarized; if the portion was previously polarized, the region remains polarized. The electric field may be applied to the portion of an electrically-polarizable region using any suitable technique. For example, the electric field may be created using the nanoscale wire (for instance, by applying a current to a semiconductive or conductive region of a nanoscale wire), or the electric field may be externally applied to the nanoscale wire, for example, using an electrode, an external probe, etc. As a specific, non-limiting example, in FIG. 6A, a nanoscale wire or other nanostructure 75 comprises a semiconductive or conductive region 71 and an electrically-polarizable region 72, and electrode 76 is positioned proximate the electrically-polarizable region of the nanoscale wire; an electric field may be created across the electrically-polarizable region by creating a potential difference between electrode 76 and semiconductive or conductive region 71, for instance, by applying a voltage to electrode 76 while applying a different voltage to region 71 (e.g., a greater or lesser voltage, a voltage having the opposite sign, no voltage, etc.).

Relatively low "writing" voltages may be used in some cases, due to the nanoscopic nature of the wire. For example, in one set of embodiments, voltages having a magnitude (i.e., ignoring sign) of less than about 5 V, less than about 4.5 V, less than about 4 V, less than about 3.5 V, less than about 3 V, less than about 2.5 V, less than about 2 V, less than about 1.8 V, less than about 1.6 V, less than 1.4 V, less than about 1.2 V, less than about 1 V, less than about 0.8 V, or less than about 0.5 V may be used to alter the polarization state of the portion of an electrically-polarizable region. In some cases, the writing voltage may also be greater than a certain value, for example, greater than 2 V, greater than 3 V, greater than 4 V, etc. As non-limiting examples, the writing voltage may be between about 3 V and about 5 V, between about 4 V and about 5 V, etc. The voltage applied may be sufficient to alter the polarization state of the electrically-polarizable region (for example, from a depolarized state to a polarized state).

In some embodiments, the magnitude voltage required to polarize the portion of the electrically-polarizable region may be greater than (or less than) the magnitude of the voltage required to depolarize the portion of the electrically polarizable region, i.e., the magnitudes of the polarization and depolarization voltages are not equal. As an example, in one embodiment, the voltage that may be required to polarize ("writing") the portion of the electrically polarizable region may be between +4 V and +5 V, while the voltage required to depolarize ("erase") the portion of the electrically polarizable region bay be between −3 V and −4 V.

In one embodiment, an electric field is created by creating a potential difference between an electrode or other probe positioned in contact or at least proximate to the portion of the electrically-polarizable region, and a semiconductive or conductive region of the nanoscale wire. For example, a voltage may be applied to the electrode while the semiconductive or conductive region is grounded or a voltage of the opposite sign is applied to the semiconductive or conductive region, or a relatively larger voltage may be applied to the electrode while a relatively smaller voltage is applied to the semiconductive or conductive region or the region is grounded. Similarly, the portion of the electrically-polarizable region may be depolarized (e.g., to encode a bit of data, for example, a "0") by applying an electric field to that portion that has an intensity and/or a duration at least sufficient to cause that portion to be depolarized, for example, by applying an electric field, having an opposite sign to the polarizing electric field, to that portion of the electrically-polarizable region using techniques similar to those described above. As before, if the portion was previously polarized, the region is now depolarized; if the portion was previously depolarized, the region remains depolarized (or oppositely polarized).

Figure 6B:
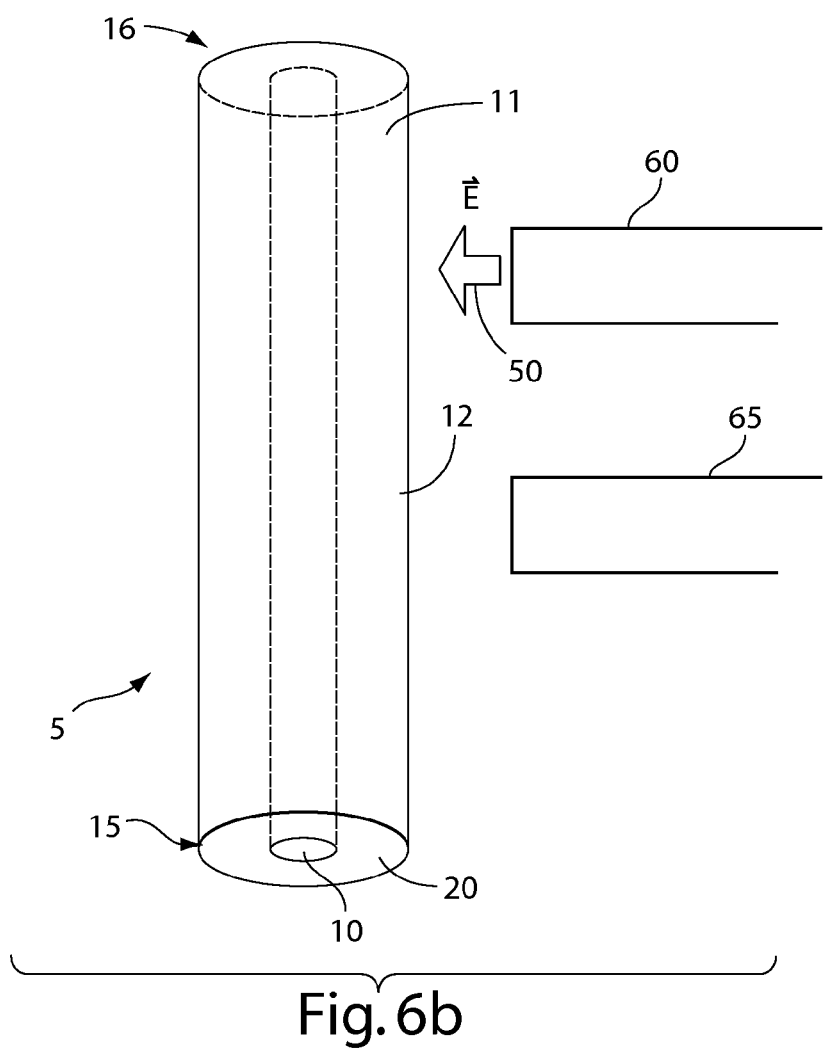

If the nanoscale wire comprises more than one portion that can be electrically polarized, the various portions may be independently polarized or depolarized. For example, in one embodiment, a first electric field may be applied to a first portion, and a second electric field (which may be the same or different than the first electric field, or which may be absent, i.e., having zero intensity) may be applied to a second portion of the nanoscale wire. As a specific example, with reference to FIG. 6B, nanoscale wire 5 comprises a semiconductive or conductive core 10 and an electrically-polarized shell 20; a first electrode 60 and a second electrode 65 are positioned proximate the nanoscale wire, defining at least two portions 11, 12 that can be used to independently encode bits of data. Portion 11 may be polarized without substantially altering the polarization state of portion 12 by applying an electric field 50 to only portion 11, for instance, by applying a positive voltage to electrode 60 while simultaneously grounding or applying a negative voltage to core 10 and electrode 65, by applying a voltage to electrode 60 while grounding or applying a negative voltage to core 11 and applying a voltage slightly less than the voltage of the core to electrode 11 (thereby creating an electric field proximate to portion 12 that tends to negate any "spill-over" effects on portion 12 caused by electric field 50), by applying a greater voltage to electrode 60, relative to core 10 and/or electrode 65 (for example, in devices where a "floating" voltage used), or the like.

The polarization state of the portion of an electrically-polarizable region may be determined using any suitable technique, including those previously described. For example, in one set of embodiments, the polarization state may be determined by applying a voltage (i.e., a "reading" voltage) to the portion of the electrically-polarizable region while simultaneously measuring the conductance of a semiconductive or conductive region of the nanoscale wire positioned adjacent or proximate the electrically-polarizable region (i.e., positioned such that the polarization state of the portion of the electrically-polarizable region alters the conductance of the semiconductive or conductive region), for example, if the electrically-polarizable region comprises a ferroelectric oxide material or a functional oxide material. In some cases, the voltage may be applied to the portion of the electrically-polarizable region using an electrode positioned in contact or at least proximate to the portion of the electrically-polarizable region. In certain instances, the electrode or other probe may also be the electrode used to polarize ("write" or "encode") the electrically-polarizable region.

Typically, the voltage applied to the portion of the electrically-polarizable region does not have an intensity and/or a duration sufficient to alter the polarization state of the portion of the electrically-polarizable region. For example, if the electrically-polarizable semiconductive region comprises p-type doped silicon, and polarization is "written" to at least one portion of the electrically-polarizable region, then a positive voltage applied to a polarized portion may decrease the conductance of the semiconductive or conductive region, relative to the absence of the applied voltage, while a negative voltage applied to the polarized portion may increase the conductance of the semiconductive or conductive region, relative to the absence of the applied voltage. Thus, as a specific, non-limiting example, with reference to FIG. 6A, the polarization state of electrically-polarizable region 72 can be determined by applying a voltage (insufficient to alter the polarization state of region 72), and measuring the resulting change in conductance of semiconductive or conductive region 71, for example, by applying a potential drop from a first end 77 to a second end 78 of region 71, and measuring the resulting current.

In certain instances, relatively low "reading" voltages may be used to determine the polarization state, due to the nanoscopic nature of the wire. For example, in one set of embodiments, voltages having a magnitude of less than about 5 V, less than about 3 V, less than about 2.5 V, less than about 2 V, less than about 1.8 V, less than about 1.6 V, less than 1.4 V, less than about 1.2 V, less than about 1 V, less than about 0.8 V, or less than about 0.5 V may be used to determine the polarization state of the portion of an electrically-polarizable region. Additionally, in other embodiments, the read/write voltage ratio may also be kept relatively low. For example, the ratio between the reading voltage and the writing voltage may be less than about 1:10, less than about 1:5, less than about 1:3, less than about 1:2.5, less than about 1:2, less than about 1:1.8, less than about 1:1.6, less than about 1:1.5, less than about 1:1.4, less than about 1:1.3, less than about 1:1.2, or less than about 1:1.1. In some embodiments, different ratios of read/write voltages may be used for different portions of the nanoscale wire.

If the nanoscale wire comprises more than one portion that can be electrically-polarized, each portion may be independently determined (and/or combinations of portions may be determined, in some cases, for example, as discussed below in Example 1). For example, in one embodiment, a first electric field may be applied to a first portion, and a second electric field (which may be the same or different than the first electric field, or which may be absent, i.e., having zero intensity) may be applied to a second portion of the nanoscale wire. As a specific example, with reference to FIG. 6B, the polarization state of portion 11 may be determined by determining the conductance of core 11 when a voltage (i.e., a reading voltage) is applied to electrode 60 (and no voltage is applied to electrode 65), relative to the conductance of core 11 when no voltages are applied to electrodes 60 or 65. The conductance of core 11 may be determined using any suitable technique for measuring technique known to those of ordinary skill in the art. For instance, a potential drop may be created from a first end 15 of core 11 to a second end 16 of core 11, and the resulting current may then be measured.

It should also be noted that certain aspects of the invention can be used as a transistor or a switch. For instance, in one set of embodiments, an electrically-polarizable region of a nanoscale wire or other nanostructure may be used as a "gate," while a semiconductive or conductive region of the nanoscale wire positioned in contact or at least proximate the electrically-polarizable region may be used as a "source" and a "drain" of the transistor or switch. Thus, as a specific example, FIG. 6A can be used to illustrate a switch, where electrically-polarizable region 72 acts as a control terminal or a "gate," while a first end 77 of semiconductive or conductive region 71 acts as a first terminal or a "source," ad a second end 78 of region 71 acts as a second terminal or a "drain." A potential, applied to electrode 76, may be used to alter the polarization state of electrically-polarizable region 72, which may thereby alter the conductivity between the first and second terminals, or between the source and the drain.

Additionally, in some cases, the nanoscale wire transistor may have more than one control terminal or "gate." For example, in some embodiments, each electrode positioned in contact or proximate to a portion of an electrically-polarizable region of a nanoscale wire may define a terminal or "gate" region of that portion of the electrically-polarizable region. As a non-limiting example, with reference to FIG. 6B, nanoscale wire 5 may act as a switch, having a source (first terminal 15), a drain (second terminal 16), a first gate region (first portion 11), and a second gate region (second portion 12). An electric potential may be applied to either (or both) of control terminals 60 and 65, which each may be used to alter the polarization state of respective portions 11 and 12, each of which may thereby alter the conductivity between the source (first terminal 15) and the drain (second terminal 16).

Thus, one aspect of the invention provides devices comprising any of the nanoscale wire or nanostructure embodiments described herein, including memory devices and/or devices comprising transistors, switches, or the like. Some devices may include one, or more than one, of the nanoscale wire embodiments described herein.

In one set of embodiments of the present invention, a nonvolatile memory is provided. A nanoscale wire of the invention may be used to encode one, or more than one, bit of data, and such nanoscale wires can retain the data even in the absence of power. In some cases, an array of nanoscale wires may be used as nonvolatile memory. In certain embodiments, a relatively high density of memory elements can be achieved. For example, in some cases, the device may comprise an array of memory elements, each having an area of less than about 100 $nm^2$/bit, less than about 75 $nm^2$/bit, less than about 50 $nm^2$/bit, less than about 30 $nm^2$/bit, less than about 25 $nm^2$/bit, less than about 20 $nm^2$/bit, less than about 15 $nm^2$/bit, less than about 10 $nm^2$/bit, less than about 8 $nm^2$/bit, less than about 6 $nm^2$/bit, or less than about 4 $nm^2$/bit.

Figure 8A:
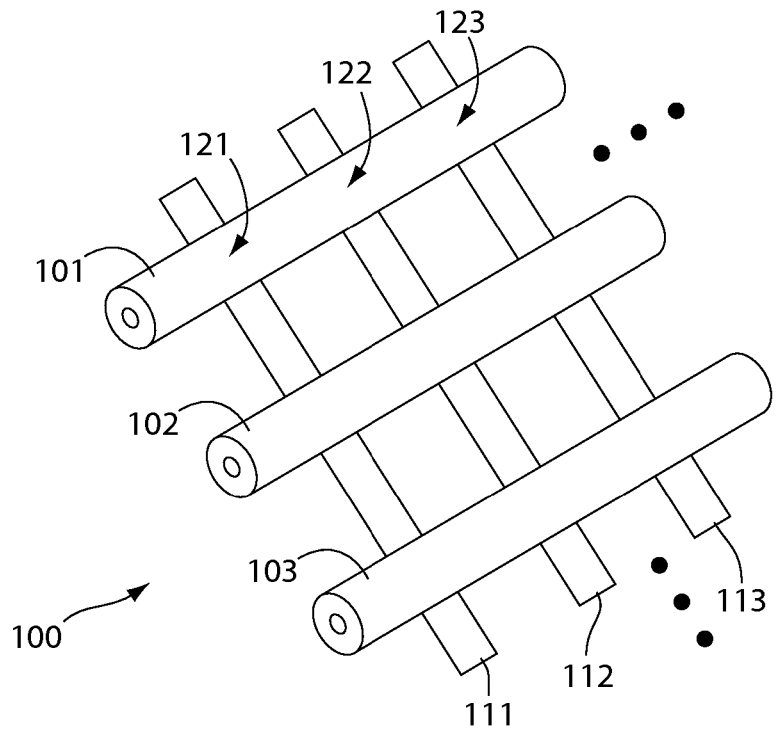
FIGS. 8A-8C illustrate an example of a memory architecture using certain nanoscale wires of the invention, according to yet another embodiment.

In one embodiment, an array of memory elements can be assembled using one or more nanoscale wires of the invention, crossed with one or more electrodes (e.g., as described herein). The electrodes may contact single nanoscale wires, or in some cases, the electrodes may contact more than one nanoscale wire, for example, as is illustrated in FIG. 8A. By systematically controlling the potential of each of the nanoscale wires and each of the electrodes, specific voltages can be made to appear at any desired location or locations within the array, which can then be used to read and/or write data to those locations, using techniques similar to those previously described. Thus, each intersection between a nanoscale and an electrode may define a portion of an electrically-polarized region that can encode a bit of data. Those of ordinary skill in the art, with the benefit of the present disclosure, will be able to identify suitable systems and methods for using an array comprising rows and columns for storing and accessing bits of data at the intersections of the rows and columns.

One non-limiting example of a memory array is as follows. With reference to FIG. 8A, memory array 100 comprise a series of nanoscale wires 101, 102, 103, . . . . In this figure, each of nanoscale wires 101, 102, 103, . . . has a core that is semiconductive or conductive, and a shell that is electrically polarizable. Of course, in other embodiments, other nanoscale wires are also possible, for instance, any of the nanoscale wires as previously described, and in some cases, each of the nanoscale wires may independently be the same or different. In FIG. 8A, each of nanoscale wires 101, 102, 103, . . . is in contact (or at least proximate to) a series of electrodes 111, 112, 113, . . . . Electric fields may be created at any desired location or locations within the array by controlling the voltages applied to each of the nanoscale wires and each of the electrodes. Thus, for example, to create an electric field at the junction of nanoscale wire 101 and electrode 111, a voltage may be applied to nanoscale wire 101 while a different voltage (or no voltage) is applied to electrode 111, a voltage may be applied to electrode 111 while no voltage is applied to nanoscale wire 101, a voltage is applied using a probe external the array, etc.

Figure 8B:
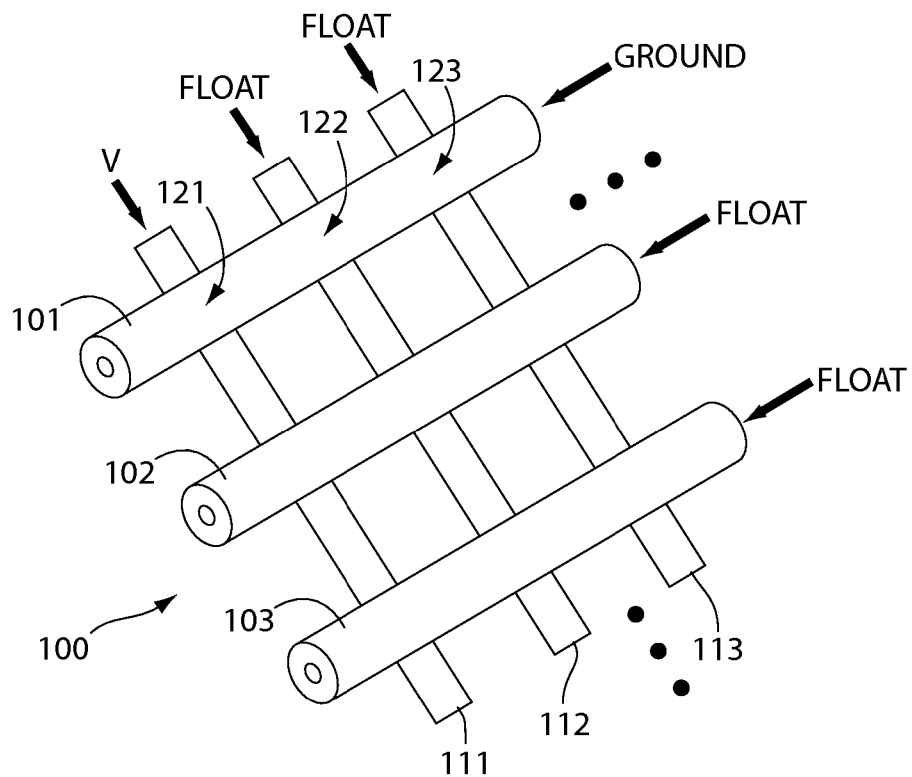

In this example, data may be written to an intersection by causing the nanoscale wire and the electrode defining the electrode to have potentials such that their difference is at least sufficient to encode a desired polarization state, while simultaneously "floating" the other nanoscale wires and electrodes (e.g., at an intermediate voltage, or at the voltage applied to the nanoscale wire), such that the electric potentials appearing elsewhere are not able to alter the polarization at those respective locations. Now referring to the schematic diagram of FIG. 8B, in memory array 100, a writing voltage is applied to nanoscale wire 101, while electrode 111 is grounded (or is brought to another relatively low voltage). The remaining nanoscale wires 102, 103, . . . and electrodes 112, 113, . . . can be electrically isolated, held at the writing voltage, and/or are held at an intermediate voltage between the writing voltage and the ground. The voltage difference at intersection 121 defined by the intersection of nanoscale wire 101 and electrode 111 is sufficient to polarize (or depolarize) that portion of the electrically-polarizable shell of nanoscale wire 101, thereby encoding a desired polarization state (e.g., representing a "1" or a "0"), while the voltage differences (if any) created at the other intersections in array 100 (e.g., between the writing voltage and the floating voltage, or between the floating voltage and ground) are insufficient to substantially alter the polarization states at those intersections. By applying suitable voltages to the other nanoscale wires and/or electrodes, each intersection within memory array 100 can be individually addressed and polarized or depolarized as desired.

Figure 8C:
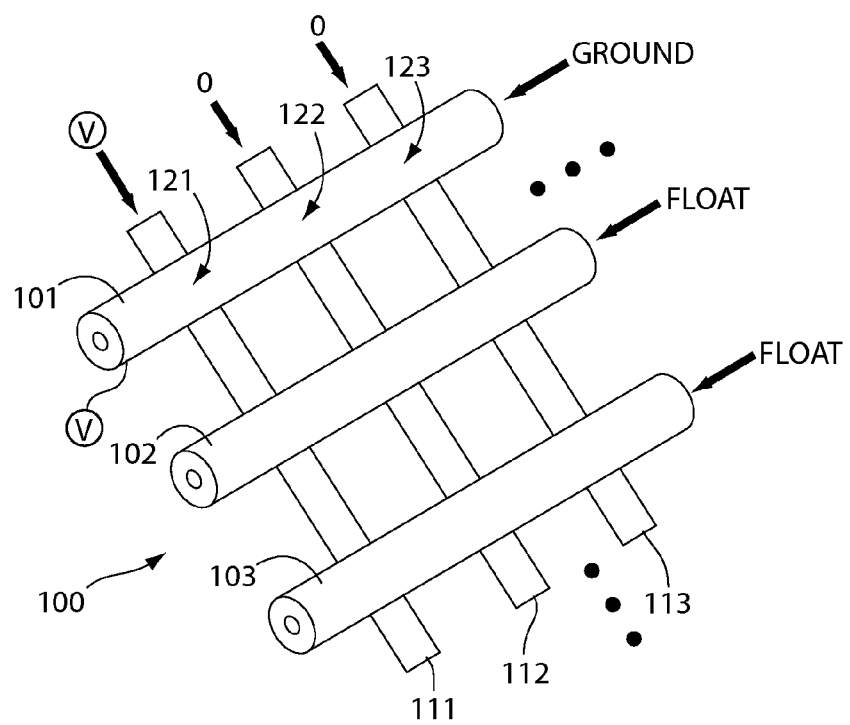
Figure 10A:
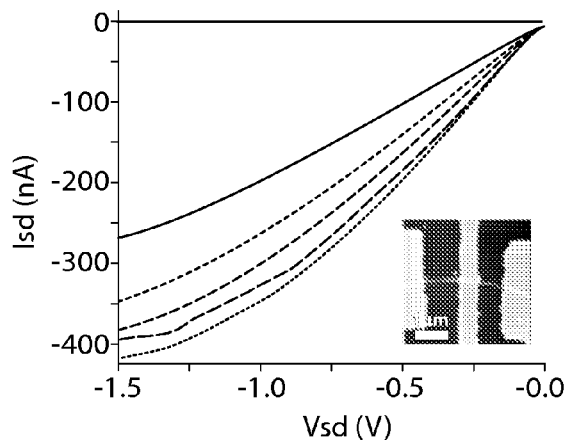
FIGS. 10A-10F illustrate the use of certain nanoscale wires to store bits of data, according to another embodiment of the invention.
Figure 10B:
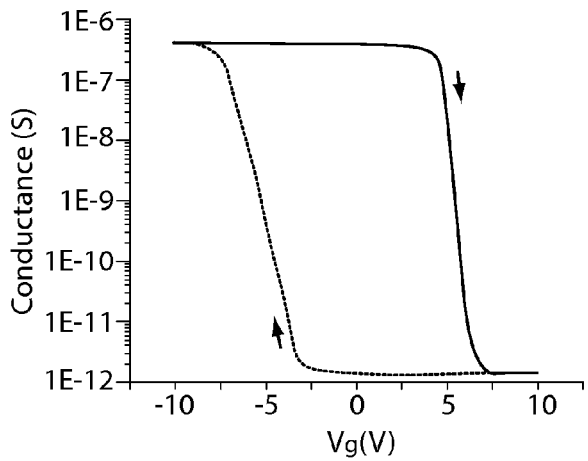
Figure 10C:
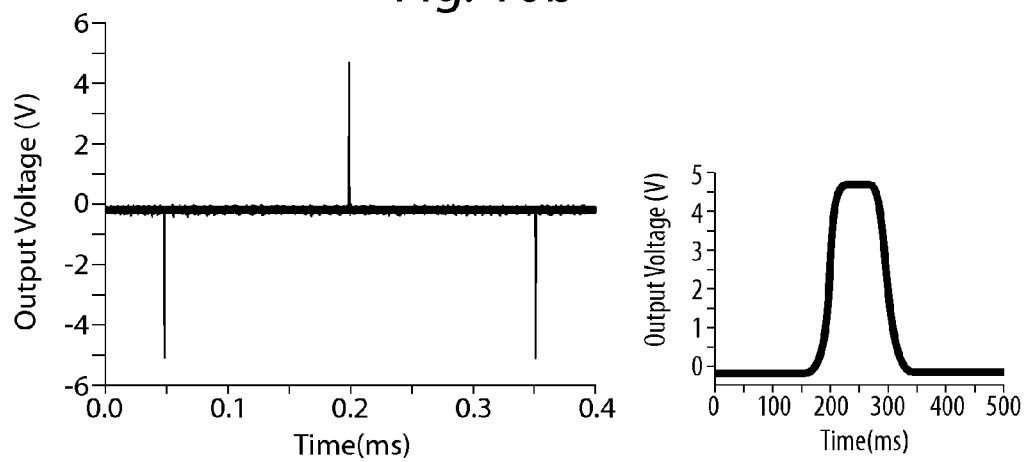
Figure 10D:
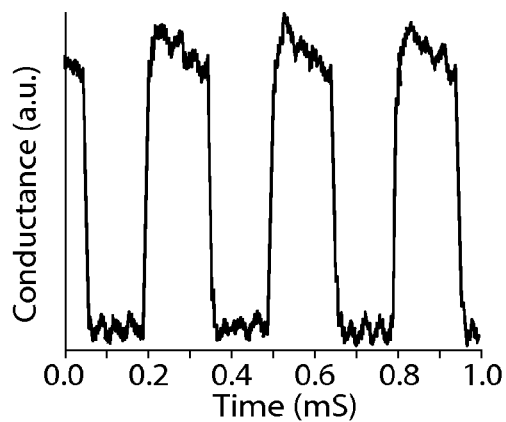
Figure 10E:
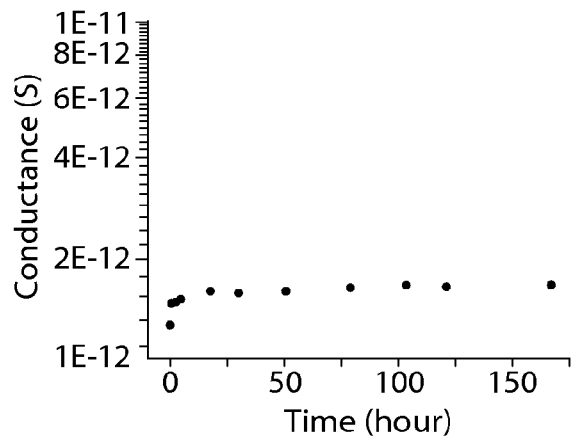
Figure 10F:
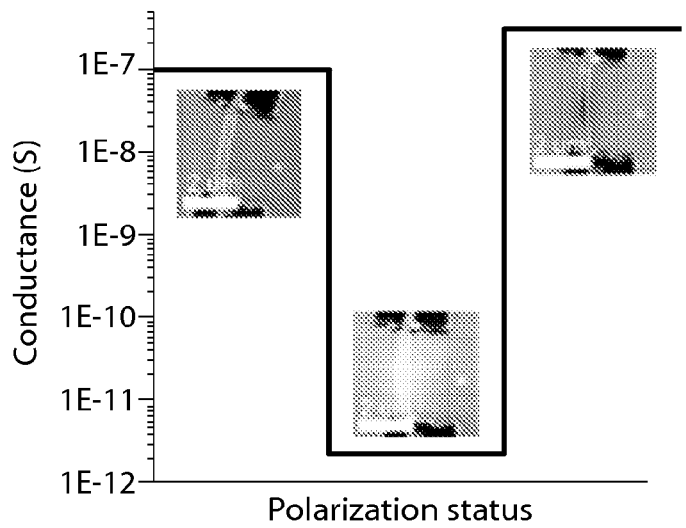

Reading data from the memory array, in this example, can be performed by creating a potential across one of the nanoscale wires while simultaneously "floating" the other nanoscale wires (i.e., such that the potential difference across those nanoscale wires is negligible, for example, at the reading voltage), and applying voltages to each of the electrodes in turn and measuring the resulting conductivity of the nanoscale wire with the potential. Referring now to FIG. 8C, the polarization state of intersections 121, 122, 123, . . . are to be determined (for example, which may encode a series of bits, a byte, a nybble, a word of data, etc. within the memory array). A voltage is applied to a first end of nanoscale wire 101 while the second end of nanoscale wire 101 is grounded. Simultaneously, nanoscale wires 102, 103, . . . are "floated," i.e., the same (or nearly the same) potential is applied to either end of each of these wires, and in some cases, at a potential equal or substantially equal to the reading voltage. The reading voltage is applied to electrode 111 while no voltage is applied to electrodes 112, 113, . . . , and the conductivity of the wire is determined and compared to the conductivity of the wire where no voltage is applied to any of the electrodes. As previously discussed, differences in polarization state of intersection 121 may lead to different conductivities, thus indicating the polarization state of intersection 121. Next, to determine the polarization state of intersection 122, a reading voltage is applied to electrode 112 while no voltage is applied to electrodes 111, 113, . . . etc, using similar techniques, and the conductivity of nanoscale wire 101 is again determined. By reporting this procedure, the polarization states of each of intersections 121, 122, 123, . . . can be determined, according to this example. Those of ordinary skill in the art will know of other methods of reading and/or writing bits of data from an array of intersections defined by rows and columns, where each intersection can be used to encode a bit of data.

In some cases, due to the nanoscale size of the instant device, relatively high read/write operations can be achieved. For example, data may be read and/or written to the device at a speed of at least about 5 Mb/s, at least about 10 Mb/s, at least about 15 Mb/s, at least about 20 Mb/s, at least about 25 Mb/s, at least about 30 Mb/s, at least about 35 Mb/s, at least about 40 Mb/s, at least about 50 Mb/s, at least about 55 Mb/s, at least about 60 Mb/s, at least about 65 Mb/s, at least about 70 Mb/s, at least about 75 Mb/s, at least about 80 Mb/s, at least about 85 Mb/s, at least about 85 Mb/s, at least about 90 Mb/s, at least about 95 Mb/s, or at least about 100 Mb/s or mote.

Figure 7A:
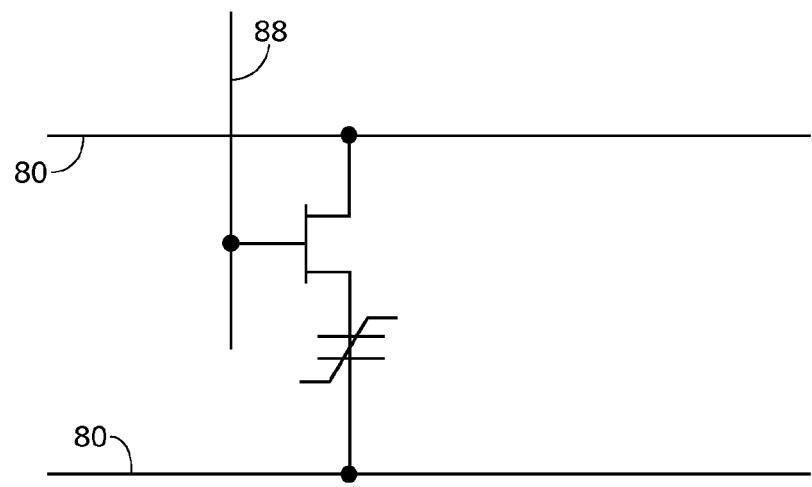
FIGS. 7A-7D illustrate various memory architectures, useful in certain embodiment of the invention.
Figure 7B:
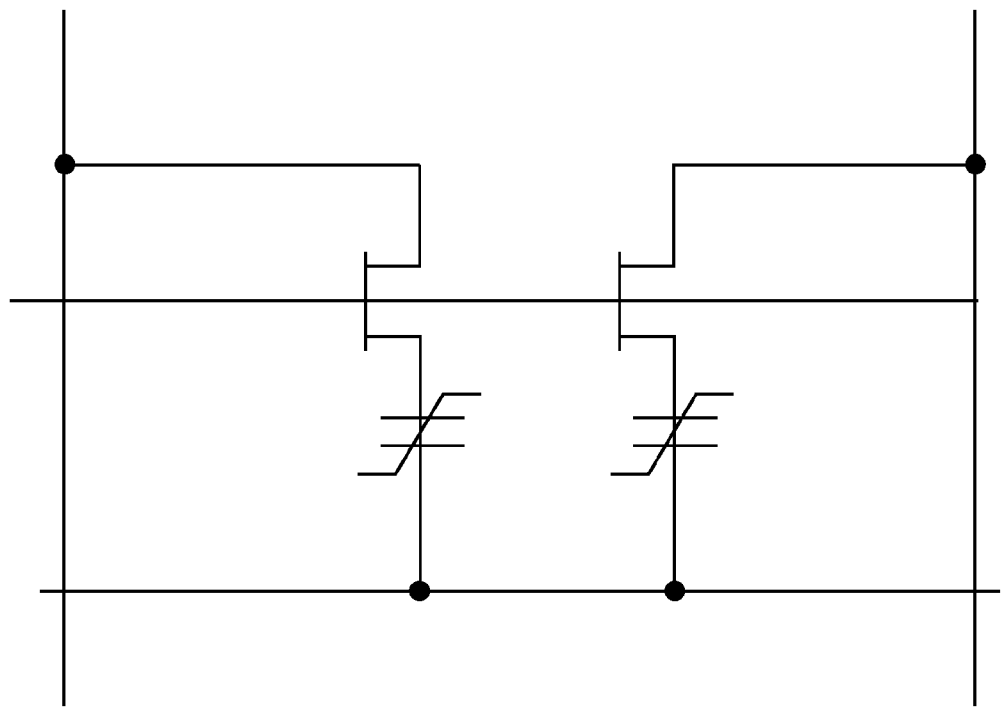
Figure 7C:
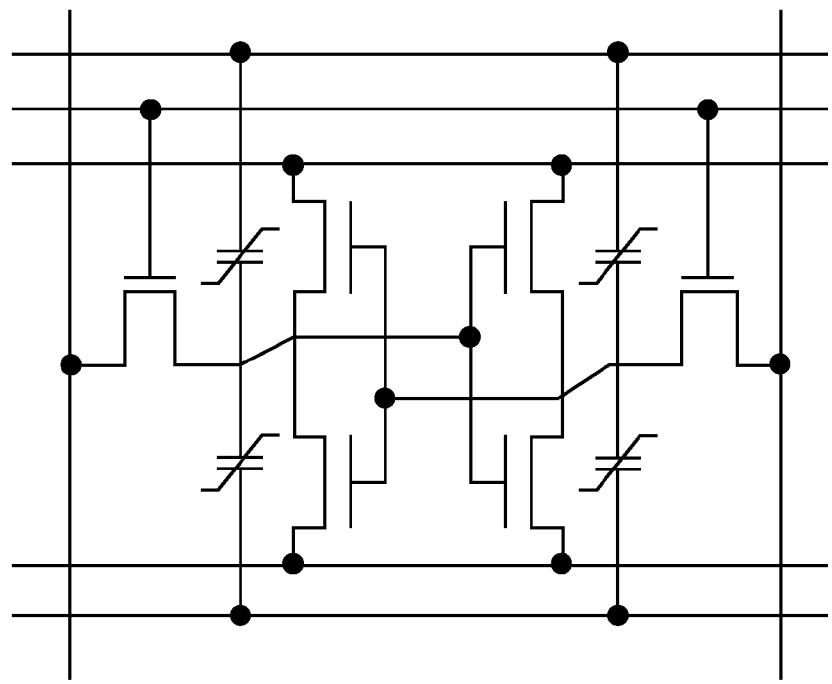
Figure 7D:
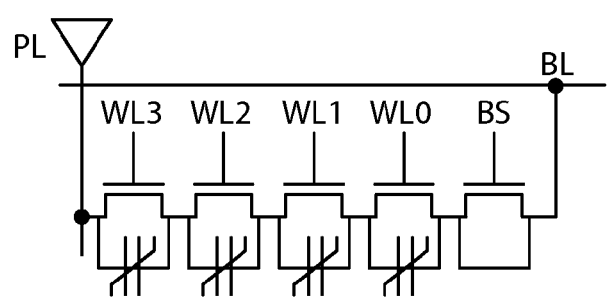

In still another set of embodiments, a nanoscale wire of the invention may be used as part of a ferroelectric random-access memory (FeRAM) component, for example, as part of a "smart" card, a radiofrequency identification (RFID) tag, or the like. For example, one or more nanoscale wires may be used in certain memory architectures. For example, the nanoscale wire may be used in a 1T1C architecture (one transistor "T"/one capacitor "C") (e.g., as shown in FIG. 7A), a 2T2C architecture (e.g., as shown in FIG. 7B), a 8T4C architecture (e.g., as shown in FIG. 7C), a chain architecture (e.g., as shown in FIG. 7D), a 6T4C architecture, or the like. Those of ordinary skill in the art will understand techniques for using memory architectures such as these; as an example, in a 1T1C architecture as is shown in FIG. 7A to encode a polarization state, voltage may be applied to bit line 80, while plate line 85 is grounded; a depolarization state may be encoded by applying voltage to plate line 85 while grounding bit line 80; and the polarization state may be determined by applying a voltage to plate line 85 while floating bit line 80 and measuring word line 88.

In yet other embodiments, the invention includes devices such as field effect transistors (FETs), bipolar junction transistors (BJTs), tunnel diodes, modulation doped superlattices, complementary inverters, light emitting devices, light sensing devices, biological system imagers, biological and chemical detectors or sensors, thermal or temperature detectors, Josephine junctions; nanoscale light sources, photodetectors such as polarization-sensitive photodetectors, gates, inverters, AND, NAND, NOT, OR, TOR, and NOR gates, latches, flip-flops, registers, switches, clock circuitry, static or dynamic memory devices and arrays, state machines, gate arrays, and any other dynamic or sequential logic or other digital devices including programmable circuits that use any of the nanoscale wire embodiments described herein. Also included are analog devices and circuitry, including but not limited to, amplifiers, switches and other analog circuitry using active transistor devices or switch devices, as well as mixed signal devices and signal processing circuitry. In some embodiments, the nanoscale wires of the present invention may be manufactured during the device fabrication process. In other embodiments, the nanoscale wires of the present inventions may first be synthesized, then assembled in a device.

Another aspect of the invention provides for the fabrication of any of the embodiments described herein. For example, one set of embodiments provides a method of depositing a material on a nanoscale wire (or other nanostructure) to form a region that is electrically-polarizable. Another set of embodiments provides a method of depositing a ferroelectric oxide material on a nanoscale wire to form a region comprising the ferroelectric oxide material. Yet another set of embodiments provides a method of depositing a functional oxide material on a nanoscale wire to form a region comprising the functional oxide material. Still another set of embodiments provides a method of depositing a material comprising a perovskite crystal structure and/or an ilmenite crystal structure on a nanoscale wire. Yet another set of embodiments provides a method of depositing a material having a dielectric constant of at least about 15 on a nanoscale wire. Another set of embodiments provides a method of depositing a metal on a nanoscale wire. Combinations of these embodiments are also possible in some cases. For instance, in certain embodiments, one or more materials may be deposited on the nanoscale wire to form one or more shells, each of which at least partially surrounding the nanoscale wire. In some instances, the nanoscale wire may be not immobilized, relative to a substrate, e.g., the nanoscale wire is not permanently attached to a substrate.

Figure 11:
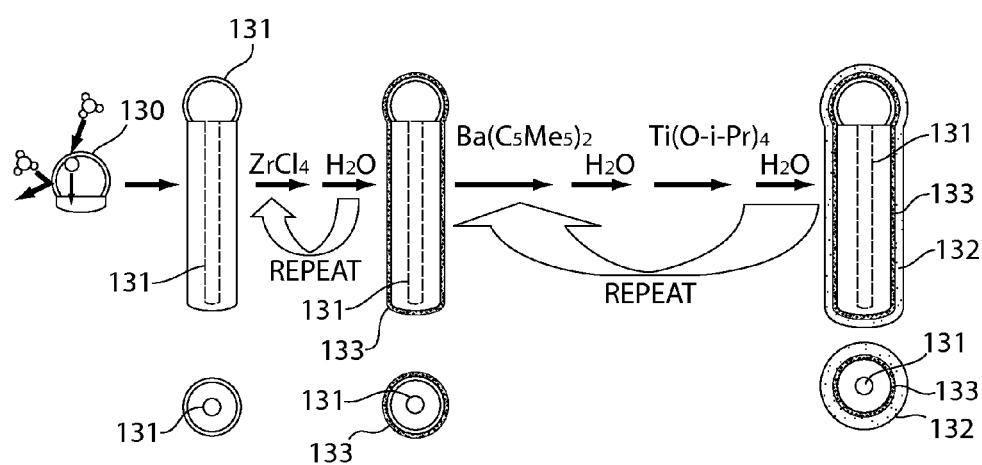
FIG. 11 illustrates a method of fabricating certain nanoscale wires of the invention, according to yet another embodiment.

In certain cases, a material may be deposited using atomic layer deposition, using suitable precursor materials. Those of ordinary skill in the art will be able to determine suitable precursor materials, depending on the particular nanoscale wire to be synthesized. For example, water may be used as an oxygen source, zirconium chloride may be used as a zirconium source, barium bis(pentamethylcyclopentadienyl) may be used as a barium source, titanium tetraisopropoxide may be used as a titanium source, etc., to deposit a material on a nanoscale wire using atomic layer deposition. More than one source may be used, simultaneously or sequentially, in some cases. For example, to deposit $BaTiO_3$ on a nanoscale wire, barium bis(pentamethylcyclopentadienyl), and titanium tetraisopropoxide may be supplied on an alternating basis during an atomic layer deposition process. In one embodiment, an atomic layer deposition reaction may be performed to deposit material on a substrate (which may be up to one atom in thickness in some cases) by providing the substrate (e.g., a nanoscale wire), applying a pulse of a reactant, followed by a purge. Optionally, additional reactants and/or purges may be applied. The thickness of the deposition layer may be controlled by the number and/or duration of the reactants and/or purge cycles. As one non-limiting example, with reference to FIG. 11, a silicon nanoscale wire 131 may be grown, for example, using chemical vapor deposition techniques (e.g., as shown in FIG. 11, silicon nanoscale wire 131 is grown from a catalyst particle 130 using chemical vapor deposition). To deposit $ZrO_2$ on the silicon nanoscale wire (for example, as a shell 133 at least partially surrounding the nanoscale wire 131, forming a core/shell arrangement, top and side views shown in FIG. 11), $ZrCl_4$ may be used as precursor for Zr, and $H_2O$ may be used as precursor for O. It should be understood that, in this example, the deposition of $ZrO_2$ is not limited to the use of $ZrCl_4$ and $H_2O$, and other precursors may be used instead of and/or in conjunction with $ZrCl_4$ and $H_2O$. In this example, $ZrO_2$ may be deposited on the silicon nanoscale wire at any desirable thickness, for example, less than 5 nm, or 2 to 3 nm thick. To deposit $BaTiO_3$ (for example, on the $ZrO_2$ and/on a silicon nanoscale wire, for instance, as is shown in FIG. 11, where $BaTiO_3$ may be deposited as a shell 132 surrounding the $ZrO_2$ shell 133 and the silicon core 131), barium bis(pentamethylcyclopentadienyl) $(Ba(C_5Me_5)_2)$ may be used as a precursor for Ba, titanium tetraisopropoxide $(Ti(O-iPr)_4)$ may be used as a precursor for Ti, and $H_2O$ may be used as a precursor for O. As before, it should be understood that the deposition of $BaTiO_3$ is not limited to the use of these compounds, and other precursors may be used instead and/or in conjunction with these. In this example, $BaTiO_3$ may be deposited on the silicon nanoscale wire at any desirable thickness, for example, at a thickness of 10-30 nm.

Other techniques useful for fabricating nanoscale wires include, but are not limited to, vapor phase reactions (e.g., chemical vapor deposition ("CVD") techniques such as metal-catalyzed CVD techniques, catalytic chemical vapor deposition ("C-CVD") techniques, organometallic vapor phase deposition-MOCVD techniques, atomic layer deposition, chemical beam epitaxy, etc.), solution phase reactions (e.g., hydrothermal reactions, solvothermal reactions), physical deposition methods (e.g., thermal evaporation, electron-beam evaporation, laser ablation, molecular beam epitaxy), vapor-liquid-solid ("VLS") growth techniques, laser catalytic growth ("LCG") techniques, surface-controlled chemical reactions, or the like, for instance, as disclosed in Ser. No. 10/196,337, entitled "Nanoscale Wires and Related Devices," filed Jul. 16, 2002, published as Publication No. 2003/0089899 on May 15, 2003, incorporated herein by reference. As a non-limiting example, if a nanoscale wire having a core/shell arrangement is to be fabricated, the core may be fabricated using one of these techniques, and one or more shells may be at least partially coated on at least a portion of the core, for example, using CVD techniques, LCG techniques, atomic layer deposition, or the like.

DEFINITIONS

The following definitions will aid in the understanding of the invention. Certain devices of the invention may include wires or other components of scale commensurate with nanometer-scale wires, which includes nanotubes and nanowires. In some embodiments, however, the invention comprises articles that may be greater than nanometer size (e.g., micrometer-sized). As used herein, "nanoscopic-scale," "nanoscopic," "nanometer-scale," "nanoscale," the "nano-" prefix (for example, as in "nanostructured"), and the like generally refers to elements or articles having widths or diameters of less than about 1 micrometer, and less than about 100 nm in some cases. In all embodiments, specified widths can be a smallest width (i.e. a width as specified where, at that location, the article can have a larger width in a different dimension), or a largest width (i.e. where, at that location, the article has a width that is no wider than as specified, but can have a length that is greater).

The term "plurality," as used herein, means two or more. A "set" of items may include one or more of such items.

The term "fluid" generally refers to a substance that tends to flow and to conform to the outline of its container. Typically, fluids are materials that are unable to withstand a static shear stress. When a shear stress is applied to a fluid, it experiences a continuing and permanent distortion. Typical fluids include liquids and gases, but may also include free-flowing solid particles, viscoelastic fluids, and the like.

As used herein, a "wire" generally refers to any material having a conductivity of or of similar magnitude to any semiconductor or any metal, and in some embodiments may be used to connect two electronic components such that they are in electronic communication with each other. For example, the terms "electrically conductive" or a "conductor" or an "electrical conductor" when used with reference to a "conducting" wire or a nanoscale wire, refers to the ability of that wire to pass charge. Typically, an electrically conductive nanoscale wire will have a resistivity comparable to that of metal or semiconductor materials, and in some cases, the electrically conductive nanoscale wire may have lower resistivities, for example, a resistivity lower than about $10^{-3}$ Ohm m, lower than about $10^{-4}$ Ohm m, or lower than about $10^{-6}$ Ohm m or $10^{-7}$ Ohm m.

A "nanoscopic wire" (also known herein as a "nanoscopic-scale wire" or "nanoscale wire") generally is a wire, that at any point along its length, has at least one cross-sectional dimension and, in some embodiments, two orthogonal cross-sectional dimensions less than 1 micron, less than about 500 nm, less than about 200 nm, less than about 150 nm, less than about 100 nm, less than about 70, less than about 50 nm, less than about 20 nm, less than about 10 nm, or less than about 5 nm. In other embodiments, the cross-sectional dimension can be less than 2 nm or 1 nm. In one set of embodiments, the nanoscale wire has at least one cross-sectional dimension ranging from 0.5 nm to 100 nm or 200 nm. In some cases, the nanoscale wire is electrically conductive. In some embodiments, the nanoscale wire is cylindrical. In other embodiments, however, the nanoscale wire can be faceted, i.e., the nanoscale wire may have a polygonal cross-section. Where nanoscale wires are described having, for example, a core and a shell, the above dimensions generally relate to those of the core. The cross-section of a nanoscopic wire may be of any arbitrary shape, including, but not limited to, circular, square, rectangular, annular, polygonal, or elliptical, and may be a regular or an irregular shape. The nanoscale wire may be solid or hollow. Any nanoscale wire can be used in any of the embodiments described herein, including carbon nanotubes, molecular wires (i.e., wires formed of a single molecule), nanorods, nanowires, nanowhiskers, organic or inorganic conductive or semiconducting polymers, and the like, unless otherwise specified. Other conductive or semiconducting elements that may not be molecular wires, but are of various small nanoscopic-scale dimensions, can also be used in some instances, e.g. inorganic structures such as main group and metal atom-based wire-like silicon, transition metal-containing wires, gallium arsenide, gallium nitride, indium phosphide, germanium, cadmium selenide, etc. A wide variety of these and other nanoscale wires can be grown on and/or applied to surfaces in patterns useful for electronic devices in a manner similar to techniques described herein involving the specific nanoscale wires used as examples, without undue experimentation. The nanoscale wires, in some cases, may be formed having dimensions of at least about 1 micrometer, at least about 3 micrometers, at least about 5 micrometers, or at least about 10 micrometers or about 20 micrometers in length, and can be less than about 100 nm, less than about 80 nm, less than about 60 nm, less than about 40 nm, less than about 20 nm, less than about 10 nm, or less than about 5 nm in thickness (height and width). The nanoscale wires may have an aspect ratio (length to thickness) of greater than about 2:1, greater than about 3:1, greater than about 4:1, greater than about 5:1, greater than about 10:1, greater than about 25:1, greater than about 50:1, greater than about 75:1, greater than about 100:1, greater than about 150:1, greater than about 250:1, greater than about 500:1, greater than about 750:1, or greater than about 1000:1 or more in some cases.

A "nanowire" (e.g. comprising silicon and/or another semiconductor material) is a nanoscopic wire that is typically a solid wire, and may be elongated in some cases. Preferably, a nanowire (which is abbreviated herein as "NW") is an elongated semiconductor, i.e., a nanoscale semiconductor. A "non-nanotube nanowire" is any nanowire that is not a nanotube. In one set of embodiments of the invention, a non-nanotube nanowire having an unmodified surface can be used in any arrangement of the invention described herein in which a nanowire or nanotube can be used.

As used herein, a "nanotube" (e.g. a carbon nanotube) is a nanoscopic wire that is hollow, or that has a hollowed-out core, including those nanotubes known to those of ordinary skill in the art. "Nanotube" is abbreviated herein as "NT." Nanotubes are used as one example of small wires for use in the invention and, in certain embodiments, devices of the invention include wires of scale commensurate with nanotubes.

As used herein, an "elongated" article (e.g. a semiconductor or a section thereof) is an article for which, at any point along the longitudinal axis of the article, the ratio of the length of the article to the largest width at that point is greater than 2:1.

As used herein, a "width" of an article is the distance of a straight line from a point on a perimeter of the article, through the center of the article, to another point on the perimeter of the article. As used herein, a "width" or a "cross-sectional dimension" at a point along a longitudinal axis of an article is the distance along a straight line that passes through the center of a cross-section of the article at that point and connects two points on the perimeter of the cross-section. The "cross-section" at a point along the longitudinal axis of an article is a plane at that point that crosses the article and is orthogonal to the longitudinal axis of the article. The "longitudinal axis" of an article is the axis along the largest dimension of the article. Similarly, a "longitudinal section" of an article is a portion of the article along the longitudinal axis of the article that can have any length greater than zero and less than or equal to the length of the article. Additionally, the "length" of an elongated article is a distance along the longitudinal axis from end to end of the article.

As used herein, a "cylindrical" article is an article having an exterior shaped like a cylinder, but does not define or reflect any properties regarding the interior of the article. In other words, a cylindrical article may have a solid interior, may have a hollowed-out interior, etc. Generally, a cross-section of a cylindrical article appears to be circular or approximately circular, but other cross-sectional shapes are also possible, such as a hexagonal shape. The cross-section may have any arbitrary shapes including, but not limited to, square, rectangular, or elliptical. Regular and irregular shapes are also included.

As used herein, an "array" of articles (e.g., nanoscopic wires) comprises a plurality of the articles, for example, a series of aligned nanoscale wires, which may or may not be in contact with each other. As used herein, a "crossed array" or a "crossbar array" is an array where at least one of the articles contacts either another of the articles or a signal node (e.g., an electrode).

Many nanoscopic wires as used in accordance with the present invention are individual nanoscopic wires. As used herein, "individual nanoscopic wire" means a nanoscopic wire free of contact with another nanoscopic wire (but not excluding contact of a type that may be desired between individual nanoscopic wires, e.g., as in a crossbar array). For example, an "individual" or a "free-standing" article may, at some point in its life, not be attached to another article, for example, with another nanoscopic wire, or the free-standing article may be in solution. This is in contrast to nanotubes produced primarily by laser vaporization techniques that produce materials formed as ropes having diameters of about 2 nm to about 50 nm or more and containing many individual nanotubes (see, for example, Thess, et al., "Crystalline Ropes of Metallic Carbon Nanotubes," Science, 273:483-486 (1996)). This is also in contrast to conductive portions of articles which differ from surrounding material only by having been altered chemically or physically, in situ, i.e., where a portion of a uniform article is made different from its surroundings by selective doping, etching, etc. An "individual" or a "free-standing" article is one that can be (but need not be) removed from the location where it is made, as an individual article, and transported to a different location and combined with different components to make a functional device such as those described herein and those that would be contemplated by those of ordinary skill in the art upon reading this disclosure.

In some embodiments, at least a portion of a nanoscopic wire may be a bulk-doped semiconductor. As used herein, a "bulk-doped" article (e.g. an article, or a section or region of an article) is an article for which a dopant is incorporated substantially throughout the crystalline lattice of the article, as opposed to an article in which a dopant is only incorporated in particular regions of the crystal lattice at the atomic scale, for example, only on the surface or exterior. For example, some articles such as carbon nanotubes are typically doped after the base material is grown, and thus the dopant only extends a finite distance from the surface or exterior into the interior of the crystalline lattice. It should be understood that "bulk-doped" does not define or reflect a concentration or amount of doping in a semiconductor, nor does it necessarily indicate that the doping is uniform. In particular, in some embodiments, a bulk-doped semiconductor may comprise two or more bulk-doped regions. Thus, as used herein to describe nanoscopic wires, "doped" refers to bulk-doped nanoscopic wires, and, accordingly, a "doped nanoscopic (or nanoscale) wire" is a bulk-doped nanoscopic wire. "Heavily doped" and "lightly doped" are terms the meanings of which are clearly understood by those of ordinary skill in the art. In some cases, one or more regions may comprise a single monolayer of atoms ("delta-doping"). In certain cases, the region may be less than a single monolayer thick (for example, if some of the atoms within the monolayer are absent). As a specific example, the regions may be arranged in a layered structure within the nanoscale wire, and one or more of the regions may be delta-doped or partially delta-doped.

As used herein, the term "Group," with reference to the Periodic Table, is given its usual definition as understood by one of ordinary skill in the art. For instance, the Group II elements include Mg and Ca, as well as the Group II transition elements, such as Zn, Cd, and Hg. Similarly, the Group III elements include B, Al, Ga, In and Tl; the Group IV elements include C, Si, Ge, Sn, and Pb; the Group V elements include N, P, As, Sb and Bi; and the Group VI elements include O, S, Se, Te and Po. Combinations involving more than one element from each Group are also possible. For example, a Group II-VI material may include at least one element from Group II and at least one element from Group VI, for example, ZnS, ZnSe, ZnSSe, ZnCdS, CdS, or CdSe. Similarly, a Group III-V material may include at least one element from Group III and at least one element from Group V, for example GaAs, GaP, GaAsP, InAs, InP, AlGaAs, or InAsP. Other dopants may also be included with these materials and combinations thereof, for example, transition metals such as Fe, Co, Te, Au, and the like.

As used herein, a "semiconductor" is given its ordinary meaning in the art, i.e., an element having semiconductive or semi-metallic properties (i.e., between metallic and non-metallic properties). An example of a semiconductor is silicon. Other non-limiting examples include elemental semiconductors, such as gallium, germanium, diamond (carbon), tin, selenium, tellurium, boron, or phosphorous. The semiconductor may be undoped or doped (e.g., p-type or n-type).

As used herein, a "single crystal" item (e.g., a semiconductor) is an item that has covalent bonding, ionic bonding, or a combination thereof throughout the item. Such a single crystal item may include defects in the crystal, but is distinguished from an item that includes one or more crystals, not ionically or covalently bonded, but merely in close proximity to one another.

The following U.S. provisional and utility patent application documents are incorporated herein by reference in their entirety for all purposes: Ser. No. 60/633,733, entitled "Nanoscale Wire Based Data Storage," filed Dec. 6, 2004;

Ser. No. 60/142,216, entitled "Molecular Wire-Based Devices and Methods of Their Manufacture," filed Jul. 2, 1999; Ser. No. 60/226,835, entitled, "Semiconductor Nanowires," filed Aug. 22, 2000; Ser. No. 10/033,369, entitled "Nanoscopic Wire-Based Devices and Arrays," filed Oct. 24, 2001, published as Publication No 2002/0130353 on Sep. 19, 2002; Ser. No. 60/254,745, entitled, "Nanowire and Nanotube Nanosensors," filed Dec. 11, 2000; Ser. No. 60/292,035, entitled "Nanowire and Nanotube Nanosensors," filed May 18, 2001; Ser. No. 60/292,121, entitled, "Semiconductor Nanowires," filed May 18, 2001; Ser. No. 60/292,045, entitled "Nanowire Electronic Devices Including Memory and Switching Devices," filed May 18, 2001; Ser. No. 60/291,896, entitled "Nanowire Devices Including Emissive Elements and Sensors," filed May 18, 2001; Ser. No. 09/935,776, entitled "Doped Elongated Semiconductors, Growing Such Semiconductors, Devices Including Such Semiconductors, and Fabricating Such Devices," filed Aug. 22, 2001, published as Publication No. 2002/0130311 on Sep. 19, 2002; Ser. No. 10/020,004, entitled "Nanosensors," filed Dec. 11, 2001, published as Publication No. 2002/0117659 on Aug. 29, 2002; Ser. No. 60/348,313, entitled "Transistors, Diodes, Logic Gates and Other Devices Assembled from Nanowire Building Blocks," filed Nov. 9, 2001; Ser. No. 60/354,642, entitled "Nanowire Devices Including Emissive Elements and Sensors," filed Feb. 6, 2002; Ser. No. 10/152,490, entitled, "Nanoscale Wires and Related Devices," filed May 20, 2002; Ser. No. 10/196,337, entitled, "Nanoscale Wires and Related Devices," filed Jul. 16, 2002, published as Publication No. 2003/0089899 on May 15, 2003; Ser. No. 60/397,121, entitled "Nanowire Coherent Optical Components," filed Jul. 19, 2002; Ser. No. 10/624,135, entitled "Nanowire Coherent Optical Components," filed Jul. 21, 2003; Ser. No. 60/524,301, entitled, "Nanoscale Arrays and Related Devices," filed Nov. 20, 2003; Ser. No. 60/397,121, entitled "Nanowire Coherent Optical Components," filed Dec. 11, 2003; Ser. No. 60/544,800, entitled "Nanostructures Containing Metal-Semiconductor Compounds," filed Feb. 13, 2004; Ser. No. 10/347,121, entitled, "Array-Based Architecture for Molecular Electronics," filed Jan. 17, 2003; Ser. No. 10/627,405, entitled "Stochastic Assembly of Sublithographic Nanoscale Interfaces," filed Jul. 24, 2003; Ser. No. 10/627,406, entitled "Sublithographic Nanoscale Memory Architecture," filed Jul. 24, 2003; Ser. No. 60/524,301, entitled "Nanoscale Arrays and Related Devices," filed Nov. 20, 2003; Ser. No. 60/551,634, entitled "Robust Nanostructures," filed Mar. 8, 2004; and a patent application entitled "Nanoscale Arrays, Robust Nanostructures, and Related Devices," filed Nov. 22, 2004. The following International Patent Publication is incorporated herein by reference in their entirety for all purposes: Application Serial No. PCT/US00/18138, entitled "Nanoscopic Wire-Based Devices, Arrays, and Methods of Their Manufacture," filed Jun. 30, 2000, published as Publication No. WO 01/03208 on Jan. 11, 2001; Application Serial No. PCT/US01/26298, entitled "Doped Elongated Semiconductors, Growing Such Semiconductors, Devices Including Such Semiconductors, and Fabricating Such Devices," filed Aug. 22, 2001, published as Publication No. WO 02/17362 on Feb. 28, 2002; Application Serial No. PCT/US01/48230, entitled "Nanosensors," filed Dec. 11, 2001, published as Publication No. WO 02/48701 on Jun. 20, 2002; Application Serial No. PCT/US02/16133, entitled "Nanoscale Wires and Related Devices," filed May 20, 2002, published as Publication No. WO 03/005450 on Jan. 16, 2003.

The following examples are intended to illustrate certain embodiments of the present invention, but do not exemplify the full scope of the invention.

EXAMPLE 1

This example demonstrates the synthesis of semiconductor/dielectric oxide/ferroelectric oxide core/shell/shell nanoscale wire structure, specifically p-Si/$ZrO_2$/$BaTiO_3$ core/shell/shell nanoscale wires (FIG. 1A), according to one embodiment of the invention. In this example, the shells were fabricated using ALD techniques (atomic layer deposition), but other techniques, for example, solution-based approaches, can be used as well.

The synthesis starts from chemical vapor deposition growth of p-type silicon nanoscale wires using gold colloids as a catalyst, silane as a reactant, and diborane as a dopant in the well-known VLS growth process. After growth, the growth wafer was transferred directly into an atomic layer deposition reactor. $ZrO_2$ high-K dielectric oxide was deposited onto the Si nanoscale wires to make p-Si/$ZrO_2$ core/shell nanoscale wires by using $ZrCl_4$ as a Zr source and water vapor as an oxygen source. $ZrO_2$ can function as a high-K dielectric, which can enhance performance of the Si nanoscale wire field-effect transistor by providing a stronger electric field coupling between the Si channel and the metal gate of the transistor. $ZrO_2$ may also be effective as a diffusion barrier to stop compositional diffusion from $BaTiO_3$ towards Si. $ZrO_2$ may also help to achieve a longer retention time by reducing the speed of degradation/lose of data stored in $BaTiO_3$ shell (also known as depolarization time). In some cases, $ZrO_2$ may be chemically etched away, which may allow ohmic contacts to be made with the Si nanoscale wire core. However, in other embodiments, other dielectric oxides can also be used, for example, $Al_2O_3$ and/or $HfO_2$, and in some cases, more than one dielectric oxide may be used, for example, $ZrO_2$ and $Al_2O_3$, $ZrO_2$ and $HfO_2$, etc.

After depositing about 2 nm to about 3 nm of $ZrO_2$ on the Si nanoscale wire core, the precursors were changed to allow for the deposition of $BaTiO_3$ on the Si/$ZrO_2$ core/shell nanoscale wires to make the final Si/$ZrO_2$/$BaTiO_3$ core/shell/shell nanoscale wire. The precursors used in this example were barium bis(pentamethylcyclopentadienyl) as the barium source, titanium tetraisopropoxide as the titanium source, and water vapor as the oxygen source.

Examples of nanoscale wires produced using these techniques are illustrated in FIG. 9. FIG. 9A is a low resolution transmission electron microscope (TEM) image of several Si/$ZrO_2$/$BaTiO_3$ nanoscale wires. In this image, the Si core thickness was found to be around 20 nm, the $ZrO_2$ shell thickness was found to be around 2.5 nm, and the $BaTiO_3$ thickness was found to be around 15 nm. A higher resolution TEM image is shown in FIG. 9B. In this figure, the white dashed lines indicate the $BaTiO_3$/$ZrO_2$ interface (left) and the $ZrO_2$/Si interface (right). From two-dimensional Fourier transforms of the lattice resolved image shown in FIG. 9B, it was found that tetragonal phase $BaTiO_3$ grew along the (010) direction, with the zone axis at [010] (FIG. 9C). Additionally, tetragonal phase $ZrO_2$ grew along the (112) direction, with the zone axis at [110] (FIG. 9D), and cubic phase Si grew along the (110) direction, with the zone axis at [111] (FIG. 9E).

After synthesis, the core/shell/shell nanoscale wires were characterized by elemental mapping. FIG. 1C shows a scanning transmission electron microscopy image of the core/shell/shell wire and FIG. 1B shows a line profile of elemental composition of Ba/Ti, Zr, and Si across the wire (transversely). Additional evidence was obtained from elemental mapping measurements, shown in FIGS. 1D-1F. Si was present in the core (FIG. 1D), $ZrO_2$ was present in the inner shell (FIG. 1E), and $BaTiO_3$ was present in the outer shell (FIG. 1F).

Electrostatic force microscopy was used to characterize the ferroelectric behavior of the core/shell/shell wires. In these experiments, a conductive atomic force microscopy tip was used to apply a local electric field on $BaTiO_3$ shell of the $Si/ZrO_2/BaTiO_3$ nanoscale wire, and at the same time, ground the Si nanoscale wire core from the source and the drain. In FIG. 2, the conductance of the Si nanoscale wire was measured, sequentially: before polarizing the wire (using positive voltage) (A), after polarizing the wire (using positive voltage) (B), depolarizing the wire (C), after polarizing the wire (using negative voltage) (D), and depolarization (E). These studies showed that after polarizing the wire using positive voltage, the conductance dropped from about $10^{-7}$ S to about $10^{-12}$ S. This polarization could be removed either by naturally depolarizing the wire and/or applying a negative voltage to flip the direction of polarization. Thus, the conductance can be brought back to the original value, or to a higher value.

Figure 3A:
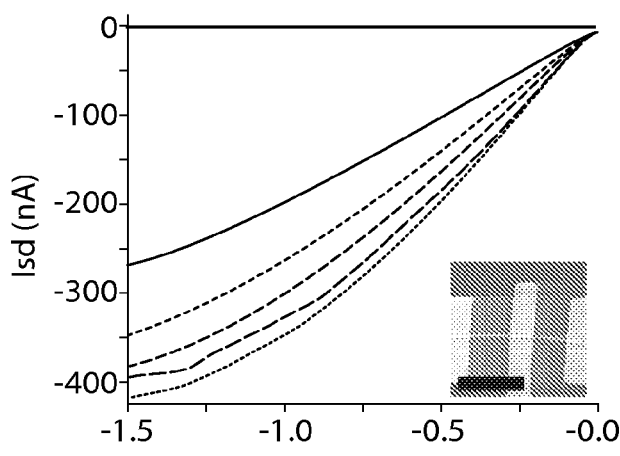
Figure 3B:
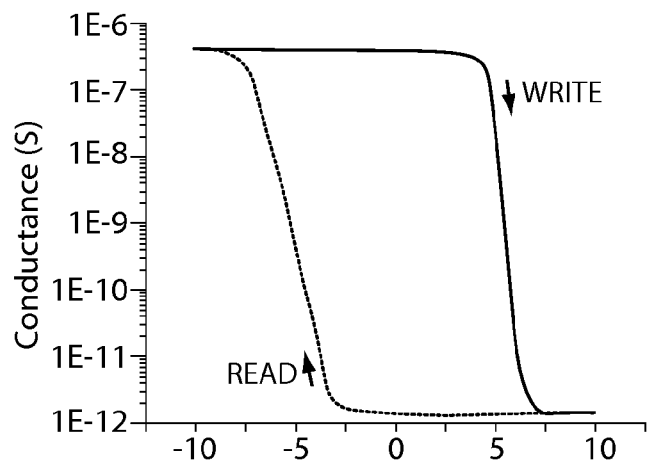

To demonstrate memory devices based on these $Si/ZrO_2/BaTiO_3$ core/shell/shell nanoscale wires, a FET type device was fabricated with source-drain metal contacts on the Si core by chemically etching the $BaTiO_3$ and $ZrO_2$ shells away and adding a top metal gate on the $BaTiO_3$ shell, using techniques analogous to MFIS (Metal gate/Ferroelectric oxide/Insulator/Semiconductor) planar devices. Transport data (FIG. 3A) showed that the source-drain contact was ohmic and the source-drain current could be turned off after the applied top-gate voltage exceeded a certain threshold. Additional measurements of conductance vs. top gate voltage (FIG. 3B) showed a large hysteresis, where one can write polarization into $BaTiO_3$ shell with a top gate voltage larger than the +5 V needed to depolarize the nanoscale wire at the off state (i.e., at low conductance). During reading, if the conductance of the transistor is found to be high, this means that no polarization has been written to the nanoscale wire (e.g., which can be defined to be "0"). However, if the conductance of the transistor is low but it can be increase by applying a pulse of small negative top gate voltage (which is not large enough to remove or alter the polarization), then this means that polarization has been written to the nanoscale wire (e.g., which can be defined to be "1").

Figure 3C:
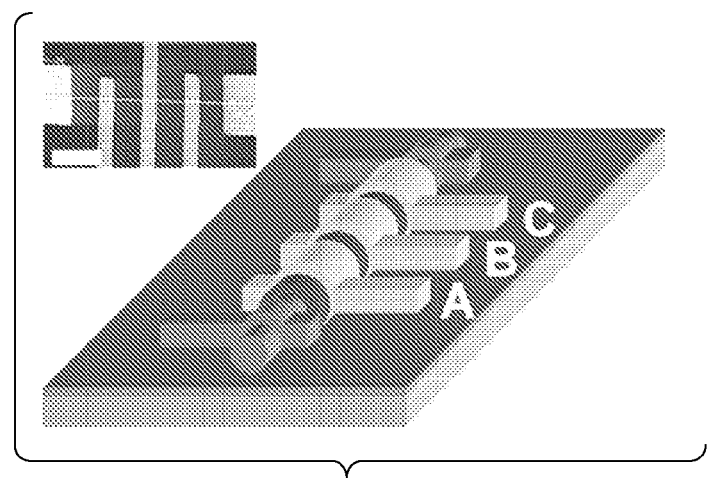

In some cases, these nanoscale wires can be used to store multiple bits of data per transistor. To demonstrate this feature, three metal top gates (A, B, and C) were fabricated onto one $Si/ZrO_2/BaTiO_3$ nanoscale wire (FIG. 3C). Initially, the nanoscale wire was polarized with C only, so the data stored in the nanoscale wire was "001." To read this data, pulses of negative voltage were applied to the three top gates in sequence. FIG. 3D shows that only when the voltage is applied to gate C, there is a response of increasing conductance, thus indicating a "1" rather than a "0" in gate C. Similarly, one can also write data to gates A and B; to read this data, pulses of negative voltage can be applied to the three top gates in sequence. It should be noted that no crosstalk was observed between gates A, B, and C. In FIG. 3E, increasing conductance was observed only when pulses of voltage were simultaneously applied to multiple gates. However, until the pulse of negative voltage is applied at gate A and B at the same time, can one see the response of increasing conductance (FIG. 3e), and thus, there was no crosstalk observed among gates A, B and C. These results are summarized in FIG. 3F. Moreover, a large retention time for this data within the nanoscale wire was observed. In FIG. 3G, no obvious degradation-increasing of conductance after the nanoscale wires had been polarized and the wires were "turned off" with low conductance was detected.

Additional data can be seen in FIG. 10. FIG. 10A illustrates transport results of the $Si/ZrO_2/BaTiO_3$ nanoscale wires, measured at −6 V, −4 V, −2 V, 0 V, 2 V, 4 V, and 6 V top gate voltage. The insert is an AFM image of this device. FIG. 10B is a graph showing a hysteresis loop of conductance vs. top gate voltage. This graph shows two states at a top gate voltage of 0 V. FIG. 10C illustrates the results of a writing/erasing pulse cycle for a memory test using another $Si/ZrO_2/BaTiO_3$ nanoscale wire. Writing to the wire was performed using 5 V with a 100 ns pulse. Monitoring (reading) the conductance change was performed for 150 microsiemans (μS), and erasing was performed at −5 V with a 100 ns pulse, followed by another 150 microsiemans (μS) monitoring (reading) of the conductance change. The insert shows the shape of the 100 ns pulse. FIG. 10D illustrates the conductance change as a result of a writing/erasing pulse showing that memory made by $Si/ZrO_2/BaTiO_3$ nanowires can be operated with a speed of at least 100 ns, which correspond to 10 Mb/s, faster than the speed of a commercial USB2 flash memory drive. Faster speeds, such as 50 nS (20 Mb/s), were also observed in other experiments (data not shown). The graph in FIG. 10E is a retention test of the memory device over a 1-week time period. No significant changes in conductance were observed. FIG. 10F is an electrostatic force microscopy (EFM) image of a device using an 80 nm $Si/ZrO_2/BaTiO_3$ nanoscale wire (30 nm core+25 nm shells), fabricated using techniques similar to those described above, showing a correlation between polarization and conductance. The left image shows the device without any polarization in the $BaTiO_3$ shell, showing a normally "on" state in conductance. The middle image shows the device, using a positive voltage on an atomic force microscope (AFM) tip to write the polarization into the shell to "turn off" the device. The right image shows the device, using a negative voltage on an AFM tip to write the polarization into the shell to "turn on" the device again.

Dense arrays of nanoscale wires are also possible, as ferroelectric states can persist down to the domain thickness of 1.2 nm. In some cases, other nanowires, for example NiSi nanowires as discussed in U.S. Provisional Patent Application Ser. No. 60/544,800, filed Feb. 13, 2004, entitled "Nanostructures Containing Metal-Semiconductor Compounds," by Lieber, et al., or International Patent Application Serial No. PCT/US2005/004459 filed Feb. 14, 2005, entitled "Nanostructures Containing Metal Semiconductor Compounds," by Lieber, et al., each incorporated herein by reference, may be crossed with the $Si/ZrO_2/BaTiO_3$ nanoscale wires to achieve a high density for data storage.

EXAMPLE 2

This example illustrates the fabrication of silicon-functional oxide core-shell nanowire heterostructures by atomic layer deposition (ALD), in which the conformal coating of various materials, including oxides, on silicon nanowires was achieved through cycled self-limiting surface reactions by alternating pulse and purge cycles for different reactants. The thickness of the coating was controlled by the number of deposition cycles down to the atomic scale, and thus, the technique may be suitable for fabricating multi-compositional heterostructures with clean interfaces.

One of the example structures synthesized was a silicon (Si)-zirconium oxide ($ZrO_2$)-barium titanate ($BaTiO_3$) semiconductor-dielectric oxide-ferroelectric oxide core-shellshell nanowire heterostructure (FIG. 12). FIG. 12A shows the deposition of functional oxide shells over p-type silicon nanowires. The synthesis started from the growth of p-type Si nanowires by chemical vapor deposition, followed by vapor phase atomic layer depositions of $ZrO_2$ and $BaTiO_3$ shells with well-controlled deposition rates of 0.03 nm cycle$^{-1}$ for $ZrO_2$ (FIG. 12A, lower line) and 0.05 nm cycle$^{-1}$ for $BaTiO_3$ (FIG. 12A, upper line).

P-type Si nanowires were synthesized via chemical vapor deposition using monodisperse gold nanoclusters (Ted Pella, Inc., Redding, Calif.) as catalysts, silane ($SiH_4$) as a vapor-phase reactant, and diborane ($B_2H_6$) as a dopant precursor. Following synthesis, the growth substrate with uniform diameter, free-standing Si nanowires was loaded into an ASM Microchemistry F120 atomic layer deposition system followed by deposition of $ZrO_2$ and then $BaTiO_3$. Zirconium chloride ($ZrCl_4$) was used as the precursor for $ZrO_2$. Barium bis(pentamethylcyclopentadienyl) ($Ba(C_5Me_5)_2$) and titanium tetraisopropoxide ($Ti(O-i-Pr)_4$) were used as precursors for $BaTiO_3$. In both cases, water ($H_2O$) vapor was used as oxygen source. After the depositions, the substrate was annealed at 800° C. in a tube furnace for 30 minutes. The annealing was carried out in oxygen with flow rate of 200 sccm (standard cubic centimeters per minute) at pressure of 450 Torr.

Transmission electron microscopy (TEM) studies (FIG. 12B) of the samples prepared in this manner showed nanowires with generally uniform diameters and lengths of up to tens of micrometers. For instance, in FIG. 12B, the core-shell nanowire heterostructures had an average diameter of about 60 nm (25 nm Si core, 2.5 nm $ZrO_2$ shell, and 15 nm $BaTiO_3$ shell). The scale bar is 200 nm.

Figure 12A:
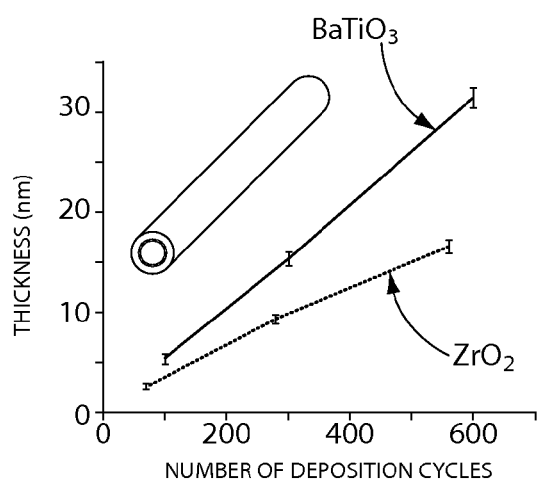
FIGS. 12A-12M illustrate certain nanoscale wires of the invention, according to still another embodiment.
Figure 12B:
Figure 12C:
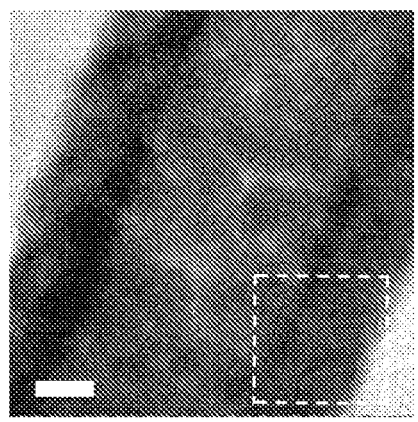
Figure 12D:
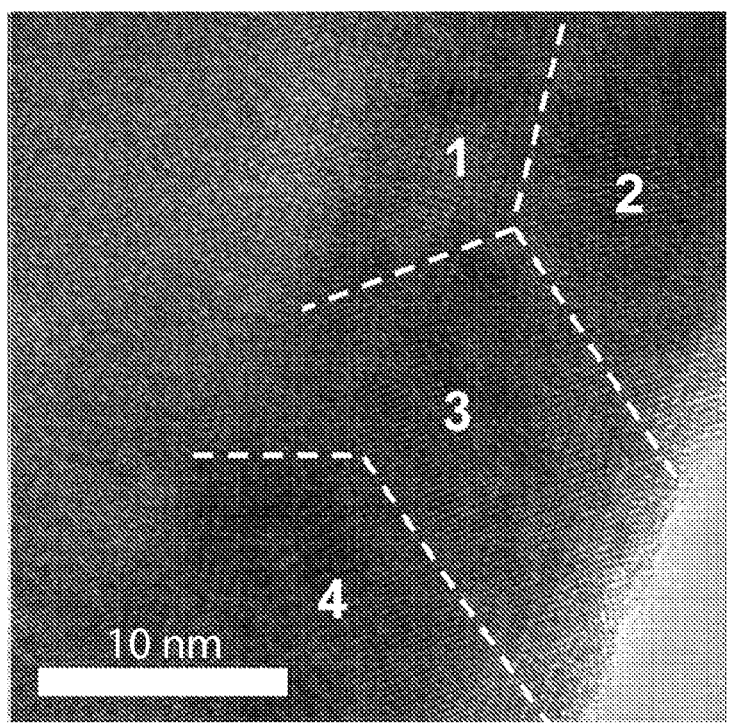
Figure 12E:
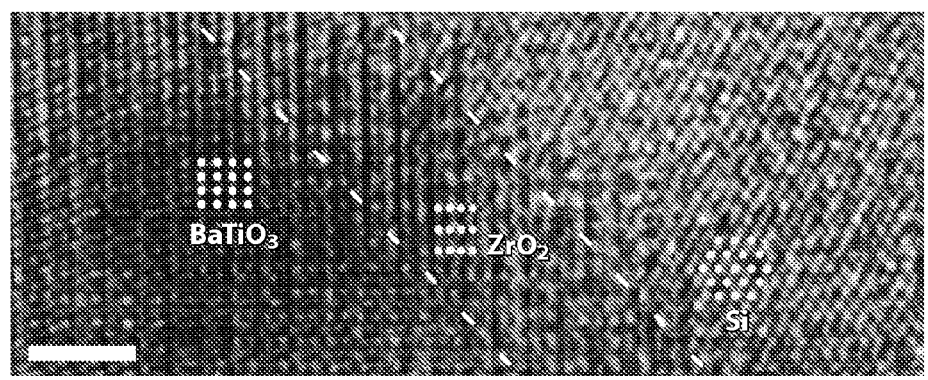
Figures 12F, 12G, 12H, 12I:
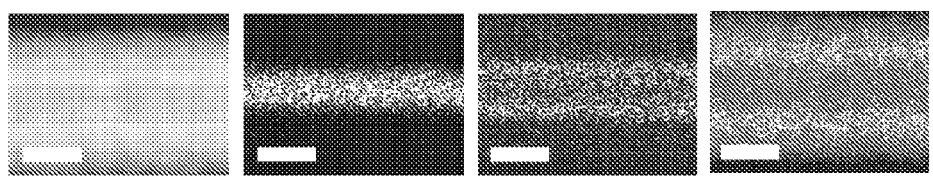
Figure 12J:
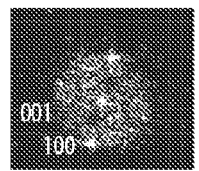
Figure 12K:
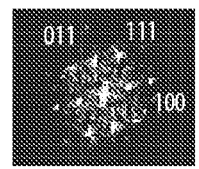
Figure 12L:
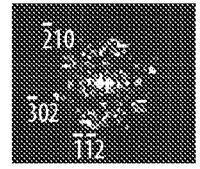
Figure 12M:
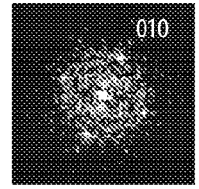
Figure 13A:
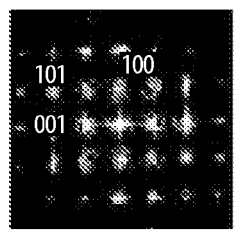
FIGS. 13A-13C illustrate 2DFT plots of certain nanoscale wires according to another embodiment of the invention.
Figure 13B:
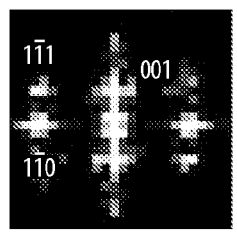
Figure 13C:
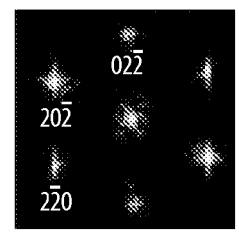

The diametrical contrast observed in the TEM images (FIGS. 12B, 12C, and 12D) as well as scanning TEM (STEM) images (FIG. 12F) may be indicative of a core-shell structure. FIG. 12C is a low magnification TEM projection view of a typical core-shell nanowire. The dashed-line box indicates the view of the TEM image shown in FIG. 12D. The scale bar in FIG. 12C is 10 nm. FIG. 12D shows an HRTEM (High Resolution Transmission Electron Microscopy) projection view of the polycrystalline shell of the nanowire heterostructure, with white dashed lines roughly indicating the crystalline domain boundaries, which are determined by selective-area 2DFT and inverse 2DFT of the shell. The scale bar is 10 nm. High-resolution projection view of the nanowire edge (FIG. 12D) showed a polycrystalline $BaTiO_3$ shell with multiple domains. The domain boundaries (FIG. 12D, white dashed lines) could be roughly identified by selective-area two-dimensional Fourier transforms (2DFT) and inverse Fourier transforms of the TEM image (FIGS. 12J-12M). FIG. 12J is a 2DFT of domain 1 in FIG. 12D, showing that it aligned with zone axis of (010); FIG. 12C is a 2DFT of domain 2 in FIG. 12D, showing that it aligned with zone axis of (011); FIG. 12D is a 2DFT of domain 3, showing that it aligned with zone axis of (243); and FIG. 12E is a 2DFT of the domain 4, showing that it aligned with zone axis of (001). Additionally, FIG. 13A shows a 2DFT of the $BaTiO_3$ region with the zone axis of (010), FIG. 13B shows a 2DFT of the $ZrO_2$ region with the zone axis of (110), and FIG. 13D shows a 2DFT of the Si region with the zone axis of (111).

Further detailed examination of microtomed cross sections of the core-shell nanowire heterostructures by high-resolution TEM (FIG. 12E) demonstrated that the fabrication yielded abrupt interfaces (FIG. 12H, white dashed line) between the $BaTiO_3$ (left) and $ZrO_2$ (middle) shells, and the Si (right) core regions with zone axes of $BaTiO_3$, $ZrO_2$. For example, FIG. 12E is an HRTEM image of the cross section of the microtomed core-shell nanowire heterostructure, with white dashed lines indicating the interfaces among crystalline $BaTiO_3$ (left), $ZrO_2$ (middle) and Si (right) regions with the zone axes of $BaTiO_3$, $ZrO_2$, and Si to be (010), (110), and (111) respectively, from 2DFT of the TEM image. The insets illustrate crystal structures simulations of the $BaTiO_3$ (left), $ZrO_2$ (center), and Si (right) regions along the zone axes showing the consistency with the lattice-resolved image. The scale bar in FIG. 12E is 2 nm.

The zone axes were further confirmed by the consistency between the crystal structures simulations (insets, FIG. 12E) and the lattice-resolved image. $ZrO_2$, which crystallized at relatively lower temperature, served as a diffusion barrier during post-annealing to optimize the interface between the ferroelectric oxide and the semiconductor. Furthermore, energy dispersive X-ray spectroscopy (EDX) performed on the sample confirmed the elemental spatial distribution, showing that Si was localized at the core (FIG. 12G), Zr at the inner shell (FIG. 12H), and Ba and Ti at the outer shell (FIG. 12I). FIGS. 12F-12I are EDX elemental mappings of the core-shell nanowire heterostructure performed by STEM (Scanning Transmission Electron Microscopy). FIG. 12F is a STEM image of a ~122 nm core-shell nanowire heterostructure prepared using ~37 nm Si nanowire as a core with a ~2.5 nm $ZrO_2$ shell and a ~40 nm $BaTiO_3$ shell. The larger core diameter and thicker shell were used here for EDX characterization purposes. In these figures, Si was localized at the core (FIG. 12D), Zr at the inner shell (FIG. 12E), and Ba and Ti at the outer shell (FIG. 12F). The scale bars in FIGS. 12F-12I are each 50 nm.

EXAMPLE 3

Figure 14A:
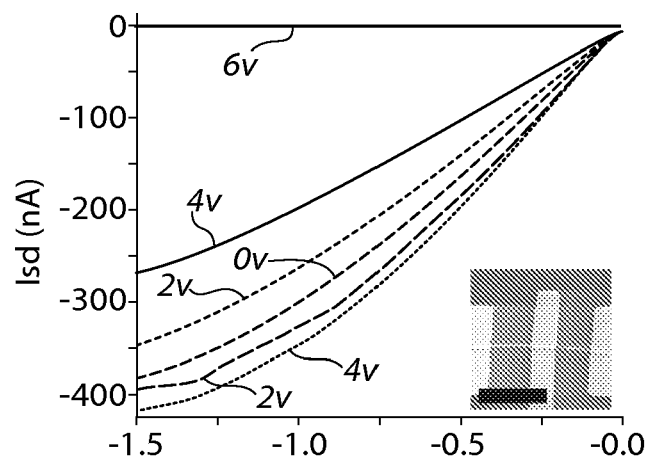
FIGS. 14A-14G illustrate various electrical characteristics of certain nanoscale wires of the invention, in another set of embodiments.

This example illustrates the synthesis of a well-defined semiconductor-functional oxide core-shell nanowire heterostructure with a clean interface. In this example, a field-effect transistor (FET) device was prepared based on a Si/$ZrO_2$/$BaTiO_3$ core-shell nanowire heterostructure (FIG. 14). To form the device, the oxides at the source-drain regions were etched away by hydrogen fluoride (HF) acid, followed by deposition of metal contacts on the p-type Si core. A nickel top gate was fabricated between the source-drain contacts on top of the $BaTiO_3$ shell (inset, FIG. 14A, which is a SEM image showing the device geometry, and source-drain contacts having 3 micrometer separation on the p-type Si nanowire core and an 800 nm wide top gate on the top of the $BaTiO_3$ shell in the middle of the channel). The scale bar in the inset is 2 micrometers. Transport results of current ($I_{sd}$) versus source-drain voltage ($V_{sd}$) data (FIG. 14A) at different gate voltages ($V_{gs}$) obtained from a core-shell nanowire with a total diameter of ~60 nm (25 nm Si core, 2.5 nm $ZrO_2$ shell, and 15 nm $BaTiO_3$ shell) exhibited the behavior expected of a depletion mode p-FET. FIG. 14A illustrates exemplary characteristics for a 60 nm core-shell nanowire heterostructure transistor at different top gate voltage (from bottom to top: −4 V to +6 V, 2 V intervals).

Figure 14B:
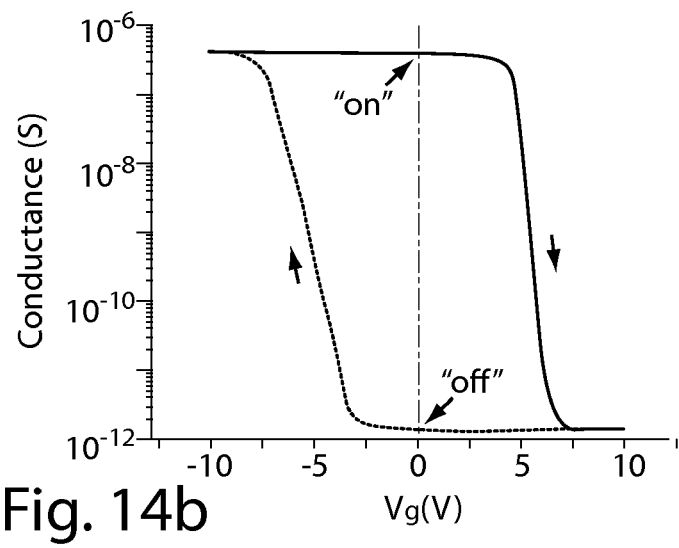

Further measurements of the source-drain conductance versus gate voltage a bias voltage of −1.5 V showed a hysteresis loop in the gate sweep (FIG. 14B). In the hysteresis loop, two bi-stable states were observed around 0 V gate voltages: one at a higher conductive "on" state, and one at a lower conductive "off" state. Switching from "on" to "off" occurred at +5 V, whereas the reverse process occurred at −3 V.

Figure 14C:
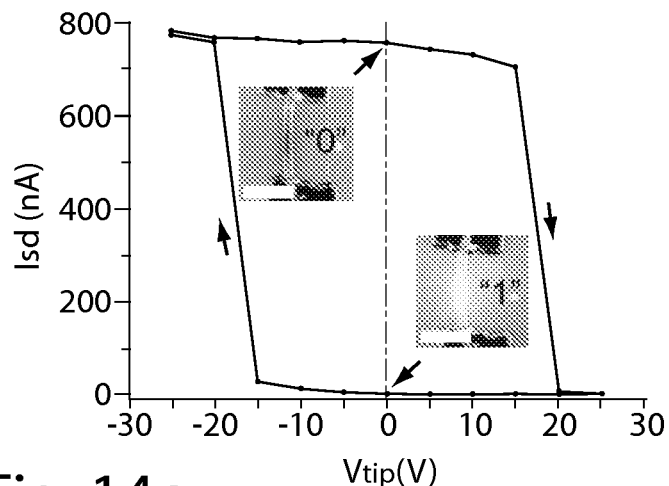
Figure 14D:
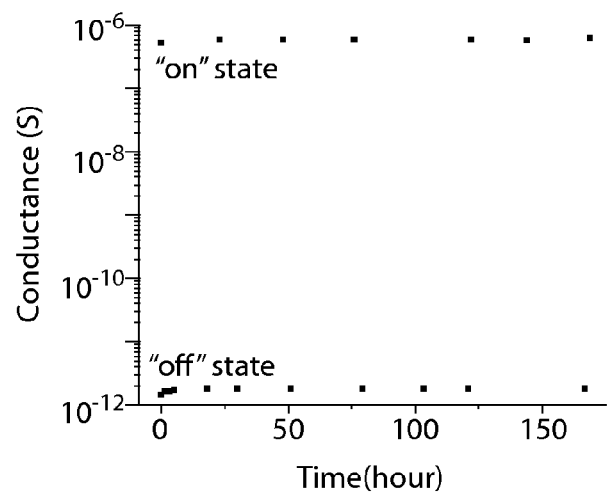

To show that the origin of the hysteresis loop was polarization switching in ferroelectric $BaTiO_3$, electrostatic force microscopy (EFM) measurements were performed on the FET devices without a top gate (FIG. 14C). In FIG. 14C, EFM measurement performed on a FET device without top gate showed that a ferroelectric polarization was generated on the $BaTiO_3$ shell by a gate voltage applied to the conductive AFM tip, which existed until a large enough opposite gate voltage was applied that was sufficient to "flip" the direction of the polarization. The scale bars are 2 micrometers.

In the EFM measurements a conductive AFM tip was used (silicon coated with Pt/Ir) as a local gate to replace the metal top gate. The device was grounded and scanned at the tip voltage to write polarization from −25 V to +25 V and then back to −25 V with 5 V intervals. The tip was kept at a constant height of 6 nm above the topological features during the writing. For EFM imaging of the polarization status, the device was also grounded and the tip was kept at +2 V with a constant height of 30 nm above the topological features. The electrostatic interaction between the $BaTiO_3$ shell and the tip was sensed by the shift of resonant frequency of the tip cantilever. After writing at every data point, the device was biased at −1 V to monitor the conductance change.

These results generally showed that a ferroelectric polarization was locally generated in the $BaTiO_3$ shell by a gate voltage applied on the conductive atomic force microscope (AFM) tip, which was retained until a sufficiently large opposite gate voltage was applied to flip the direction of the polarization. In these experiments, because a positive gate voltages was used to turn "off" the p-type FET device that was normally "on" at large conductances, the two polarization states, which corresponded to the bi-stable states at the gate sweep at 0 V gate voltage, were arbitrarily assigned as "0" for the state with high conductance "on" state (upper inset, FIG. 14C) and "1" for the low conductance "off" state (lower inset, FIG. 14C). The core-shell nanowire heterostructure FET, once turned "off" by the ferroelectric polarization generated by a positive gate voltage, was able to stay in the "off" state for weeks without obvious degradation (lower spots), even after the removal of the external positive gate voltage (FIG. 14D), thereby demonstrating device non-volatility. Similarly, monitoring of the conductance change of a FET device over weeks showed no obvious degradation of the "on" state conductance (upper spots).

Figure 14E:
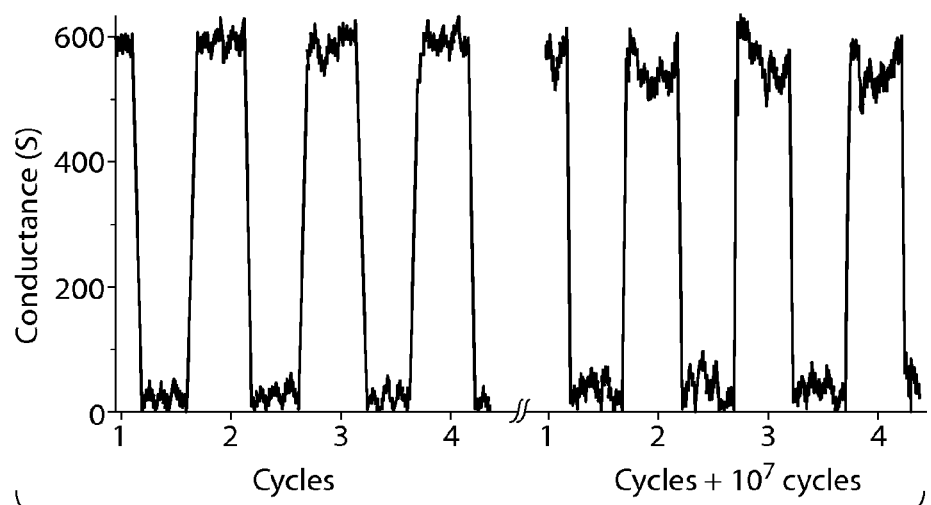

The switching speed and endurance of the core-shell nanowire heterostructure FET device was also characterized (FIG. 14E). These characteristics may be useful for determining the viability of such nanowire structures in integrated non-volatile memory arrays. To measure the switching speed and endurance of the FET device, an Agilent 33220A function and arbitrary waveform generator was connected to the top gate, which gave operation pulses width of 100 ns and amplitude of +7 V and −7 V (actual output +5 V and −5 V at high frequency as measured separately) as writing and erasing pulses in an alternative manner with 150 microsecond interval. The conductance of the FET device was monitored simultaneously through current amplifier, which gave an intrinsic instrument response of 15 microseconds, even when all the filters were turned off. For the endurance measurements, the FET device was continuously switched "on" and "off" using the pulses for one hour with fixed bias at −1 V, which gave an endurance of at least $10^7$ cycles.

An FET device based on the heterostructure discussed above showed that the writing/erasing speed of the ferroelectric polarization was at least 100 ns, using pulses generated by a waveform function generator (insets, FIG. 14E), which were able to switch the FET either "on" or "off." Faster switching speeds of 50 ns were also observed.

The switching behavior was retained without obvious fatigue degradation, even after $10^7$ cycles of writing and erasing (FIG. 14E). The fast switching speed, as well as the long endurance observed in the device, was comparable to planar ferroelectric random access memory devices and superior to many commercially-available flash memories, which typically shows switching speeds of microsecond time scales and endurances of $10^5$ cycles. It is believed that the noise level in the conductance switching data (FIG. 14E) mainly arose from the fact that all of the noise filters were turned off in the current amplifier to achieve the fastest instrument response, which sets an instrumental limit for the reading speed to be 15 microseconds. In fact, even higher reading speeds may be possible. The intrinsic switching speed of the ferroelectric oxides is believed to be on the picosecond time scale, and the writing/erasing/reading speeds observed here were only limited by the RC delay in the measurement circuit, not in the device itself.

Figure 15A:
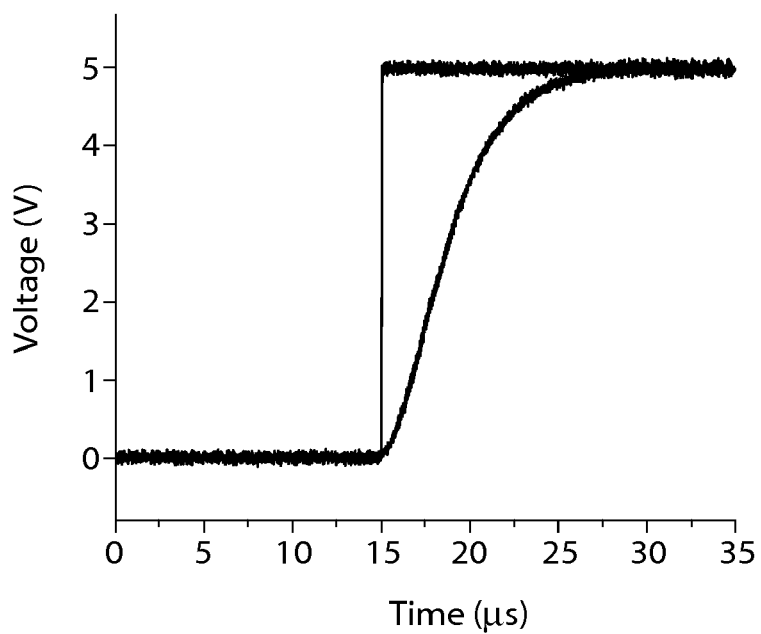
FIGS. 15A-15B illustrate certain response limits of instruments used to measure properties of certain nanoscale wires of the invention.
Figure 15B:
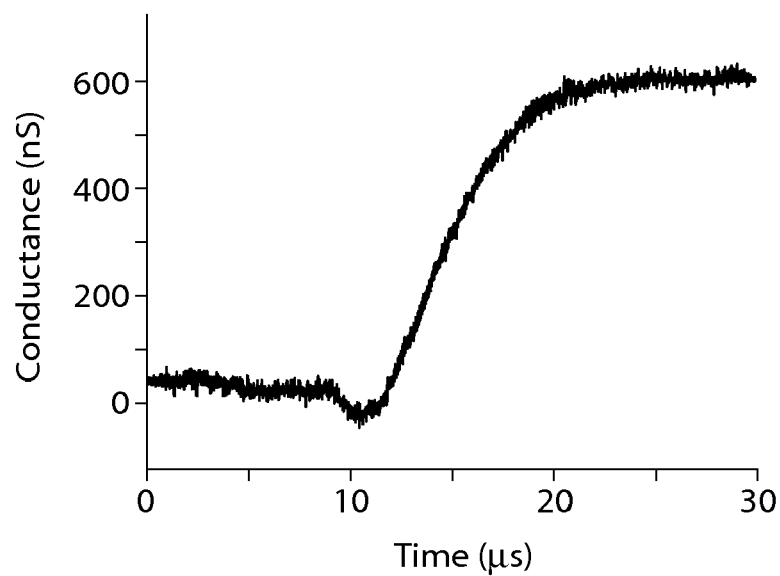
Figure 16A:
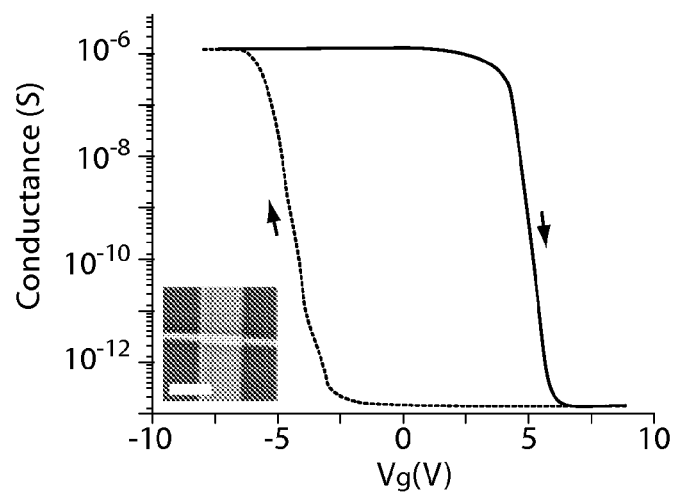
FIGS. 16A-16F illustrate various devices of the invention, having different gate widths, in another set of embodiments of the invention.
Figure 16B:
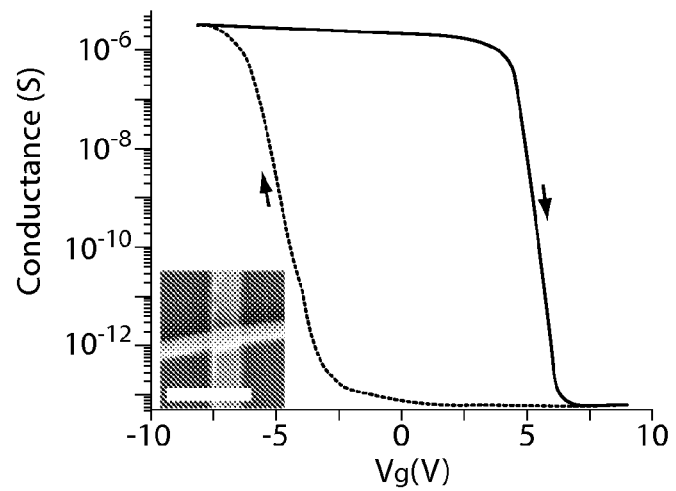
Figure 16C:
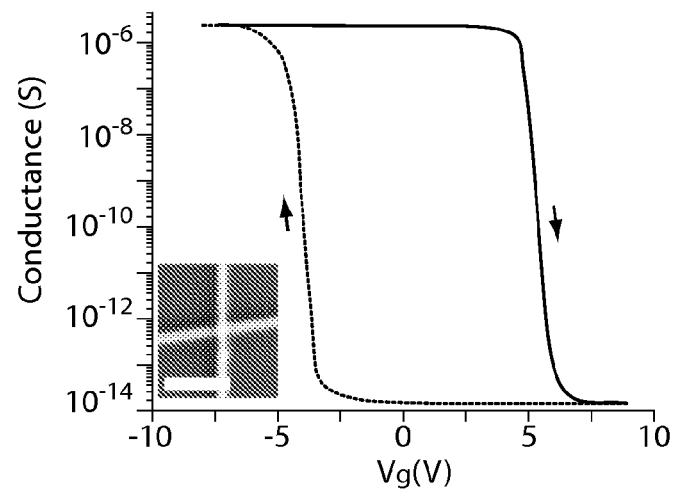
Figure 16D:
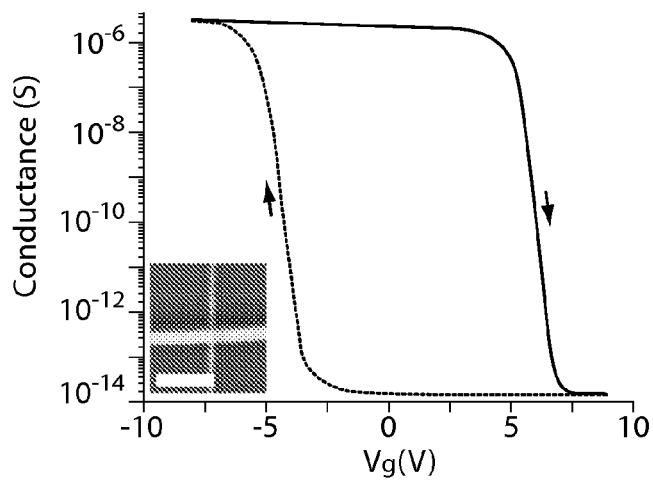
Figure 16E:
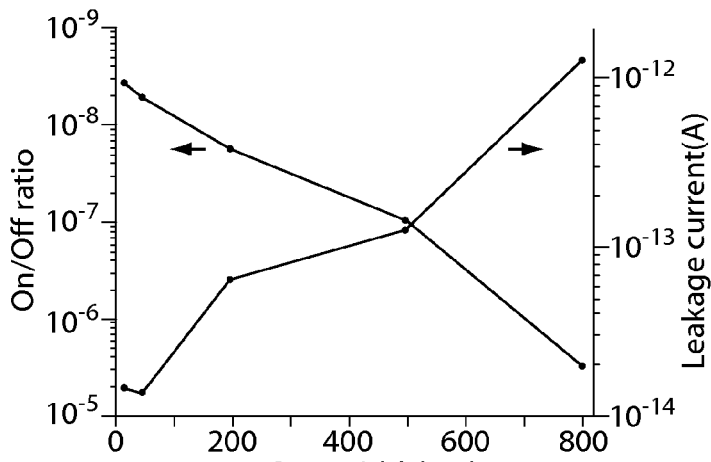
Figure 16F:
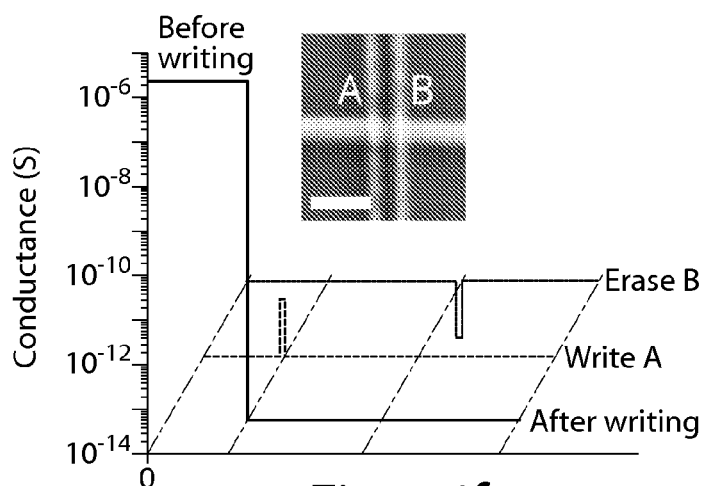

This is illustrated in more detail in FIG. 15. In this figure, the current amplifier in the measurement circuit was found to set a response limit for the reading speed at 15 microseconds. FIG. 15A is a comparison between the square wave (upper line) generated by function generator and the signal read through the current amplifier (lowerline) in the measurement circuit, showing the 15 microsecond delay. FIG. 15B shows that the switching speed measurements of the core-shell nanowire heterostructure FET memory device appeared to have the same 15 microsecond delay in read response after a writing/erasing pulse is applied; thus, the read speed was limited by the instrument response, not by the response of the core-shell nanowire heterostructure FET memory device.

Figure 14F:
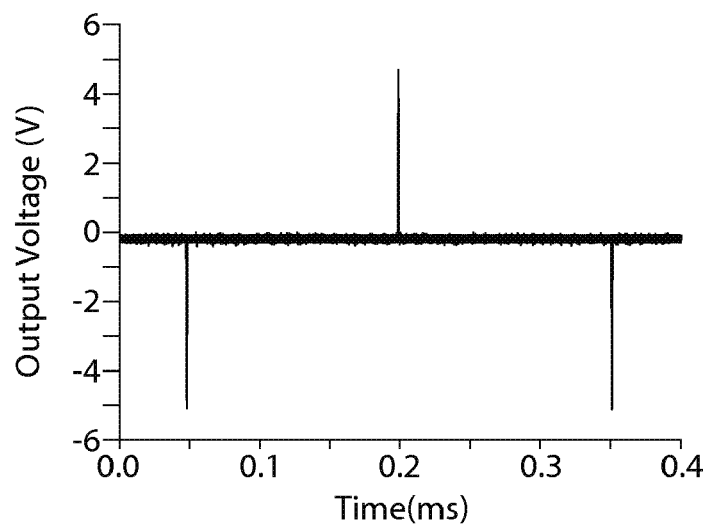
Figure 14G:
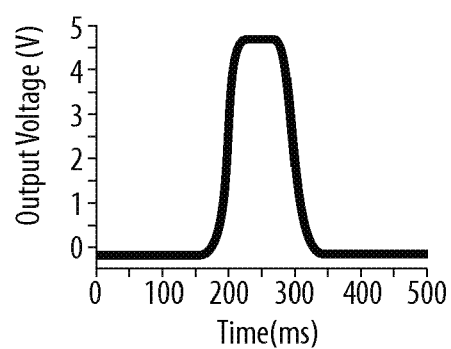

FIGS. 14F and 14G illustrate operation pulses width of 100 ns and amplitude of +7 V and −7 V (actual output +5 V and −5 V at high frequency as measured separately), applied to the top gate and used as writing and erasing pulses in an alternative manner with 150 microsecond intervals to switch "off" and "on" the FET memory device. The device could be switched "on" and "off" continuously for one hour with a fixed −1 V source-drain bias without obvious fatigue, showing an endurance of at least $10^7$ cycles (FIG. 14E).

EXAMPLE 4

In this example, for the FET-type memory devices based on ferroelectric oxide, the critical thickness for the ferroelectric oxides and the minimum gate width/pitch were examined. To address the first issue, core-shell nanowire heterostructures with thinner $BaTiO_3$ shells were fabricated. Transport measurements (data not shown) showed that when the thickness of $BaTiO_3$ shell was decreased to 10 nm, the expected depolarizing electrostatic field caused by dipoles at the ferroelectric oxide-metal gate interfaces substantially diminished the ferroelectric properties of the oxides. However, this can be overcome using strained perovskite oxide superlattice structures, which may reduce the critical thickness down to single-unit cell level.

A series of devices were fabricated with different gate widths from 500 nm to 20 nm (FIG. 16). The devices were prepared with different gate widths as follows: FIG. 16A, 500 nm; FIG. 16B, 200 nm; FIG. 16C, 50 nm; and FIG. 16D, 20 nm. The scale bars are 500 nm for FIGS. 16A and 16B, and 250 nm for FIGS. 16C and 16D. The results from these experiments showed that the switching behavior was retained even with a 20 nm wide metal gate (FIG. 16D). The on-off ratio increased up to eight orders of magnitude with decreasing gate widths (left arrow, FIG. 16E), which appeared to be the result of less leakage current from the gate to the channel (right arrow, FIG. 16E). The writing/erasing voltage window (−3 V~+5 V) was found to be similar for these devices, suggesting that all of these switching behaviors were due to ferroelectric polarization in $BaTiO_3$ shell. These experiment results also showed that a writing polarization using a +8 V positive gate voltage (middle line) on gate A turned off the FET device (lower line), which was not turned back "on" by a −9 V erasing voltage applied to gate B (upper line), suggesting substantially no crosstalk between the two adjacent gates. With no crosstalk between the two domains beneath two adjacent 50 nm wide metal gates with 100 nm pitch (FIG. 16F), an integration density of at least 15 Gbits/cm$^2$ was thereby demonstrated as being achievable. The inset in FIG. 16F is an SEM image of a FET device with two adjacent 50 nm wide metal gates (A and B) with 100 nm pitch. The scale bar is 200 nm.

EXAMPLE 5

The above examples suggest that different ferroelectric polarizations can exist on different domains in a small region of the nanowires without crosstalk, and their polarization statuses can still be distinguished individually. A device having these characteristics was prepared in this example (FIG. 17).

Figure 17A:
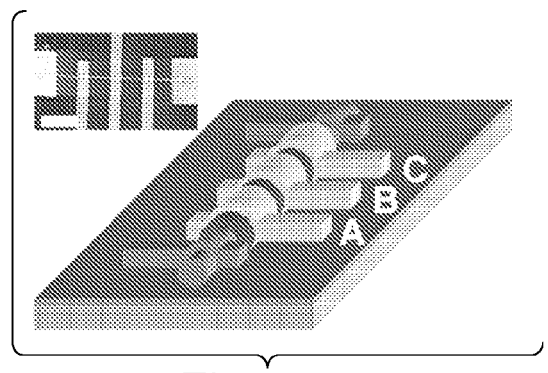
FIGS. 17A-17E illustrate certain devices of the invention, having multiple gates, in accordance with another embodiment of the invention.
Figure 17B:
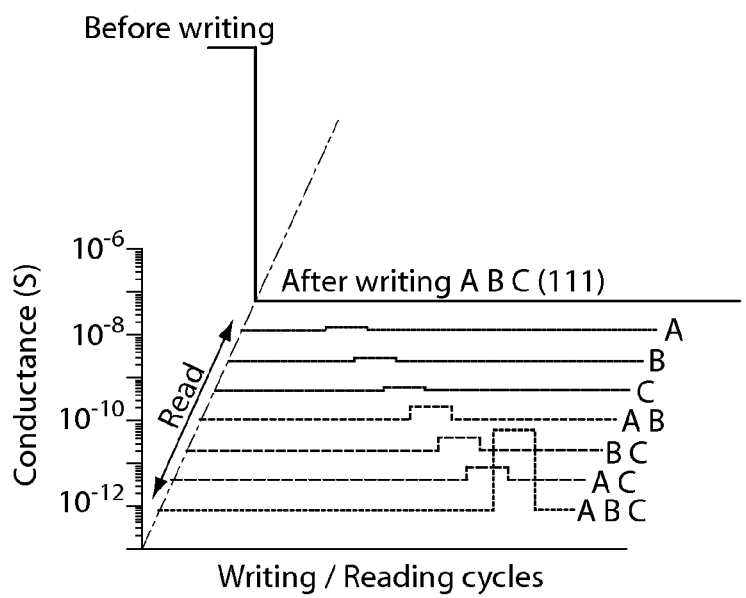

Specifically, multiple gates crossing one FET devices were fabricated (FIG. 17A) to store multiple bits of data per transistor, which expands on the conventional configuration in which only one bit can be stored per transistor. The inset in FIG. 17A shows an SEM of an FET memory device with multiple gates. The scale bar in the inset is 2 micrometers. These results, in summary, showed that one can randomly write different combinations of polarization using a positive gate voltage applied on the metal gate; for example, applying +8 V on all three gates on the FET (FIG. 17A) will write polarizations in the separate $BaTiO_3$ domains beneath the gates, which will turn off the device and allow for multiple bits of data ("111") to be stored (FIG. 17B, line ABC). To read the data, a small negative gate voltage (usually −1 V), which was large enough to screen part of the electric field caused by the ferroelectric polarization and increase the conductance, but small enough not to reverse the ferroelectric polarization direction, was applied to all three gates. In this way, one can observe the maximum conductance increase from the "off" state (FIG. 17B, line ABC) but not with other combinations with mismatch (FIG. 17B, lines A, B, C, AB, BC and AC). After the reading, the conductance of the device decreased back to the original "off" state, showing that the process of reading does not appear to disturb the polarization in the ferroelectric oxide.

Using a similar approach, one can also store other combinations, such as 001, 110, etc., to the memory array, and correctly read them out. Further calculations (not shown) showed that the number of the distinguishable bits of data per transistor can be determined by the magnitude difference in the readout conductance between the fully correct readout and one mismatch, which can be extended by further optimizing FET performance. Moreover, this FET device with multiple gates may be considered as non-volatile NOR logic with multiple inputs, in which any input (polarizations created by positive gate voltage, regarded as "1") will turn off the conducting channel and result the output (source voltage) to be low ("0").

Additionally, several devices were prepared to integrate these core-shell nanowire heterostructures into large scale memory arrays and NOR logic device arrays by fabricating multiple gates crossing multiple well-aligned nanowires. However, during the writing procedure, the positive electric field applied on one gate could write polarizations into all the nanowires crossing the gate. To ensure that these cross points were individually addressable, compensation voltages were applied during writing. The function of the compensation voltages applied on both nanowires and gates was to create a relatively small potential drop cross the ferroelectric oxide to avoid any extra writing or disturbance to the possible existence of polarizations at other cross points.

Figure 17C:
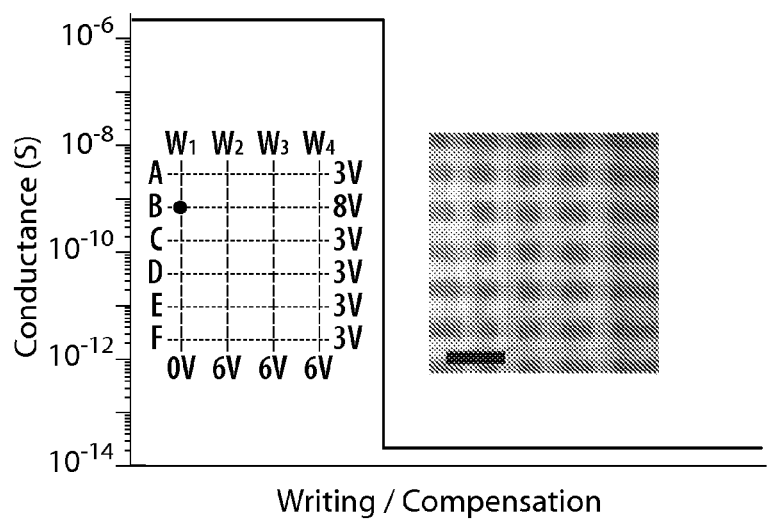
Figure 17D:
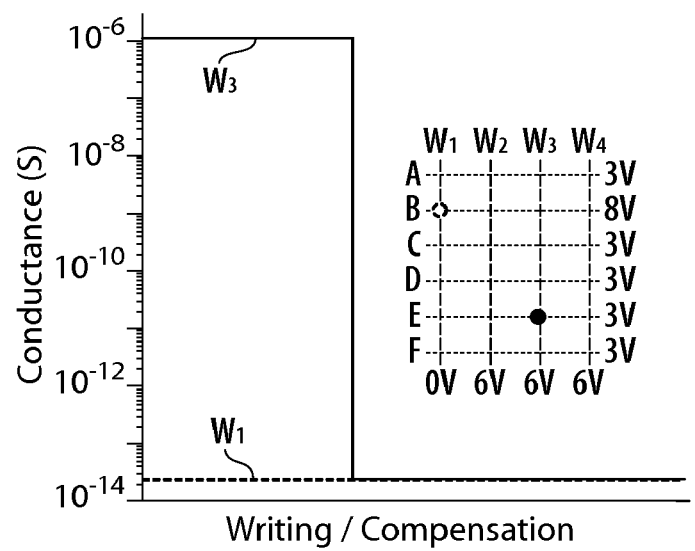
Figure 17E:
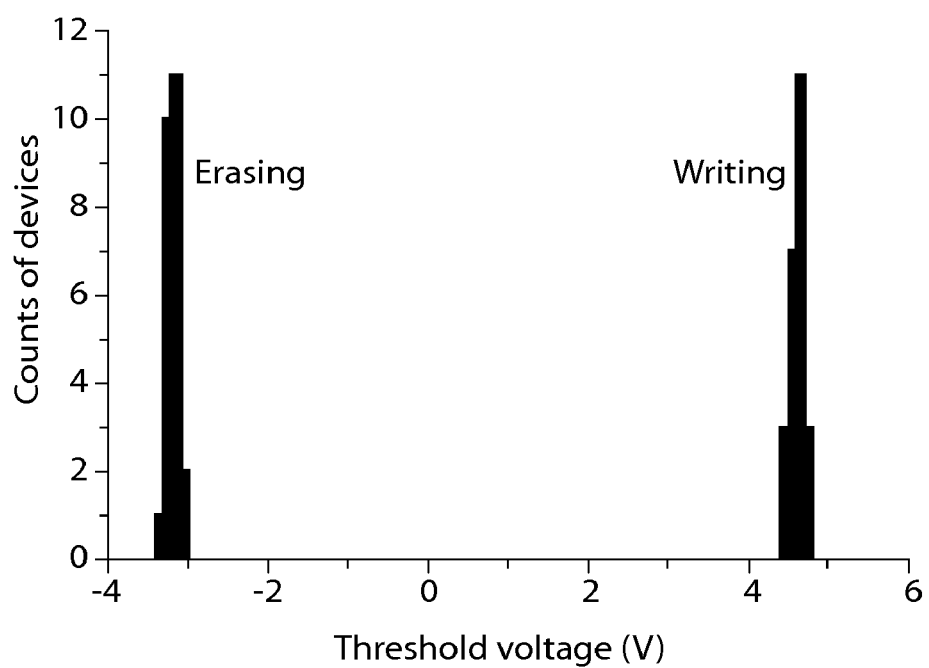

For example, in a memory array (right inset, FIG. 17C) composed of 4 nanowires ($W_1$, $W_2$, $W_3$, $W_4$) crossing six gates (A, B, C, D, E, F) (left inset, FIG. 17C), applying a +8 V gate voltage on gate B and ground on nanowire $W_1$ could write polarization at the cross point between nanowire $W_1$ and gate B, which would turn "off" nanowire $W_1$ in the device, as shown in FIG. 17C, which is an SEM image of a prototype of cross point memory array with NOR logic, composed of four vertically-aligned nanowires with six crossing metal gates. The scale bar is 200 nm. For the NOR logic measurement, the voltage applied on metal gates was used as input. The $V_{sd}$ was constantly biased at 1 V. A 1 megohm (MΩ) resistor was linked between FET source and ground in series. The voltage drop across the resistor was regarded as output.

The left inset in FIG. 17C is a scheme of the array showing that a strategy of applying writing and compensation voltages on nanowires and metal gates could be used to address the cross point between nanowire $W_1$ and gate B without writing extra polarization at the cross points among gate B and nanowires $W_2$, $W_3$, $W_4$. After writing, nanowire $W_1$ in the device was turned "off" (i.e., a decrease in conductance). However, +6 V on nanowires $W_2$, $W_3$, $W_4$, and +3 V on gates A, C, D, E, F should be applied to avoid writing extra polarization at the cross points among gate B and nanowires $W_2$, $W_3$, $W_4$. The −3 V potential difference between the gates A, C, D, E, and F (+3 V), and nanowires $W_2$, $W_3$, $W_4$ (+6 V) did not appear to wipe the possible existence of polarizations at cross points among them.

A similar strategy was also adopted during the following writing of the cross point between nanowire $W_3$ and gate E (red point in the inset, in FIG. 17D) without writing extra polarization at the cross points among gate E and nanowires $W_1$, $W_2$, $W_4$, as well as avoiding disturbance to the existing polarization at the cross point between nanowire $W_1$ and gate B. After writing, nanowire $W_3$ in the device was turned "off" (upper line, showing a decrease in conductance, FIG. 17D) while no disturbance was observed on nanowire $W_1$ in the device (lower line, FIG. 17D).

These results show that such strategy of applying writing and compensation voltage was efficient and allowed individual addressing of the cross points in the array. Further statistical analysis (FIG. 17E) showed that the threshold voltages for writing and erasing may have narrow distributions in some cases, with 4.62±0.08 V for writing (right bars, FIG. 17E) and −3.19±0.06 V for erasing (left bars, FIG. 17E), thereby demonstrating uniformity and reliability of the device arrays.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of", when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An electronic data storage device, comprising:
   a first electrode;
   a second electrode;
   a semiconductive material defining an electrical pathway between the first and second electrodes;
   a ferroelectric oxide material proximate the semiconductive material, switchable between at least a first polarization state and a second polarization state,
   wherein the ferroelectric oxide material at least surrounds at least a portion of the semiconductive material, and
   wherein the semiconductive material is switchable between a first conductive state and a second conductive state in response to the first or second polarization states of the ferroelectric oxide material, respectively, providing conductivity between the first and second electrodes, respectively, of a first conductivity and a second conductivity at least 1000 times the first conductivity.

2. The electronic data storage device of claim 1, wherein the semiconductive material comprises a Group IV semiconductor.

3. The electronic data storage device of claim 1, wherein the semiconductive material comprises an elemental semiconductor.

4. The electronic data storage device of claim 1, wherein the semiconductive material comprises Si.

5. The electronic data storage device of claim 1, wherein the semiconductive material comprises a Group III-Group V semiconductor.

6. The electronic data storage device of claim 1, wherein the semiconductive material comprises a p-type dopant.

7. The electronic data storage device of claim 1, wherein the semiconductive material comprises an n-type dopant.

8. The electronic data storage device of claim 1, wherein the ferroelectric oxide material comprises Ba.

9. The electronic data storage device of claim 1, wherein the ferroelectric oxide material comprises a barium titanate.

10. The electronic data storage device of claim 1, wherein the ferroelectric oxide material comprises Zr.

11. The electronic data storage device of claim 1, wherein the ferroelectric oxide material comprises a lead zirconium titanate.

12. The electronic data storage device of claim 1, wherein the ferroelectric oxide material comprises Sr.

13. The electronic data storage device of claim 1, wherein the ferroelectric oxide material comprises a strontium bismuth tantalate.

14. The electronic data storage device of claim 1, wherein the semiconductive material comprises at least one portion having a smallest width of less than about 1 micrometer.

15. The electronic data storage device of claim 14, wherein the semiconductive material comprises at least one portion having a smallest width of less than about 500 nanometers.

16. The electronic data storage device of claim 15, wherein the semiconductive material comprises at least one portion having a smallest width of less than about 200 nanometers.

17. The electronic data storage device of claim 16, wherein the semiconductive material comprises at least one portion having a smallest width of less than about 100 nanometers.

18. The electronic data storage device of claim 17, wherein the semiconductive material comprises at least one portion having a smallest width of less than about 50 nanometers.

19. The electronic data storage device of claim 18, wherein the semiconductive material comprises at least one portion having a smallest width of less than about 30 nanometers.

20. The electronic data storage device of claim 19, wherein the semiconductive material comprises at least one portion having a smallest width of less than about 10 nanometers.

21. The electronic data storage device of claim 1, wherein the ferroelectric oxide material comprises at least one portion having a smallest width of less than about 1 micrometer.

22. The electronic data storage device of claim 21, wherein the ferroelectric oxide material comprises at least one portion having a smallest width of less than about 500 nanometers.

23. The electronic data storage device of claim 22, wherein the ferroelectric oxide material comprises at least one portion having a smallest width of less than about 200 nanometers.

24. The electronic data storage device of claim 23, wherein the ferroelectric oxide material comprises at least one portion having a smallest width of less than about 100 nanometers.

25. The electronic data storage device of claim 24, wherein the ferroelectric oxide material comprises at least one portion having a smallest width of less than about 50 nanometers.

26. The electronic data storage device of claim 25, wherein the ferroelectric oxide material comprises at least one portion having a smallest width of less than about 30 nanometers.

27. The electronic data storage device of claim 26, wherein the ferroelectric oxide material comprises at least one portion having a smallest width of less than about 10 nanometers.

28. The electronic data storage device of claim 1, wherein the semiconductive material and the ferroelectric oxide material together define a nano scale wire, wherein the semiconductive material defines a core of the nanoscale wire, and the ferroelectric oxide material defines first shell of the nanoscale wire at least partially surrounding the core.

29. The electronic data storage device of claim 28, wherein the first shell concentrically surrounds the core.

30. The electronic data storage device of claim 28, wherein the portion of the nanoscale wire comprising the core and the first shell is cylindrical.

31. The electronic data storage device of claim 28, wherein the portion of the nanoscale wire comprising the core and the first shell is faceted.

32. The electronic data storage device of claim 28, wherein the nanoscale wire further comprises a second shell surrounding at least a portion of the core.

33. The electronic data storage device of claim 32, wherein the second shell is positioned between the first shell and the core.

34. The electronic data storage device of claim 32, wherein the second shell comprises a metal oxide.

35. The electronic data storage device of claim 32, wherein the second shell has a dielectric constant of at least about 15.

36. The electronic data storage device of claim 35, wherein the second shell has a dielectric constant of at least about 20.

37. The electronic data storage device of claim 36, wherein the second shell has a dielectric constant of at least about 25.

38. The electronic data storage device of claim 32, wherein the second shell comprises Zr.

39. The electronic data storage device of claim 38, wherein the second shell comprises $ZrO_2$.

40. The electronic data storage device of claim 38, wherein the second shell comprises $ZrSiO_4$.

41. The electronic data storage device of claim 32, wherein the second shell comprises Hf.

42. The electronic data storage device of claim 41, wherein the second shell comprises $HfO_2$.

43. The electronic data storage device of claim 41, wherein the second shell comprises $HfSiO_4$.

44. The electronic data storage device of claim 32, wherein the second shell comprises $Al_2O_3$.

45. The electronic data storage device of claim 32, further comprising a third shell surrounding at least a portion of the core.

46. The electronic data storage device of claim 45, wherein the third shell is positioned between the first shell and the second shell.

47. The electronic data storage device of claim 45, wherein the third shell comprises a metal.

48. The electronic data storage device of claim 45, wherein the third shell comprises a noble metal.

49. The electronic data storage device of claim 45, wherein the third shell comprises Pt.

50. The electronic data storage device of claim 1, wherein the second conductivity is at least 10,000 times the first conductivity.

51. The electronic data storage device of claim 1, wherein the second conductivity is at least 100,000 times the first conductivity.

52. An electronic data storage device, comprising:
a first electrode;
a second electrode;
a semiconductive material defining an electrical pathway between the first and second electrodes, wherein the semiconductive material comprises at least one portion having a smallest width of less than about 100 nanometers;
a ferroelectric oxide material proximate the semiconductive material, switchable between at least a first polarization state and a second polarization state,
wherein the semiconductive material is switchable between a first conductive state and a second conductive state in response to the first or second polarization states of the ferroelectric oxide material, respectively, providing conductivity between the first and second electrodes, respectively, of a first conductivity and a second conductivity at least 1000 times the first conductivity.

53. The electronic data storage device of claim 52, wherein the semiconductive material comprises a Group IV semiconductor.

54. The electronic data storage device of claim 52, wherein the semiconductive material comprises an elemental semiconductor.

55. The electronic data storage device of claim 52, wherein the semiconductive material comprises Si.

56. The electronic data storage device of claim 52, wherein the semiconductive material comprises a Group III-Group V semiconductor.

57. The electronic data storage device of claim 52, wherein the ferroelectric oxide material comprises Ba.

58. The electronic data storage device of claim 52, wherein the ferroelectric oxide material comprises Zr.

59. The electronic data storage device of claim 52, wherein the ferroelectric oxide material comprises Sr.

60. The electronic data storage device of claim 52, wherein the semiconductive material comprises at least one portion having a smallest width of less than about 10 nanometers.

61. The electronic data storage device of claim 52, wherein the ferroelectric oxide material comprises at least one portion having a smallest width of less than about 100 nanometers.

62. The electronic data storage device of claim 52, wherein the ferroelectric oxide material comprises at least one portion having a smallest width of less than about 10 nanometers.

63. The electronic data storage device of claim 52, wherein the semiconductive material and the ferroelectric oxide material together define a nanoscale wire, wherein the semiconductive material defines a core of the nanoscale wire, and the ferroelectric oxide material defines first shell of the nanoscale wire at least partially surrounding the core.

64. The electronic data storage device of claim 63, wherein the nano scale wire further comprises a second shell surrounding at least a portion of the core.

65. The electronic data storage device of claim 64, wherein the second shell is positioned between the first shell and the core.

66. The electronic data storage device of claim 64, wherein the second shell comprises a metal oxide.

67. The electronic data storage device of claim 64, wherein the second shell has a dielectric constant of at least about 15.

68. The electronic data storage device of claim 64, wherein the second shell comprises Zr.

69. The electronic data storage device of claim 64, wherein the second shell comprises Hf.

70. The electronic data storage device of claim 64, further comprising a third shell surrounding at least a portion of the core.

* * * * *